United States Patent [19]

Calhoun et al.

[11] 4,052,710
[45] Oct. 4, 1977

[54] SYSTEMS USING LATTICE ARRAYS OF INTERACTIVE ELEMENTS

[75] Inventors: Bertram A. Calhoun, Saratoga, Calif.; John C. Slonczewski, Katonah, N.Y.; Otto Voegeli, San Jose, Calif.

[73] Assignee: International Business Machines Corporation, Armonk, N.Y.

[21] Appl. No.: 632,604

[22] Filed: Nov. 14, 1975

Related U.S. Application Data

[63] Continuation of Ser. No. 395,336, Sept. 7, 1973, abandoned.

[51] Int. Cl.$^2$ .............................................. G11C 19/08
[52] U.S. Cl. ............................................. 340/174 TF
[58] Field of Search ................................. 340/174 TF

[56] References Cited

U.S. PATENT DOCUMENTS 3,836,895  9/1974  DeJonge ....................... 340/174 TF

OTHER PUBLICATIONS

Journal of Applied Physics–vol. 42, No. 13, Dec. 1971, pp. 5732–5756.

Philiphs Research Report, vol. 26, No. 1, Feb. 1971, pp. 11–18.
American Institute of Physics–AIP Conference Proceedings No. 5, part 1, Nov. 16–19, 1971 pp. 130–134.

*Primary Examiner*—James W. Moffitt
*Attorney, Agent, or Firm*—Jackson E. Stanland

[57] ABSTRACT

Apparatus is provided using as an integral portion thereof a confined array (such as a lattice) of interactive elements, the interactions among which are largely determinative of the positions of the interactive elements since there is a minimum of position determining structure for the elements within the area of confinement. Magnetic elements are suitable interactive elements, and in particular embodiments are shown using magnetic bubble domains. Structure is provided to form lattice arrays of interactive elements, to confine the lattice arrays, and to access elements outside and within the lattice array. In addition, various structures are provided to code the interactive elements for storage of information, and reading devices are provided to detect the information state of the interactive elements when these elements are coded. Various types of lattices and interactive elements can be used.

78 Claims, 79 Drawing Figures

FIG. 12
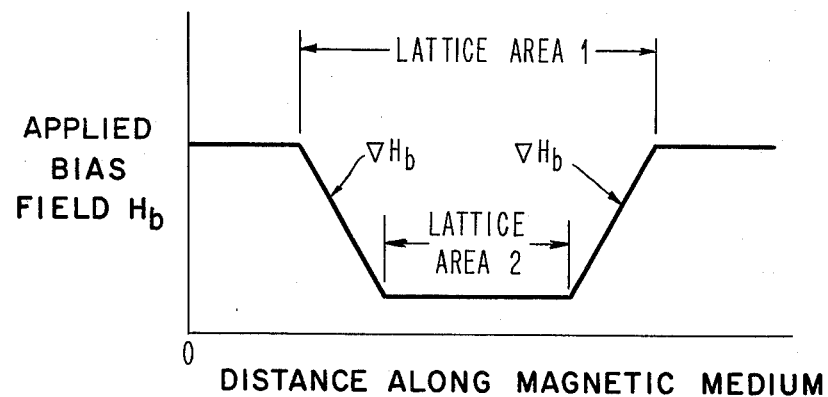
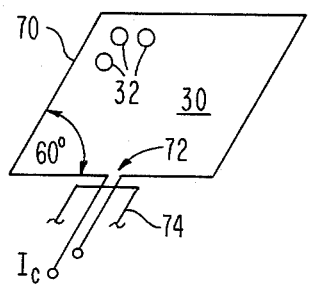
FIG. 13A
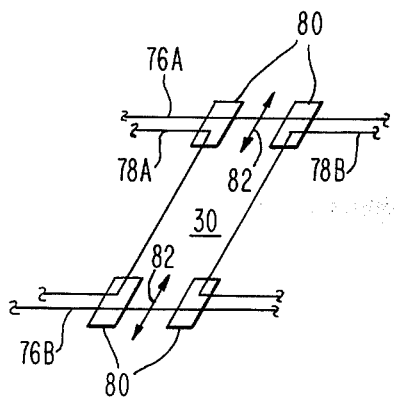
FIG. 13B
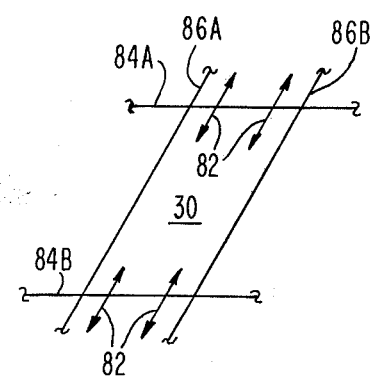
FIG. 13C
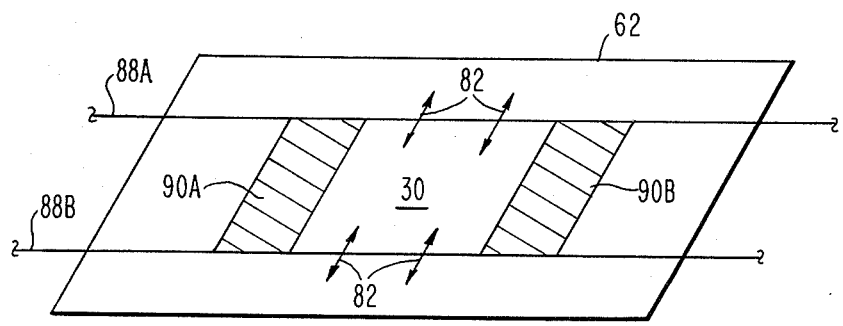
FIG. 13D

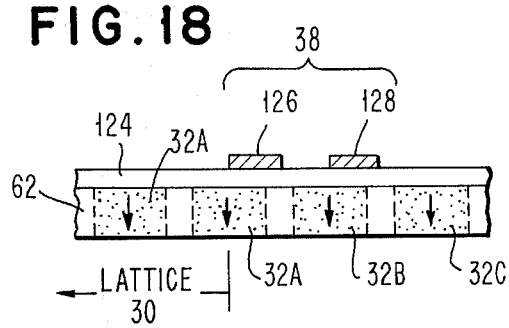
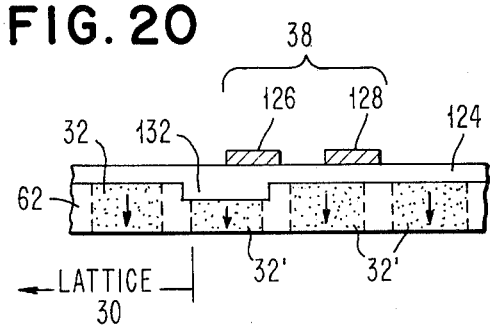
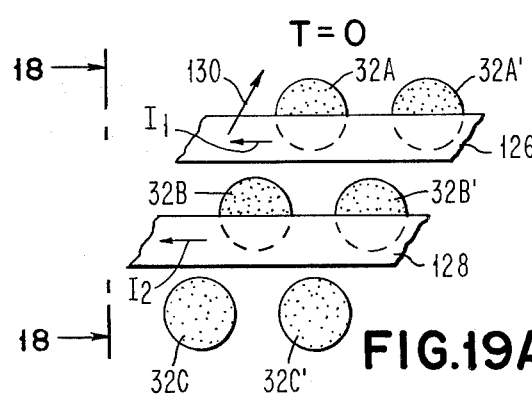
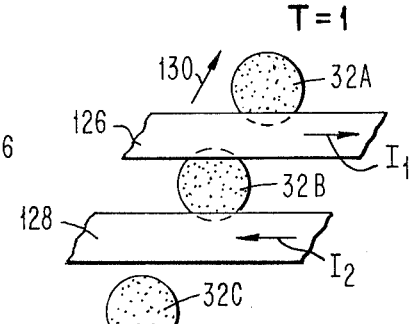
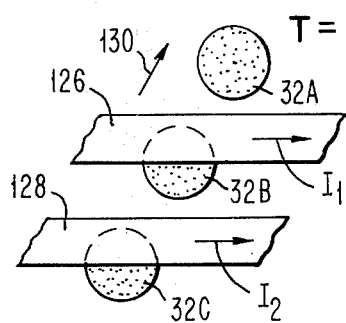
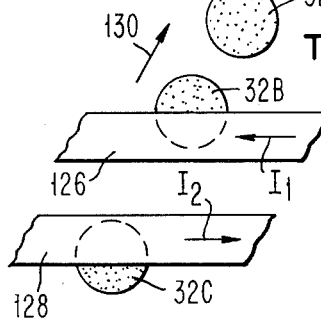
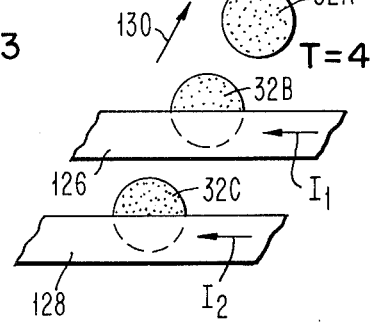
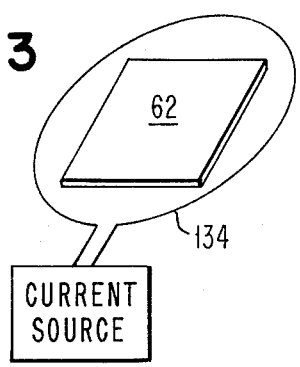
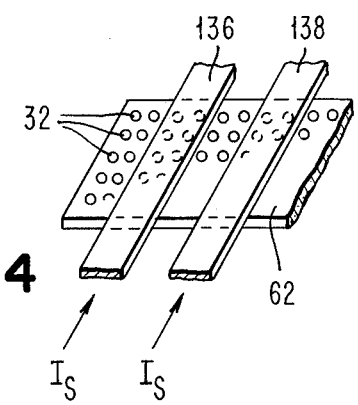

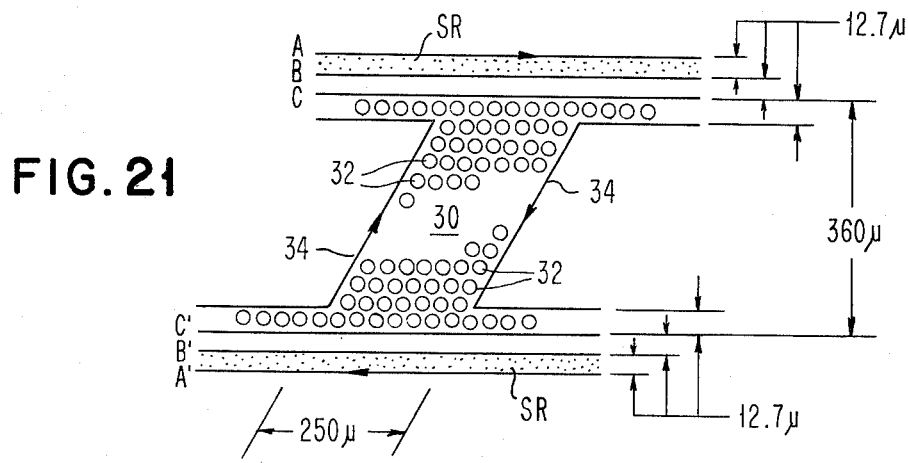
FIG. 21
INJECT 32 INTO LATTICE
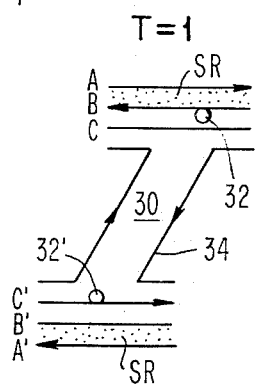 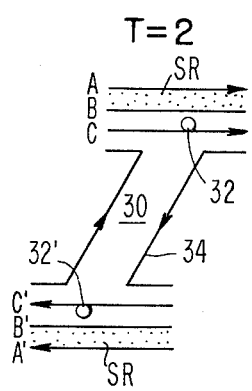 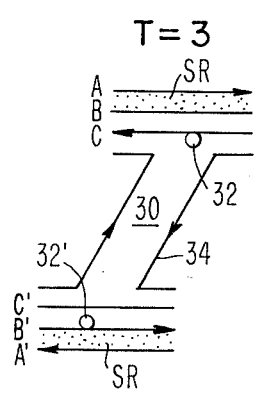 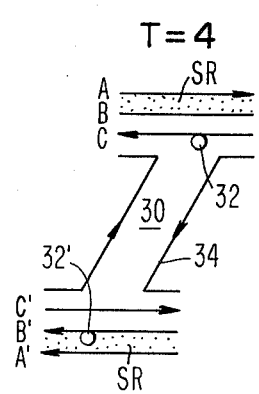
FIG. 22A  FIG. 22B  FIG. 22C  FIG. 22D
EJECT 32' FROM LATTICE
EJECT 32 FROM LATTICE
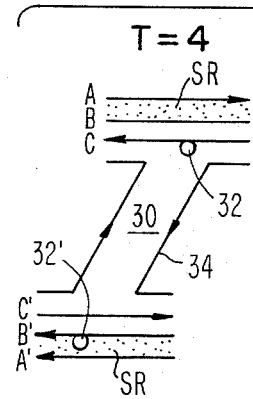 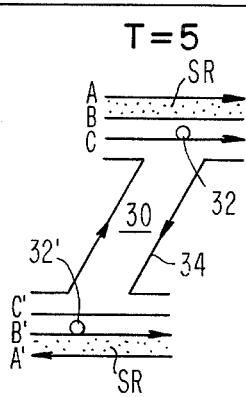 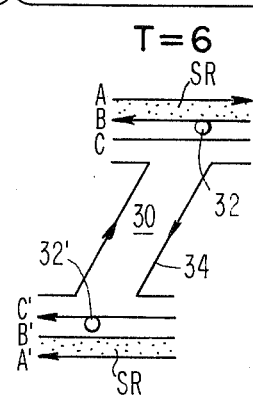 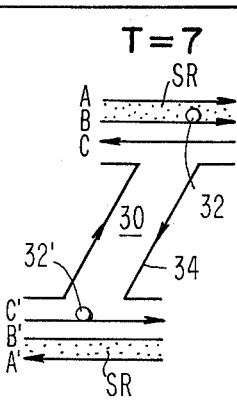
FIG. 22D  FIG. 22E  FIG. 22F  FIG. 22G
INJECT 32' INTO LATTICE

FIG. 30

| CONDUCTORS | TIME SEQUENCE | | | | | | | | | | | | | | | |
|---|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 | 16 |
| A | L | | | | | | | | R | | | | | | | |
| B | L | R | | | | | | | L | | | | | | | |
| C | R | L | R | L | R | L | R | L | R | L | R | L | R | L | R | L |
| D | R | L | R | L | R | L | R | L | R | L | R | L | R | L | R | L |

FIG. 31

TIME SEQUENCE

BUBBLE DOMAINS

BUBBLE POSITIONS

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 |
|---|---|---|---|---|---|---|---|---|---|---|---|---|---|---|---|---|---|---|---|---|---|---|---|---|---|---|---|---|---|---|---|---|
| a | 1.1 | | | | | | | 1.1 | 1.2 | 1.3 | 1.4 | 0 | | | | | | | | | | | | | | | | | | | | |
| b | 2.1 | | | | | | | 2.1 | 2.2 | | | | | | | 2.2 | | | | | | | | | | | | | | | | |
| c | 3.1 | | | | | | | 3.1 | 3.2 | 3.3 | 3.4 | 2.4 | 1.4 | 0 | | | | | | | | | | | | | | | | | | |
| d | 4.1 | | | | | | | 4.1 | 4.2 | | | | | | | 4.2 | 3.2 | 3.3 | 3.4 | 2.4 | 1.4 | 0 | | | | | | | | | | |
| e | 5.1 | | | | | | | 5.1 | 5.2 | 5.3 | 5.4 | 4.4 | 3.4 | 2.4 | 1.4 | 0 | | | | | | | | | | | | | | | | |
| f | 6.1 | | | | | | | 6.1 | 6.2 | | | | | | | 6.2 | 5.2 | 5.3 | 5.4 | 4.4 | 3.4 | 2.4 | 1.4 | 0 | | | | | | | | |
| g | 7.1 | | | | | | | 7.1 | 7.2 | 7.3 | 7.4 | 6.4 | 5.4 | 4.4 | 3.4 | 2.4 | 1.4 | 0 | | | | | | | | | | | | | | |
| h | 8.1 | | | | | | | 8.1 | 8.2 | | | | | | | 8.2 | 7.2 | 7.3 | 7.4 | 6.4 | 5.4 | 4.4 | 3.4 | 2.4 | 1.4 | 0 | | | | | | |
| i | | | | | | | | | | | | | | | | | 1.1 | 2.1 | | | | | | 1.1 | 1.2 | 1.3 | 1.4 | 0 | | | | |
| j | | | | | | | | | | | | | | | | | 2.1 | | | | | | | 2.1 | 2.2 | | | | 1.4 | 0 | | |
| k | | | | | | | | | | | | | | | | | 3.1 | | | | | | | 3.1 | 3.2 | 3.3 | 3.4 | 2.4 | 1.4 | 0 | | |
| l | | | | | | | | | | | | | | | | | 4.1 | | | | | | | 4.1 | 4.2 | | | | | 0 | 1.4 | 2.2 |
| m | | | | | | | | | | | | | | | | | 5.1 | | | | | | | 5.1 | 5.2 | 5.3 | 5.4 | 4.4 | 3.4 | 2.4 | 1.4 | 0 |
| n | | | | | | | | | | | | | | | | | 6.1 | | | | | | | 6.1 | 6.2 | 7.3 | 7.4 | 6.4 | 5.4 | 4.4 | 3.4 | 6.2 |
| o | | | | | | | | | | | | | | | | | 7.1 | | | | | | | 7.1 | 7.2 | 7.3 | 7.4 | 6.4 | 5.4 | 4.4 | 3.4 | 2.4 |
| p | | | | | | | | | | | | | | | | | 8.1 | | | | | | | 8.1 | 8.2 | | | | | | | 8.2 |

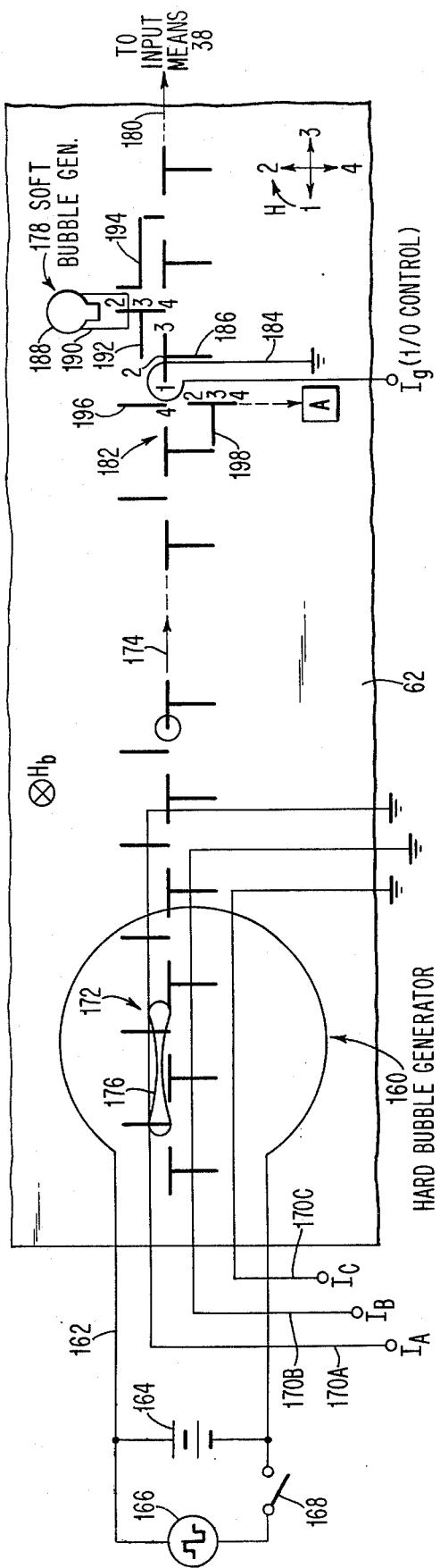
FIG. 32 HARD/SOFT CODING: WRITE
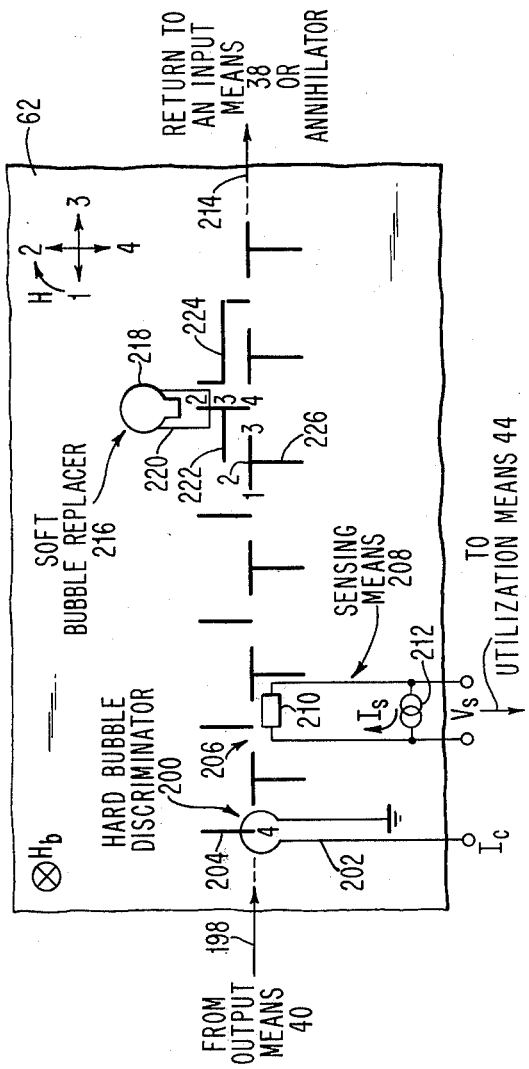
FIG. 33 HARD/SOFT CODING: READ

CODING BY DEFLECTION

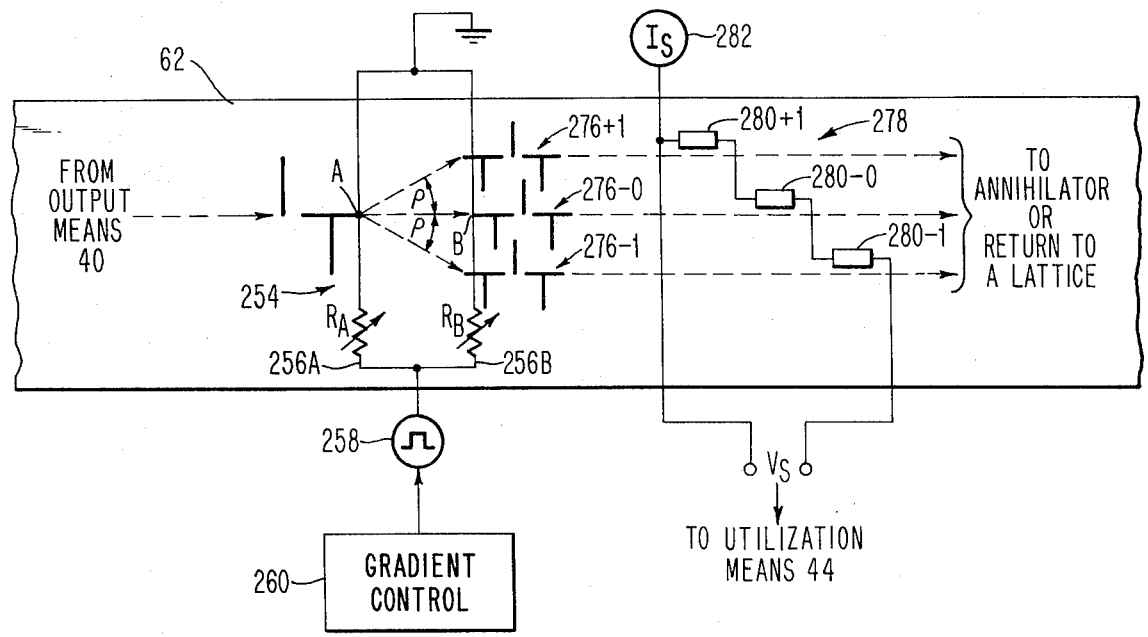
FIG. 35 READING BY DEFLECTION
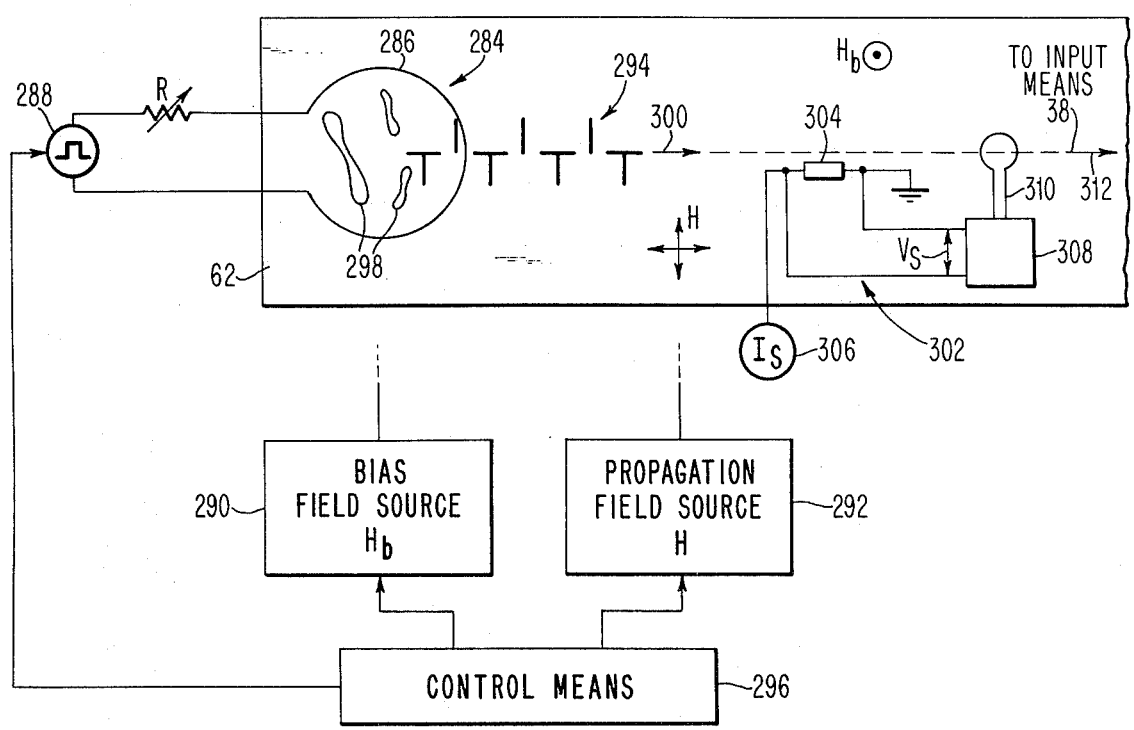
FIG. 36 WRITING/READING DUAL SIZE BUBBLES

EJECT FROM LATTICE 30'

INJECT INTO LATTICE 30

FIG. 48 SHIFT REGISTER

SYSTEMS USING LATTICE ARRAYS OF INTERACTIVE ELEMENTS

This is a continuation, of application Ser. No. 395,336 filed Sept. 7, 1973 now abandoned.

BACKGROUND OF THE INVENTION

1. Field of the Invention

This invention relates to apparatus using elements which interact with one another, and more particularly to apparatus using lattice arrays of interactive elements where the positions of the elements within the lattice are substantially determined by the interactive forces existing between the elements.

2. Description of the Prior Art

In the past, various systems have been described using elemnts which have the capability of interacting with one another. For instance, cylindrical magnetic bubble domains have stray magnetic fields which cause interactive forces to exist between bubble domains which are sufficiently close that the stray magnetic fields of each couple to one another. U.S. Pat. Nos. 3,689,902 and 3,701,125 describe magnetic bubble domain systems in which the functions of memory, storage, decoding, writing, and reading are described. These prior art systems are usually designed so that interactions between bubble domains are minimized. Since interactions can lead to adverse deflection of the bubbles, such a design has always been considered advantageous. Also, these prior systems used defined structures for determining the path of all bubble domains in the system. Generally, these prior systems are characterized by information storage in the form of the presence and absence of magnetic bubble domains.

Recently, there has been some work in magnetic bubble domain technology using information which is coded by other than the presence and absence of magnetic bubble domains. For instance, copending application Ser. No. 319,130, filed Dec. 29, 1972, describes a magnetic bubble domain apparatus in which different size magnetic bubble domains provide the various information states. In this manner, all bit positions of the system can be filled, the size of the domain at each position determining the information state of that position. In that copending application, functions such as writing, storage, and reading of the information states are described.

Another apparatus using magnetic bubble domains which have different properties is described in copending application Ser. No. 375,285, filed June 29, 1973. This copending application utilizes different vertical Bloch line configurations for domain wall magnetization in order to code magnetic bubble domains in accordance with their properties in a magnetic field tending to collapse the domains. It has been discovered that the field at which a bubble domain collapses is a function of the number of vertical Bloch lines in its domain wall; therefore, various logic states can be provided by domains which have differing numbers of vertical Bloch lines in the domain walls. Of course, this leads to levels of logic higher than merely binary levels.

Still another bubble domain apparatus using bubble domains having different properties is shown in copending application Ser. No. 375,289, filed June 29, 1973. This copending application codes the magnetic bubble domains in terms of their properties of movement in a gradient magnetic field normal to the plane of the medium in which they exist. Depending upon the angle through which these domains are deflected, various information levels can be provided.

A still further technique for coding magnetic bubble domains is described in the IBM Technical Disclosure Bulletin, Vol. 13, No. 10, March 1971, at page 3021. In this publication, G. R. Henry describes coding in terms of the chirality of wall magnetization of bubble domains. A technique for reading different chiral states uses a reference domain into which an unknown domain is forced, leading to a collision which determines the chiral state of the unknown domain.

While the prior art has addressed various aspects of magnetic bubble domain technology, and information storage in general, very little emphasis has been placed on the provision of systems which would have ultimate density configurations, be very stable, and be as structureless as possible. Thus, the prior art has attempted to obtain high densities by, for instance, using smaller and smaller magnetic bubble domains, and by reducing the line width of structures used to move these domains (for instance, electron beam technology has been used to make smaller T and I permalloy overlay bars). However, the prior art has not attempted to divert from established procedures in an attempt to find new approaches which may lead to significant improvements in system performance and in packing density.

The present invention is directed to an entirely new approach for providing apparatus which has a high degree of stability, significantly increased storage densities, and a minimum of structural requirements. In the present invention, a lattice of interactive elements is utilized where the positions of the interactive elements with respect to one another are largely determined by the forces existing between the elements, rather than by the locations of structures used to move the interactive elements. This leads to extremely high density, which can be varied easily, and to structureless arrays of elements having great internal stability. The interactive elements are any elements which can have positions determined by forces existing between them, and are particularly exemplified by magnetic elements such as cylindrical bubble domains. Various means are used to manipulate the interactive elements into and out of the lattice as well as within the lattice array. If desired, information can be coded in the elements within the array, thus providing an extremely high density, structureless storage having internal stability over a wide range of operating conditions.

The existence of arrays of interactive magnetic bubble domains has been shown in the prior art. For instance, the following technical publications describe some of the physical characteristics of bubble domain lattice arrays.

1. S. H. Charap et al, "Behavior of Circular Domains in GdIG", IEEE Transactions on Magnetics, Vol. Mag-5, No. 3, September 1969, page 566.
2. J. A. Cape et al, "Magnetic Bubble Domain Interactions", Solid State Communications, Vol. 8, pages 1303-1306, 1970.
3. W. F. Druyvesteyn et al, "Calculations on Some Periodic Magnetic Domain Sturctures; Consequences for Bubble Devices", Philips Research Reports, Vol. 26, No. 1, pages 11-28, February 1971.
4. J. W. F. Dorleijn et al, "Repulsive Interactions Between Magnetic Bubbles: Consequences for Bubble Devices", IEEE Transactions on Magnetics, Vol. Mag-7, No. 3, page 355, September 1971.

5. F. A. DeJonge et al, "Bubble Lattices", American Institute of Physics Proceedings of 17th Annual Conference on Magnetism and Magnetic Materials, Chicago, Illinois, 1971, Section 4, page 130.

Even though others have studied the various theories and physical properties of lattices containing magnetic bubble domains, no one has heretofore thought of utilizing such lattices in practical systems. Thus, these articles contain no suggestion or statement directed to a usable system incorporating the many features which can be present in lattice arrays of interactive elements. Despite the known existence of lattices of various elements, it remained for the present inventors to recognize that many features can be obtained by the use of lattice arrays to provice apparatus and systems having numerous advantages over those found in the prior art. Rather than utilize known directions for providing storage and memory systems, the present inventors have taken a fresh approach and have obtained systems which are significantly improved over those of the prior art.

Accordingly, it is a primary object of the present invention to provide techniques for very high density storage of information.

It is another object of this invention to provide storage of information in accordance with natural interactive phenomenon, rather than by imposed limitations due to auxiliary structure.

It is still another object of this invention to provide information handling apparatus using arrays of elements whose positions are substantially determined by interactions existing therebetween.

It is a further object of this invention to provide an apparatus which requires only a minimum of structural elements.

It is a still further object of this invention to provide a system for storing magnetic bubble domains with extremely high density.

It is another object of this invention to provide systems using lattice arrays of magnetic bubble domains.

It is still another object of this invention to provide apparatus utilizing arrays of interactive magnetic elements.

It is a further object of this invention to provide storage and memory with extremely high density using interaction between magnetic elements for determination of storage positions.

It is a still further object of this invention to provide techniques for storage of information at very high densities with minimum cost.

It is another object of this invention to provide techniques for high density confinement of interactive elements with high degrees of inherent stability.

It is another object of this invention to provide apparatus having high density storage where operating margins are significantly enhanced.

It is still another object of this invention to provide storage of information which achieves high density without constraints due to auxiliary structure.

It is a still further object of this invention to provide information storage using lattice arrays of coded elements whose positions are substantially determined by interactive forces existing between the elements.

It is still another object of this invention to provide techniques for utilizing arrays of interactive elements in new ways.

It is a further object of this invention to provide apparatus for moving a plurality of interactive elements whose positions are determined by interactions existing between the elements.

It is another object of this invention to provide techniques for accessing interactive elements within lattice arrays.

It is still another object of this invention to provide techniques for controllably moving interactive elements into and out of lattice arrays of such elements.

It is a further object of this invention to utilize multiple lattice arrays of interactive elements.

It is a further object of this invention to provide displays using lattice arrays of interactive elements.

It is another object of this invention to provide interacting elements in confined arrays which have information associated with them.

BRIEF SUMMARY OF THE INVENTION

This invention relates to techniques for utilizing elements which are held in an array by a confining means. Interactive forces can exist among these elements if they are sufficiently close to one another. Other than near the confining means surrounding the array, the positions of the elements within the array are substantially determined by interactions existing among the elements. Input/output means are provided for moving elements into the array and for removing elements from the array. In an especially useful apparatus, the elements within the array form a lattice arrangement which has the advantage of high density packing. Depending on the parameters of the system, the lattice can be of several types, such as a hexagonal lattice, or a square lattice.

Magnetic elements are particularly useful as the interactive elements, although other types of elements can also be utilized. The magnetic elements can have information associated with them, as for example when a high density information storage system is desired. Magnetic bubble domains are especially suitable interactive elements.

The interactive elements are brought to a lattice forming means which confines the elements within an area. The positions of the interactive elements within this area are largely determined by interactive forces existing between the elements, rather than by external structure. Depending on the interaction forces between the elements, the elements can arrange themselves in a lattice configuration which is a stable arrangement. In fact, the stability of this arrangement can be greater than that provided in systems where external structure is used to determine the positions of storage elements with respect to each other.

In order to provide forces to hold elements which are along the edges of the lattice area, a confinement means is provided. This confinement means simulates the forces which would be present on the elements in the outer periphery of the lattice, if additional interactive elements were present to interact with these peripheral elements. Thus, a lattice of any size (and any number of interactive elements) is provided which, mathematically, has the appearance of an infinitely extending lattice. The lattice can extend in any of a plurality of dimensions, as for instance a one dimensional or two dimensional lattice.

Input means is provided for moving interactive elements into the lattice and output means is provided for taking interactive elements out of the lattice. These input means and output means provide forces to overcome the confinement forces used to maintain the lattice. In certain systems, the lattice is sufficiently elastic that the provision of input interactive elements will cause elements within the lattice to move out of the lattice at the other end, due to a wave propagation of interactive forces between elements in the lattice. Generally, the input means and the output means can be used to remove or enter a plurality of interactive elements, or single interactive elements. Preferably, the lattice is maintained although it is possible to alter it somewhat during the input and output operations.

A write means is provided for producing interactive elements to be entered into the lattice. In one mode of operation, information is associated with each of the interactive elements as opposed to a system where information is stored as the presence and absence of elements. For instance, if the elements are magnetic bubble domains, coding can be in accordance with a magnetic property of the domains. Therefore, the write means provides interactive elements for the system and preferably provides coded information where the coding is in terms of the properties of the elements. As another example, magnetic interactive elements can have information bearing elements associated with them which appear optically different. Also, the electrical or magnetic properties of the information elements can be different in order to be able to detect different information states. Thus, the lattice can be filled with elements having different properties or the interactive elements can have information associated with them.

A reading means is provided to detect the interactive elements used in the lattice. Preferably, this reading means includes means for detecting different properties associated with the elements. In this way, the coded information is read and utilized.

Means in provided to manipulate interactive elements outside the lattice area. Such means includes propagation means for moving the elements, as well as means for performing functions on the elements themselves, such as creating and destroying elements, etc.

A lattice display can be provided by using a light source to illuminate the lattice which contains interactive elements having different properties. Thus, a viewer (or an output detector) is responsive to light passing through the lattice or reflected from it in order to provide a representation of the lattice itself.

A particularly suitable embodiment illustrating the use of a lattice in a system utilizes magnetic bubble domains in a magnetic medium. The magnetic bubble domains are free to move within the magnetic medium and have stray magnetic fields associated with them. Due to the stray magnetic fields, the magnetic bubble domains can interact with one another and, if no position determining structure is provided, will seek positions determined by the interactive forces existing between the bubble domains. Thus, if bubble domains are brought into a confined area where they are free to move, they will position themselves to minimize the total energy of the arrangement and can establish a lattice of magnetic bubble domains.

When magnetic bubble domains are used as the magnetic elements in a lattice, bias field means can be provided to provide a magnetic bias field directed substantially along an easy direction of magnetization of the magnetic medium. This bias magnetic field can have different values over different regions of the magnetic medium. For instance, it can be a substantially small (or zero bias) in the lattice area while being a larger bias outside this area. Another alternative is that the bias field be uniform throughout the magnetic medium (i.e., within the lattice area and outside the lattice area). Depending upon the range of bias conditions chosen, the confinement force as well as the other forces acting on the magnetic bubble domains is appropriately adjusted. Additionally, the bias field means can include means for providing a small modulating bias field which aids in overcoming the coercivity of magnetic bubble domains in the magnetic medium.

Another suitable embodiment of a system using a lattice of magnetic elements comprises magnetic elements which are supported by a medium in which they are free to move. An example is magnetic elements which are carried by a medium such as a liquid. For instance, magnetic elements can be located on styrofoam balls which are free to float on water. These magnetic elements are essentially dipole elements having stray magnetic fields which interact with one another. Thus, if the elements are close enough to one another, the position of each of the styrofoam balls on the surface of the water will be determined by interactive forces existing between each of the magnetic elements. These interactive elements can be coded by different physical properties, such as their color, and when so coded can be used to represent information. When they are confined within an area, the array of elements may assume lattice positions.

Means is provided to move the styrofoam balls into the confined area lattice and outside the lattice area. Additionally, means is provided to detect different coded properties of the styrofoam balls (for instance, their color) in order to sense the information associated with the magnetic elements.

A system using a lattice is particularly useful for storage of information when the interactive elements themselves have different properties. In such a case, a very dense store is provided which uses a minimum of structure in the storage area for moving the interactive elements. However, the elements need not be coded in order to be useful in a system. Such interactive element lattices can be useful as sub-combinations of other useful apparatus. Thus, systems having information associated with interacting elements are presented herein which use an array (lattice) arrangement of these elements as an integral part of the system. Whereas periodic arrangements of elements have been physically observed, the following is the first such used of these arrangements in useable systems.

These and other objects, features, and advantages will be more apparent from the following more particular description of the invention.

BRIEF DESCRIPTION OF THE DRAWINGS

FIG. 12 is a plot of the total bias field $H_z$ versus distance along a magnetic medium for a bubble domain lattice array which has a different bias field outside the array than within the lattice array.

FIGS. 13A-13D illustrate various structures for confining interactive elements within a lattice array.

FIG. 18 shows a structure for providing access means to move interactive elements into and out of a lattice array.

FIGS. 19A-19E illustrate the operation of the structure of FIG. 18 for movement of interactive elements into the lattice array.

FIG. 20 shows another structure for movement of interactive elements into a lattice array. FIG. 21 illustrates another structure used for the movement of interactive elements into and out of a lattice array.

FIGS. 22A-22G illustrate the operation of the structure of FIG. 21 for various time sequences, showing the operations of injecting interactive elements into the lattice and ejecting these elements out of the lattice.

FIG. 23 shows a structure suitable for aiding movement of magnetic bubble domains within a lattice array, the structure providing forces which tend to overcome coercive forces within the array.

FIG. 24 shows a structure for aiding movement of interactive elements within a lattice array.

FIG. 30 is a table showing the sequence of current pulses in appropriate conductors which is used during the movement of interactive elements into and out of a lattice array in accordance with the structure of FIG. 29.

FIG. 31 is a table showing the various positions of interactive elements for different times corresponding to the sequence of current pulses applied to the conductors forming the structure of FIG. 29.

FIG. 32 shows structure for coding magnetic bubble domain interactive elements for use as information states within a lattice array, the coding being in accordance with the hard and soft properties of magnetic bubble domains.

FIG. 33 shows a read means for detecting the hard and soft properties of magnetic bubble domains which have been written in accordance with the structure of FIG. 32.

FIG. 35 shows a read means for determining the information states of magnetic bubble domains coded in terms of their deflection properites, by structure such as that of FIG. 34.

FIG. 36 shows a structure for coding magnetic bubble domain interactive elements in terms of the size of the bubble domains. This figure also shows the means for reading bubble domains which have differing sizes representative of information.

FIG. 48 shows a detailed diagram of circuitry used to shift information from one lattice to another in the structure of FIG. 41.

DETAILED DESCRIPTION OF THE PREFERRED EMBODIMENTS

The following description will be concerned with three major areas:

I. Lattice Information Systems - General Description;
II. Bubble Domain Lattice Information Systems;
III. Other types of interactive Element Lattice Systems.

In all of the embodiments to be described, elements which can interact with each other are brought into a confined area or removed from this area, usually in groups of more than one element. Within the confined area, there is generally no structure which will establish the positions of the elements with respect to one another. If the elements are close enough to one another they will interact with one another and these interactions will substantially determine the positions of the elements in the confined area. The arrangement of elements in the confined area can form a lattice array of elements, which is particularly useful in various information systems.

The first major topic concerns the general principles of systems using confined arrays (such as lattices) of interactive elements, while topics II and III describe lattice information systems using particular types of magnetic interactive elements. In topic II, the magnetic elements are magnetic bubble domains while in topic III, the magnetic elements used are, for instance, magnetic dipole elements supported by a medium in which they are free to move.

I. LATTICE INFORMATION SYSTEMS

FIGS. 1-5 show a lattice array of magnetic elements and various systems utilizing lattice arrays. The systems of FIGS. 2-5 utilize any type of elements where there are interactions between the elements which establish the positions of the elements with respect to one another.

The discussion in this section will concern lattices in general and the systems of FIGS. 2-5. The later sections will deal more particularly with embodiments to realize these general systems. In particular, discussions concerning bubble domain lattice information systems (II) will discuss many of the parameters of these systems in a general way. Additionally, the effect of other parameters where magnetic bubble domains are utilized will also be discussed.

FIG. 1

Figure 1:
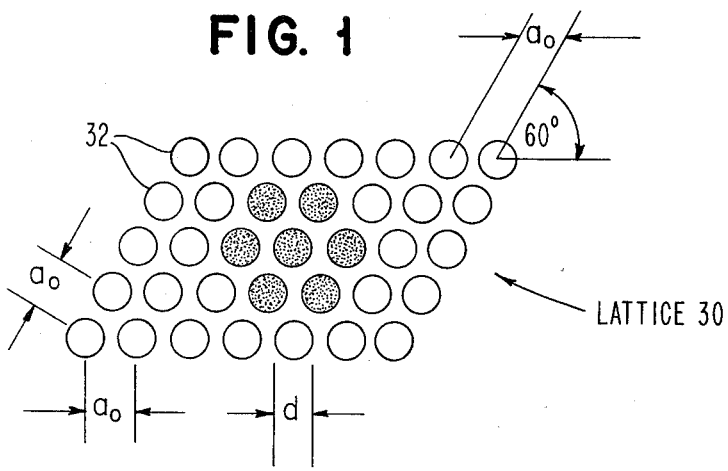
FIG. 1 shows a lattice arrangement of interactive elements.

FIG. 1 shows a lattice 30 which is comprised of a plurality of interacting elements 32. These elements interact with one another in a manner which determines the positions of the elements with respect to one another. The elements are shown in this diagram as being round elements having a diameter $d$, and a center-to-center spacing $a_0$, which is the lattice constant. In FIG. 1, the elements are in a hexagonal packing, but it should be understood that square lattices can also be used in the present invention.

The elements 32 are free to interact with one another and to move such that their positions are determined by the interactive forces existing between them. In the case of repulsive interactive elements and a fixed number of elements in a given area, a hexagonal arrangement leads to a maximum separation between elements. This is illustrated by the arrangement of the shaded elements in FIG. 1. Each magnetic element has six nearest neighbors arranged in a hexagonal structure. In this manner, the lattice array 30 is similar to an array of atoms in an atomic lattice.

The lattice is characterized in that the forces on any interactive element 32 are primarily those due to its nearest neighbors. Of course, the elements around the periphery of the lattice array will have the position shown in FIG. 1 only if there are restraining forces provided on them in order to compensate for repulsive forces from the other elements in the lattice. That is, confinement forces are required to ensure that the interactive elements on the periphery of the lattice are not expelled from the lattice due to forces from elements within the lattice.

The arrangement of FIG. 1 is capable of providing very high packing density, since the interactive elements can have a close-packed structure in which the lattice constant $a_0$ is very small. For instance, a lattice array of interactive bubble domains in a material with applied bias field $H_b=0$ can have a lattice $a_0$ slightly greater than the domain diameter ($a_0=1.35d$). This provides extremely high packing densities and, if information is stored in the properties of the interactive elements themselves, extremely high storage densities can be provided. Additionally, since the system will operate without propagation structures within the lattice array, ease of manufacturing and utilization results.

The shape of the lattice array can be varied greatly as will be more fully appreciated in further discussions. The particular shape of the lattice in FIG. 1 uses the symmetry planes of the lattice such that columns of interactive elements 32 are at an angle of approximately 60° with horizontal rows within the lattice. This is a particularly useful arrangement since it provides for more direct accessing of elements within the lattice. However, other combinations exist, it being only important that the interactive elements be contained in an area having substantially no position-defining structure for the elements and where they can be selectively addressed. When the elements are close enough their positions are locally determined primarily by interactions with other elements, since position-determining structure is substantially absent from the area of confinement.

As the discussion proceeds, it will be apparent how information can be coded in the elements 32, how these elements or groups of such elements can be moved into and out of the lattice array 30, how such elements can be detected, and how very dense storage systems can be provided.

FIG. 2

This figure shows a system using a confined array 30 of interactive elements 32. In this figure, array 30 is a lattice which is maintained by confinement means 34 which provides a force on the peripheral elements 32 within the lattice, thereby maintaining the lattice. The size of lattice array 30 is immaterial; it could be, for example, a 2 × 2 lattice, or 1000 × 1000 etc. In principle, any portion of the lattice looks as though it were part of an infinite lattice of elements, since the primary contribution of forces on any element within the lattice is that due to its nearest neighbors.

A write means 36 is used to provide interactive elements 32 to the lattice. Additionally, this write means could include further means for coding the elements 32 so that different properties are obtained. In this regard, the elements 32 in the lattice will themselves be the carriers of information.

Input means 38 receives the interactive elements from write means 36 and enters them into lattice 30. Input means 38 provides sufficient force to the input elements that they are able to overcome the force produced by confinement means 34 in order to enter the lattice array.

An output means 40 is used to remove elements 32 from lattice 30. Output means 40 is similar to input means 38 in that it provides sufficient forces to overcome the retaining forces provided by confinement means 34. This enables elements 32 within lattice 30 to be withdrawn from the lattice. As will be more apparent later, providing elements 32 at the input of the lattice can be a technique for removing other elements from the lattice. That is, elements 32 already within the lattice have forces exerted on them by the elements being entered into the lattice and these forces are transmitted through the lattice causing the elements at the output and of the lattice to be expelled from the lattice.

A read means 42 receives elements 32 from the output means 40. The read means is used to detect the elements 32 from the lattice and in particular is used to detect different information associated with the elements. Of course, a read means is not required when the lattice elements 32 are to be utilized elsewhere. Utilization means 44, such as a computer or other apparatus, can be means responsive to the signal produced by the read means or can be means for utilizing domains previously stored within lattice array 30.

Figure 2:
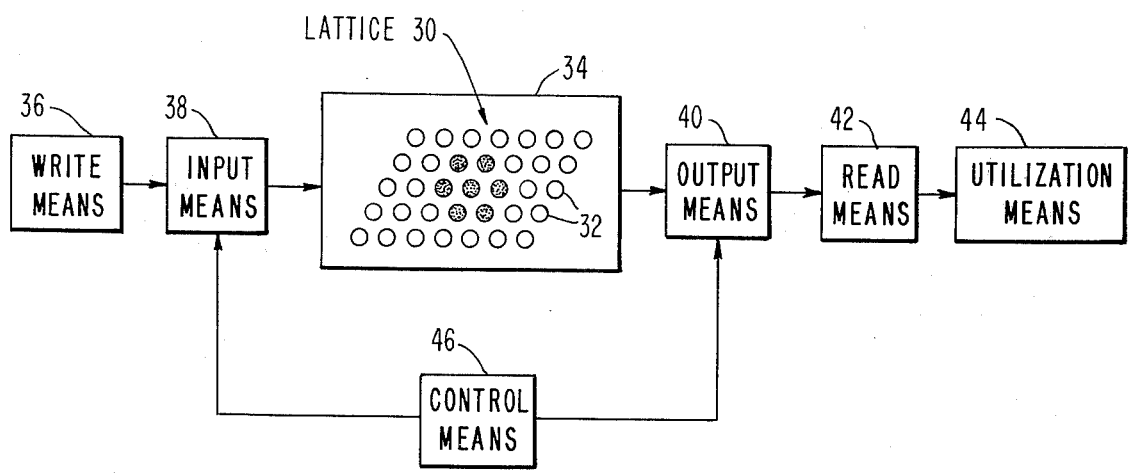
FIG. 2 is a block diagram of an information-handling apparatus utilizing a lattice arrangement of interactive elements.

The system of FIG. 2 operates under control of control means 46, which provides clock inputs to input means 38 and to output means 40. Thus, synchronization is provided.

FIG. 3

Figure 3:
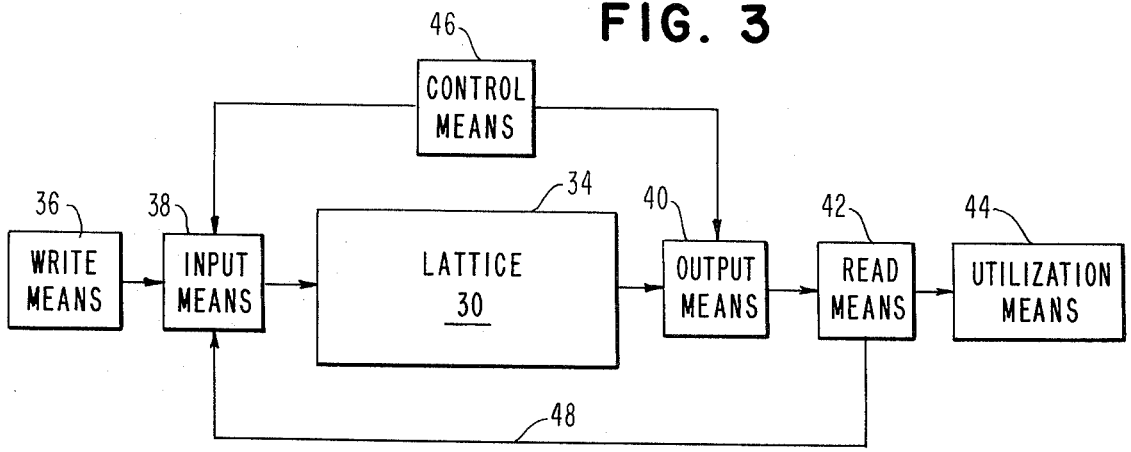
FIG. 3 is a block diagram of another information-handling apparatus using a lattice array of interactive elements, where the interactive elements can be returned to the lattice array.

FIG. 3 is an information system using a lattice array which is a modification of the system of FIG. 2. Accordingly, in this figure and in other figures, the same reference numerals will be used whenever possible to identify components having the same or similar functions. In FIG. 3, the system is comprised of a write means 36 for producing interactive elements to be stored in lattice area 30. Input means 38 is connected between write means 36 and lattice 30 and provides accessing of interactive elements into lattice 30. An output means 40 removes the interactive elements from the lattice area 30 and transmits them to the read means 42, where their information content is determined. If desired, a utilization means is provided for using the output of the read means for other purposes. Synchronization of the overall system is provided by control means 46 which produces clock pulses to synchronize the input and output means, as well as any other means requiring control.

The system of FIG. 3 differs from that of FIG. 2 in that a path 48 is provided for returning the interactive magnetic elements from the read means 42 to the input means 38. In this manner, nondestructive readout occurs and the interactive elements can be returned to the lattice area 30. As will be seen later, these elements can be replaced in corresponding positions in the lattice or can be intermingled with new elements from write means 36. Thus, it is possible to provide entirely new information in the lattice, to replace only part of the information in the lattice, or to restore the original information to the lattice area. This feature is particularly advantageous in large capacity storage systems were nondestructive readout is a preferred mode of operation.

FIG. 4

Figure 4:
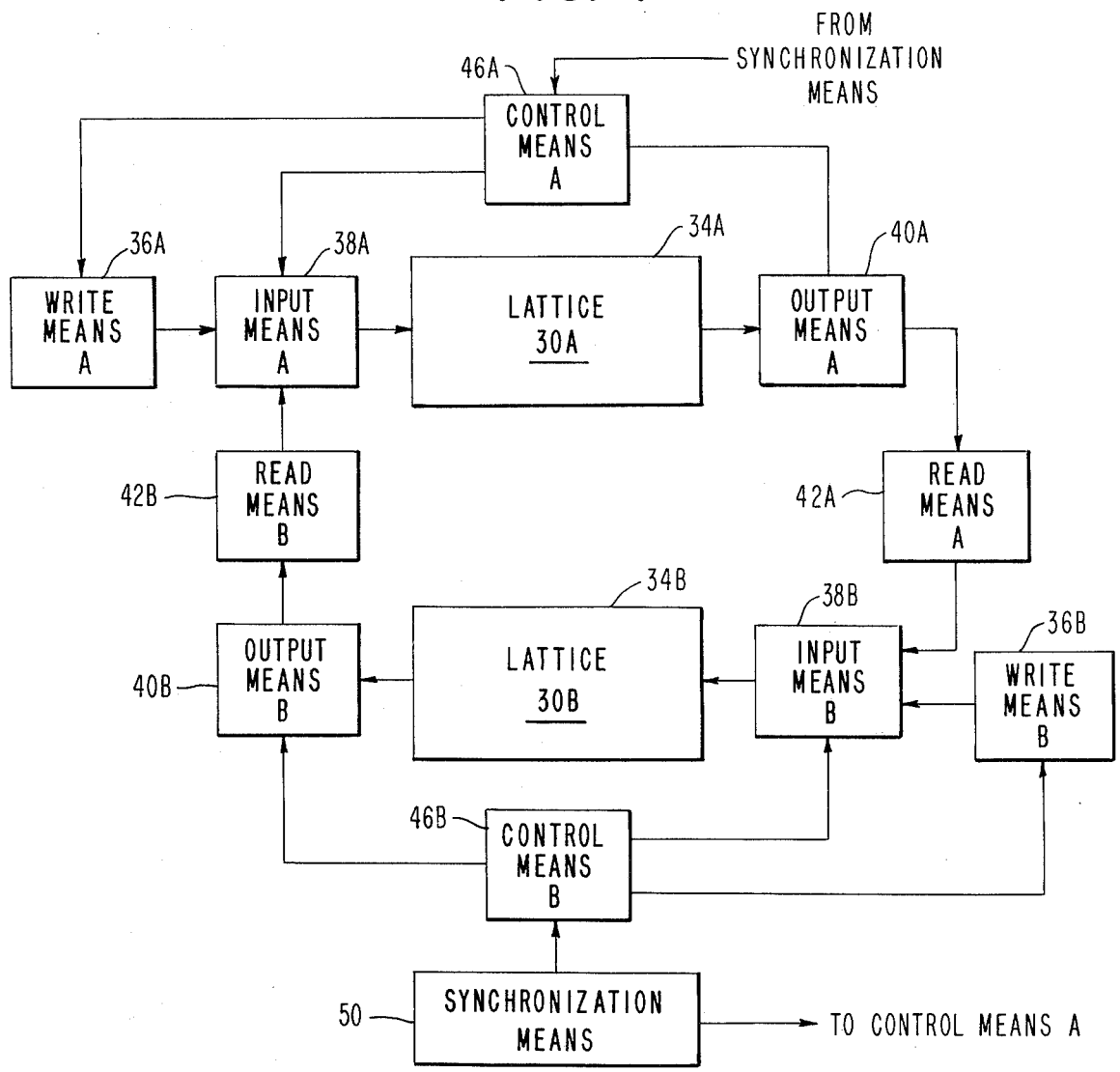
FIG. 4 is a block diagram of an information-handling apparatus using two lattice arrays of interactive elements.

FIG. 4 is a schematic diagram of another information system using a lattice area as an integral part thereof. However, the system of FIG. 4 utilizes two lattice areas 30A and 30B, wherein the magnetic elements move back and forth between the two lattice areas. Thus, information read from one lattice is transferred to another for storage therein. This is a nondestructive readout scheme which is particularly suitable for use as a high-capacity storage system. That is, the interactive elements within a lattice area are very closely packed to provide high density storage. These elements are removed from the lattice for the reading operation and are returned to another lattice for storage. If desired, the information taken from lattice 30A can be recoded before being put into lattice 30B. Consequently, information is retained and a very efficient high-capacity system is provided.

In FIG. 4, the same reference numerals are used as were used in the previous figures. The first lattice area and its associated components are identified by the suffix A while the second lattice area and its associated components are generally identified by the suffix B.

In more detail, a write means 36A provides interactive elements to input means 38A. These elements are placed in lattice 30A by the input means 38A and can be removed from lattice 30A by output means 40A. Control of the input means 38A and output means 40A is under the direction of pulses provided from control means 46A. Elements taken from lattice 30A are read by read means 42A, after which they are directed to lattice 30B.

Input means 38B directs the output of lattice 30A to lattice 30B where they are entered therein. If desired, new information can be provided by write means 36B, the information from lattice 30A being detoured or destroyed by means 38B under control of unit 46B. The elements in lattice 30B can be removed therefrom by output means 40B and then read by read means 42B. The input and output operation for lattice 30B is controlled by control means 46B. The overall control of the system comprising both lattices 30A and 30B is synchronized by synchronization means 50 which provides inputs to control means 46A and 46B. This ensures that information moves smoothly from one lattice to another and that the operations concerning each particular lattice are timed properly.

The output of read means 42B is directed to input means 38A associated with lattice 30A. If desired, the output of lattice 30B can be directly entered into lattice 30A. However, the input means 38A can include means for destroying or rerouting interactive elements from lattice 30B in order to be able to write new elements into lattice 30A. In this case, the write means 36A will produce the elements which then are entered into lattice 30A.

Thus, the system of FIG. 4 provides a circulation of elements from one lattice area to another under control of associated components. This is a particularly advantageous systems approach and one which can be easily modified or upgraded, for instance by the provision of additional lattice areas. Further, the size of the two lattice areas shown does not have to be the same, and asynchronous operation can be utilized. The principle is that information from a lattice need not be returned to that particular lattice or be destroyed; rather, it can be moved from one lattice area to another in order to retain the information in a more economical and efficient manner.

FIG. 5

Figure 5:
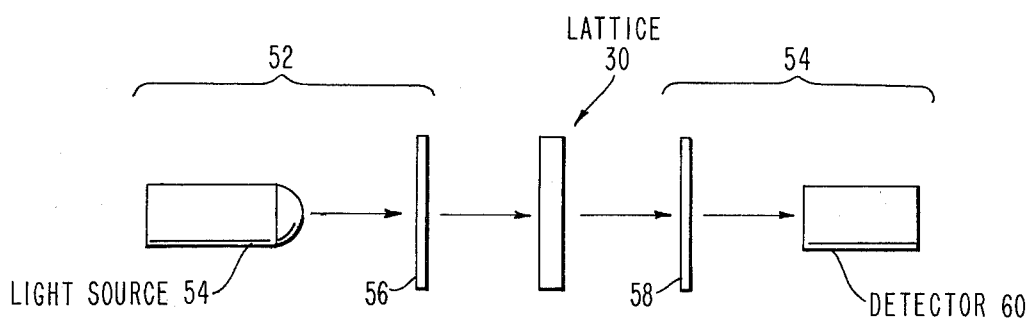
FIG. 5 is a block diagram of an information-handling apparatus using a lattice array of interactive elements, in which a light source is used to illuminate the lattice array.

FIG. 5 illustrates that optical readout can be used in conjunction with information contained in the lattice area. Further, the lattice area can be used for display of information in the form of the different interactive elements within lattice 30.

In more detail, lattice 30 is located between a light means generally designated 52 and a read means, generally designated 54. Light means 52 is comprised on a light source, such as a laser, and a polarizing element 56. Of course, for various systems the light source need not be a source of coherent light and a polarizing element need not be used. In the particular case where the elements 32 in lattice 30 are magnetic bubble domains, the use of a polarizer in combination with a light source is particularly advantageous.

Read means 54 is comprised of means for detecting the light which is transmitted through the lattice or reflected from the interactive elements within the lattice. In FIG. 5, read means 54 comprises an analyzer 58 and a suitable light detector 60. In some cases, the use of polarized light is not required and consequently analyzer 58 would be unnecessary. Additionally, the detector could be any sort of light responsive mechanism and in some cases will be the human eye viewing the arrangement of interactive elements within lattice 30. This will be more apparent in the description of the embodiments which follow. Although the read means is shown being outside the lattice area, it could be positioned to read information associated with interactive elements while they are within the lattice area.

The description of FIGS. 1-5 has been a general description for systems using a confined array (which could be a lattice) of interactive elements where the interactions between the elements are the primary determinents of the position of the elements within the area of confinement. While some general considerations have been discussed concerning lattice properties, accessing of information within the lattice, and establishment of interactive elements having different properties, these concepts will be more fully explained in the following description, which describes particular embodiments for achieving information systems using lattices of interactive elements.

II. BUBBLE DOMAIN LATTICE INFORMATION SYSTEMS

This topical portion will be concerned with information systems using confined arrays (lattices) where the interactive elements are magnetic bubble domains that are free to move in a magnetic medium which supports them. Such a medium is well known in the art, and includes orthoferrites, garnets, amorphous magnetic materials, and any other magnetic medium capable of supporting magnetic bubble domains. In the discussion to follow, many of the aspects of the physics and mathematics concerning lattice arrays will be applicable to systems using interactive elements other than magnetic bubble domains. In the particular case of magnetic bubble domains, other parameters, such as a magnetic bias field, can have some influence on the physics of the system. These particular influences will be described in detail.

Figure 6:
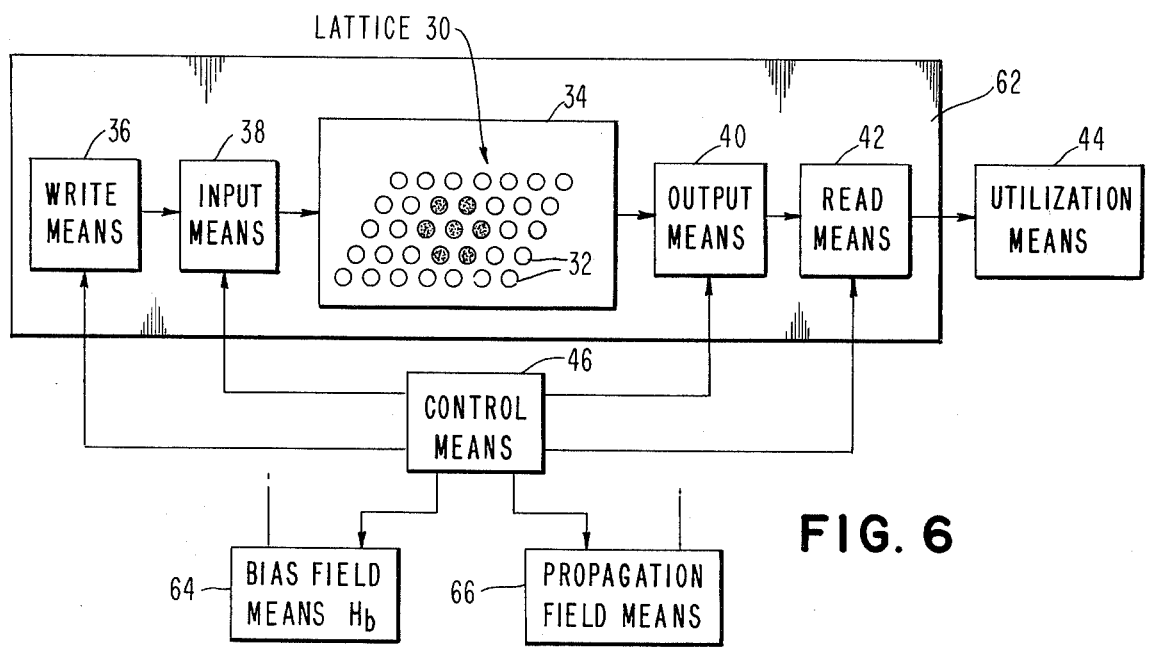
FIG. 6 is a block diagram of an information-handling apparatus using a lattice array of interactive elements, where the interactive elements are magnetic bubble domains.

FIG. 6 shows a representative system using a lattice array 30 where the interactive elements 32 are magnetic bubble domains existing within the magnetic medium 62. The confinement means 34 is used to control the shape of the lattice 30 and to retain magnetic elements 32 located along the periphery of the lattice. As described previously, a write means 36 produces magnetic bubble domains for entry into lattice 30 via the input means 38 and output means 40 can be used to remove bubble domains from lattice 30, which domains are then read by read means 42. This embodiment assumes that the bubble domains are coded to have different properties indicative of various information states. The output of read means 42 is applied to utilization means 44. Control means 46 provides inputs to write means 36, input means 38, output means 40, and read means 42 in order to synchronize operation of the system.

The bubble domain lattice system of FIG. 6 also includes a bias field means 64 for producing a magnetic bias field, generally but not necessarily directed substantially parallel to an easy direction of magnetization of the magnetic medium in which the bubble domains exist. As will be more apparent later, the magnetic bias field can be uniform throughout the magnetic medium of may have differing values in different regions of the magnetic medium. For instance, a very small (or zero) bias field may exist in the lattice area while a larger bias field may exist in areas of the magnetic sheet surrounding the lattice area.

A propagation field means 66 is also provided which is generally used to provide magnetic fields for moving the magnetic bubble domains. The propagation field means can include many different structures including current carrying conductors or elements of magnetically soft material located adjacent to the magnetic medium in which the bubble domains exist. The propagation fields are used to move domains both within lattice area 30 and in areas of the magnetic sheet 62 surrounding the lattice area.

The following will be a description of the various operating parameters required for providing systems using lattics of interactive elements.

A. Bias Field Conditions

For a lattice comprising magnetic bubble domains, a parameter which can be adjusted for design purposes is the applied magnetic bias field $H_b$ parallel to an easy direction of magnetization of the bubble material 62. In general, various bias field arrangements are possible, such as 1. Bias field $H_b = 0$ or a small value within the lattice area, but has a larger value outside the lattice area. Its value outside the lattice area is approximately that used in the case of isolated bubble domain devices (i.e., $(4\pi M_s)/3$, where $M_s$ is the saturation magnetization of the magnetic bubble domain material).

2. A small uniform bias field $H_b$ can be used for areas inside and outside the lattice. In this case, the bias field is uniform over the entire magnetic bubble domain material, suitable value being approximately $\frac{1}{4}(4\pi M_s)$. If there is an array of bubble domains surrounding the storage lattice array, the applied bias field $H_b$ can be uniform with a zero value both inside and outside the storage lattice.

Using different ranges of bias field is useful as a design parameter depending upon the application desired. For instance, a uniform, small applied bias field throughout the magnetic material is helpful in providing a lattice which is relatively insensitive to variations in bias field and in which the magnetic bubble domains can be more easily moved. Since the interaction force between bubble domains is proportional to $d^4/a_0^4$, a change in bias field which changes these parameters will alter the force existing between magnetic elements. Since the ability to easily move magnetic elements within the lattice is a function of the force existing between the elements, varying the bias field in a particular design is a useful parameter.

In addition to these bias field considerations, it is possible to use an ac tickling field produced by a current-carrying coil surrounding the magnetic medium. An ac field or a pulsed bias field tends to reduce damping caused by coercivity $H_c$ in the bubble domain material which in turn enables the domains within the lattice to move more freely. The frequency of the ac field is such that a few cycles of this field will occur during lattice shifting. For instance, pulses of 2-3 Mc frequency having a width of about 1 microsecond are suitable.

For some magnetic elements, uniform bias fields will have no effect. For instance, in the embodiment to be shown using styrofoam balls floating on a liquid and having magnetic elements therein, the presence of a bias field has no effect. Therefore, interactive elements can be provided which may or may not be influenced by a magnetic bias field substantially normal to the medium in which they exist. Generally, when the magnetic moments of the magnetic elements are a function of bias field, the bias field will have an effect due to the magnetic energy term which it introduces.

LATTICE PROPERTIES

In this subsection a lattice, such as that shown in FIG. 1, will be discussed in more detail. The lattice of FIG. 1 has been described as being made up of a plurality of interactive elements 32 located in an arrangement where there is equal spacing between the elements, the spacing being defined by a lattice constant $a_0$. The interactive elements have a diameter $d$.

Generally, interactive elements will arrange themselves such that the total energy of the system is minimized. For instance, in a lattice comprised of magnetic bubble domains where $H_b=0$, the magnetic medium in the lattice area will comprise roughly equal areas of up and down magnetization. As additional bubble domains are put into the lattice area, the size of bubble domains within the lattice will change in order to have equal areas of up and down magnetization. Further, the total magnetostatic energy plus the domain wall energy is minimized for a particular size bubble domain when in a lattice arrangement. Therefore, for a given number of bubble domains, the bubble domains will position themselves so as to minimize the total energy of the system.

A lattice characterized by equal areas of up and down magnetization is termed a demagnetized lattice. This lattice can be affected to change somewhat the distance between domains within the lattice in order to achieve a more dense lattice with smaller bubble domains. Within the bubble domain lattice there is a lowest energy configuration for a particular bias field. For instance, at $H_b = 0$, the spacing $a_0$ between bubble domains is $1.35d$. This spacing can be varied by use of an applied bias field $H_b$. In a manner analogous to friction, the coercivity $H_c$ of the medium may cause the lattice constant $a_0$ to locally deviate from this value.

Figure 7:
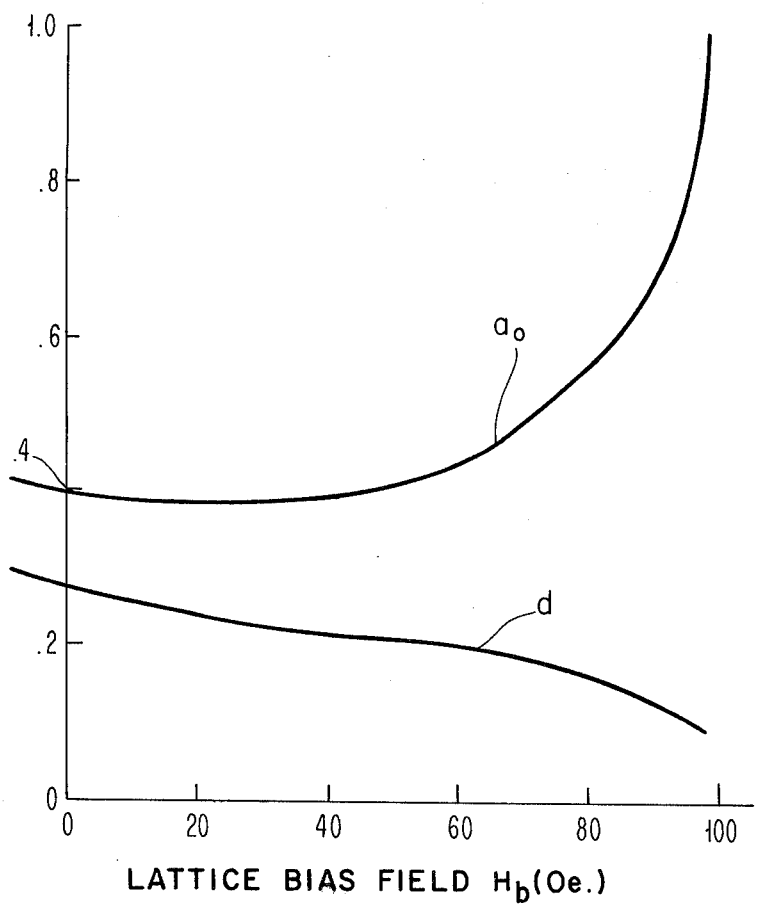
FIG. 7 is a plot of lattice constant $a_O$ and bubble domain diameter $d$ versus applied bias field, for a lattice arrangement of magnetic bubble domains.

A lattice has an inherent stability which is greater than the stability for isolated bubble domains (bubble domains which do not substantially interact with one another). This is illustrated by FIG. 7 which is a plot of lattice constant $a_0$ and bubble domain diameter $d$ as a function of applied bias field $H_b$. The bubble domain material is $(YEu)_3(FeGa)_5O_{12}$. From these curves, it is readily apparent that there is a fairly wide range of bias field over which the quantity $a_0$ changes very little. During this same range of applied bias field, the diameter of the domains will change slightly but not by a great amount. As the bias field becomes larger, the distance between the domains increases at a greater rate until the domains become isolated domains. The diameter of the domains begins to decrease more rapidly also. The bias field $H_b$ can range from a negative value to approximately one half the value for isolated bubble domains without substantial changes in the lattice constant $a_0$. However, there will be a change in the total area of up magnetization of the magnetic medium versus down magnetization of the magnetic medium in the lattice area, due to a change in diameter of the bubble domains.

Figure 8:
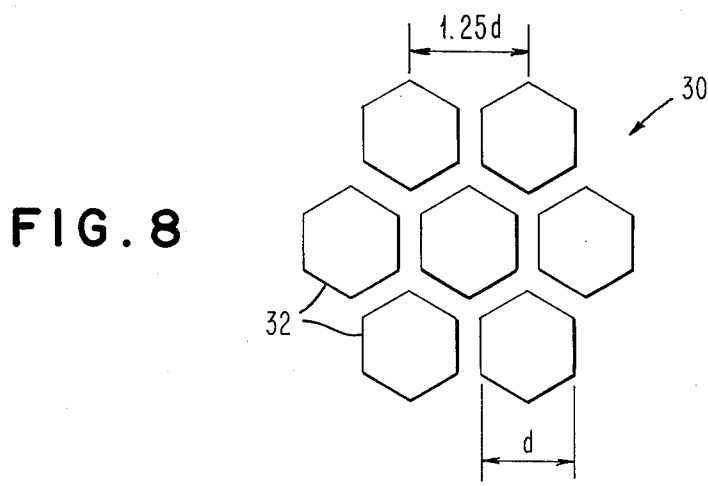
FIG. 8 illustrates the shape of magnetic bubble domains in a lattice array when the applied bias field $H_b$ is sufficiently negative.

The total bias field on domains within the lattice is comprised of the applied bias field $H_b$ and the bias field due to interacting stray magnetic fields of the domains. As the applied bias field is increased, domains within the lattice will collapse at values of applied bias field less than that which would cause collapse of domains isolated from one another. This is because the total bias field on domains within the lattice is a combination of the applied bias field and the interactive magnetic field produced between interacting domains, as explained previously. As the applied bias field decreases, there is a range over which the domains in the lattice won't be converted into stripe domains. This is due to the bias field arising from the interacting magnetic fields between the domains in the lattice. When the applied bias field decreases such that the center-to-center spacing ($a_0$) of domains within the lattice is approximately $1.25d$, the bubble domain shape changes, although a lattice arrangement still exists. This is illustrated by the hexagonal bubble domains of FIG. 8.

As the value of applied bias field exceeds a certain negative value, domains may start to combine and the lattice structure no longer exists. Then the type of domain combination occurs, it is not possible to reobtain the lattice arrangement by merely increasing $H_b$.

If there are constraints on the lattice boundary (as for instance by structure which exerts forces to confine the lattice domains) the curves of FIG. 7 remain flat over a greater range of applied bias field $H_b$. The bubble domains will shrink in diameter but the lattice constant $a_0$ stays approximately the same until the total biase field (applied field $H_b$ plus interaction field $H_i$) becomes sufficient to collapse the domains.

The range of bias field over which the lattice of bubble domains is stable in a function of the properties of the material, including magnetization, anisotropy, and thickness, as well as the strength of the exchange interaction of the material. The range varies from small negative values to values comparable to that which are the criteria for stable isolated bubble domains. (Thus for a typical 5 micron rare earth iron garnet bubble domain material, the total bias field ($H_b + H_i$) is $$102 \text{ Oe} \geq H_z \geq -25 \text{ Oe}$$

The lower bound of total bias field is that total bias field which will prevent domains from combining and thereby destroying the lattice. The high value of suitable bias field is a value less than the value which would cause isolated regions of bubble domain collapse within the lattice. That is, spontaneous collapse of bubble domains at areas within the lattice should not occur, if it is important to have a lattice with all positions filled. Stated differently, the high and low ends of applied bias field $H_b$ are chosen such that the lattice does not disappear, whether by reason of the domains becoming stripe domains or by reason of the domains collapsing within the lattice.

LATTICE SHAPE - INFORMATION USE

For a hexagonal lattice, the interactive elements in the lattice arrange themselves in a hexagonal close packing arrangement with each element having six nearest neighbors arranged at the corners of a regular hexagon. That is, the symmetry lines and planes of interactive elements in this type of lattice are at 60° with one another. In the case of a square lattice, the symmetry lines and planes will be at 90° with respect to each other. As will be more apparent later, in order to provide a regular lattice (i.e., one in which all positions of the lattice are filled) the shape of the lattice must be along the symmetry lines and planes of the interactive elements.

Figure 9A:
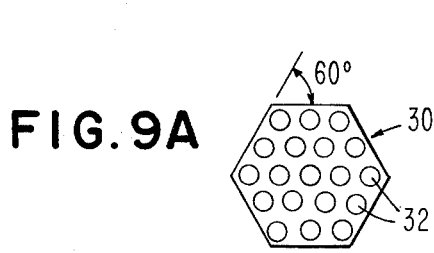
FIGS. 9A-9D represent various shapes of a lattice arrangement of interactive elements.
Figure 9B:
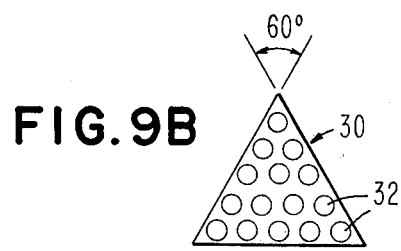
Figure 9C:
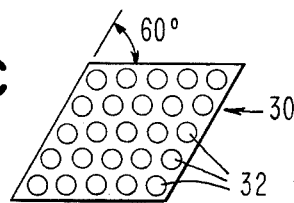

FIGS. 9A, 9B, and 9C show three possible hexagonal lattice shapes which will provide regular lattices with all positions within the lattice filled by interactive elements 32. FIG. 9A shows a hexagon-shaped lattice, FIG. 9B shows an equilateral triangle-shaped lattice, while FIG. 9C shows a parallel piped-shaped lattice. The symmetry lines and planes for each of these lattices are arranged at 60° with respect to one another.

Figure 9D:
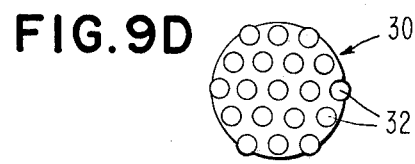

The lattice of FIG. 9D has a circular shape and is not a regular lattice since dislocations (that is, vacancies and misplaced elements 32) will exist within the lattice which is bounded by a confinement means having circular shape. Although the lattice of FIG. 9D is a lattice which could be used in an information system, lattices having shapes determined by symmetry lines and planes of the interactive elements are easier to use. In particular, it is easier to move interactive elements into and out of these regular lattices, and each position within the lattice will be filled. If the interactive elements are coded to represent information, use of a regular lattice will ensure that no information is lost.

Figure 10A:
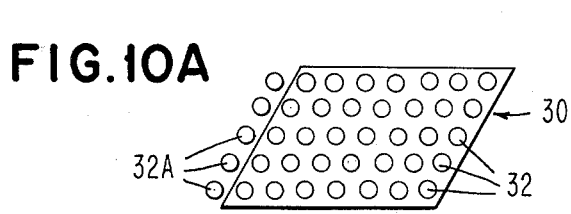
FIGS. 10A and 10B represent an input operation where interactive elements are to be put into a lattice array.

If the geometry of the lattice area, and the lattice constant $a_0$ are initially determined, a certain number of interactive elements will be required within the lattice area in order to provide a regular lattice having all positions filled. However, the lattice has some flexibility and it is possible to insert additional interactive elements without causing severe disturbances in the lattice. For instance, FIG. 10A shows a lattice 30 which is assumed to be completely filled with interactive elements 32, thereby forming a regular lattice. It is desired to push new interactive elements 32A into the lattice and to have all elements 32 already in the lattice remain there. This will cause a crowding of the lattice at the edge where the elements 32A are entered and an adjustment of the lattice constant $a_0$ at that edge will result.

Figure 10B:
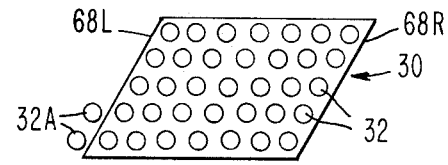

FIG. 10B illustrates the case where only two interactive elements 32A are to be entered into a regular lattice 30 having interactive elements 32 at each position. When elements 32A are entered into the lattice, vacancies corresponding to the missing interactive elements in the column to be entered will be moved into the lattice. These vacancies can be propagated through the lattice and represent lattice dislocations. In general usage, it is preferable not to have vacancies in the lattice as information will be lost or the properties of the lattice will not be maintained in a regular fashion. That is, the interactive elements within the lattice will rearrange themselves to compensate for the vacancies (or looked at another way, to compensate for the additional two interactive elements 32A). This will cause localized adjustments in the lattice constant and the uniformity of the lattice will be perturbed.

Another aspect of tolerance for successful accessing of domains into and out of the lattice concerns the dimensions of the lattice. In particular, the dimensions of the left and right hand edges 68L and 68R (along which domains enter and leave the lattice) of the lattice are more important than the other dimensions of the lattice. Any variation in lattice generating will cause a local variation in lattice spacing. Whatever variation occurs in $a_0$ should fall within the limits of stability, as illustrated with respect to FIG. 7 and must be gradual enough so as not to cause dislocations in the lattice. As an example, a tolerance on the left hand and right hand edges of the lattice of approximately $\pm \frac{1}{2} a_0$ is suitable.

Another consideration for the lattice concerns the angle at which the input elements 32A enter the lattice. Generally, the direction of the input elements 32A is about 60° with respect to the edge 68L of the hexagonal lattice, although variations of this angle are allowed. For instance, a variation of about $\pm 2°$ is a suitable example. For a square lattice the input angle is approximately 90° with respect to the edge of the lattice, and can also be varied. This angle is not highly critical since the interactions between elements 32A and elements 32 within the lattice will have a stabilizing effect on elements entering the lattice, thereby maintaining the proper entry and exit directions.

CONFINEMENT FORCE

A lattice arrangement of interactive elements is stable due to the interaction forces between the elements themselves. However, for repulsive interactive forces, the elements located at the peripheral of a lattice arrangement undergo forces which are not balanced by additional elements outside the lattice area. For instance, in FIG. 1 the left-most upper element will have forces exerted on it by other elements within the lattice. If these are repelling forces, this corner element will be pushed away from the rest of the lattice arrangement. Therefore, a confinement means (generally designated 34 in FIG. 2) is used to maintain the shape of the lattice and to ensure that information in the form of interactive elements is not lost from the lattice. This subsection will deal with the force required to maintain the lattice while the following section will describe specific structures for confinement of the lattice.

In general, the confinement means provides forces which locally change the spaces between interactive elements. It should be remembered that the effects on any element within the lattice are primarily due to its nearest neighbors. Consequently, if a confinement means supplies a force around the peripheral of the lattice, the lattice will appear as an infinite lattice to any element within it. In this regard, the confinement force could be provided by elements outside the confined storage area and these could be a lattice of elements outside the storage lattice area.

Figure 11:
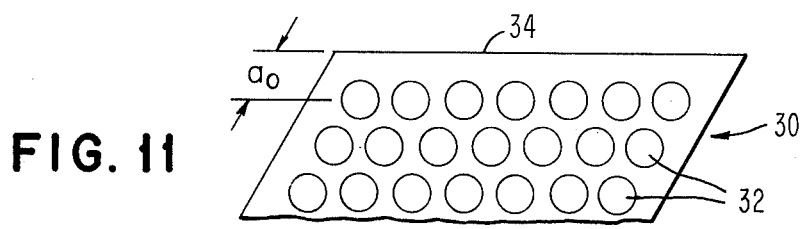
FIg. 11 is a schematic diagram illustrating tolerances for the positions of peripheral interactive elements in relation to the confinement means used to retain the lattice array.

Interactive elements at the edges of the lattice can move somewhat so that the distance from these domains to the confinement means may vary. As illustrated in FIG. 11, a variation of $\pm 20\%$ $a_0$ is generally permissable, although a larger tolerance may be suitable for some applications. If the confinement force is very strong, elements along the edges of the lattice area will be pushed toward the center of the lattice while if the confinement force is weak, the outer rows of interactive elements will move closer to the confinement means.

The confinement force can be either an attractive force which tends to pin elements along the periphery of the lattice or a repulsive force which tends to push peripheral elements into the lattice area.

The confinement force is used to separate (by an amount greater than $a_0$) rows of interactive elements in order to define a confined storage array (lattice). If there are no interactive elements outside the storage area, the confinement force is approximately equal to the interaction force $F_i$ acting on any interactive element due to its neighbors. However, if there are interactive elements outside of the intended storage area, the confinement force — which is just the force required to provide separation ($>a_0$) between elements inside and outside the storage area — can be less than $F_i$.

The amount of separation (in excess of $a_0$) to be achieved between rows of interactive elements determines the magnitude of the required confinement force. If the distance between the rows is $a_0$, then there is no "separation" due to a confinement force. Generally, for generation of lattice arrays where elements are moved into and out of the storage area a separation in excess of $a_0$ by an amount $a_0$ or less is sufficient, and the magnitude of the confinement force is chosen to provide this. For instance, a center to center spacing between rows of $(a_0 + a_0/2)$ is a suitable distance. Of course, the separation could be greater, which in turn would require larger confinement forces.

In the case of magnetic bubble domains, the confinement force is conveniently provided by localized variations in bias field in different regions of the magnetic material. For instance, in a system such as that shown in FIG. 4, the applied bias within the storage lattice areas could be $0.1(4\pi M_s)$ where $M_s$ is the saturation magnetization of the material, while the applied bias in regions where bubble domains are not used could be the saturation value. For the shift registers which move bubble domains between the lattices, the applied bias could be a value between $0.1(4\pi M_s)$ and the saturation field, in order to stabilize bubbles in the shift register. Of course, the value of $H_b$ (applied bias field) in the lattice can be adjusted in order to obtain a desired density of storage $(a_0)$.

For magnetic bubble domains, the interactive force $F_i$ between isolated domains can be calculated as dipole forces existing between the domains. This calculation establishes that the interactive force is given by the following expression:

$$F_i \propto \frac{(2\pi r^2 h\, M_s)^2}{a_0^4} \tag{1}$$

where
$M_s$ is the magnetization of the magnetic medium in which the bubble domains exist,
$r$ is the radius of the bubble domain,
$h$ is the height of the bubble domain,
$a_0$ is the center-to-center distance between domains.

Thus far, the discussion concerning confinement forces has been for the case where the total bias field $H_z = H_b + H_i$ is the same inside and outside the storage lattice area. However, if the total bias field within the lattice area is different from that outside the lattice area, a gradient in total bias will exist in the region of the lattice boundary. This gradient in total bias field will provide an additional force on bubble domains within the lattice for which account must be made in determining the confinement force required.

The additional force term due to any gradient in applied bias field by given by $d\nabla H_b$, where $d$ is the bubble domain diameter and $=H_b$ is the gradient across the bubble domain.

FIG. 12 illustrates a situation where the applied bias field $H_b$ outside the lattice is different from that within the lattice. However, the lattice area 1 may be such that there is a gradient $\nabla H_b$ which extends into the lattice area. The gradient will lead to a force on those bubble domains which experience the gradient and the presence of this force may cause an adjustment of lattice constant $a_0$ in localized areas of the lattice. Consequently, the applied bias field and the gradient should be adjusted so that the total bias field on the magnetic bubbles will not be sufficient to collapse the bubbles.

If the gradient in $H_b$ extends into the lattice area over a distance about $a_0$ or less, lattice area 1 (FIG. 12) can be used. In that case, only one row of the lattice would be perturbed by $\nabla H_b$ and the resulting force would aid in confining the lattice.

If the gradient in $H_b$ extends into the lattice area over a distance of several $a_0$, several rows of domains in the lattice would be perturbed. In this case it may be advisable to use lattice area 2 (FIG. 12) for the storage area.

The distance into the lattice which the gradient can extend is quite flexible and depends upon the amplitude of the bias field, the slope of the gradient, and the thickness of the bubble domain material. In order to minimize the extent of the gradient in the lattice, a small applied bias is preferable in the lattice area. In accordance with FIG. 7, the lattice constant and bubble domain diameter will change very little if a small field $H_b$ exists in the lattice area. This has the added advantage that the interaction force $F_i$ is slightly smaller (due to smaller diameter); accordingly, it is easier to move bubbles within the lattice.

A sharp slope in bias field at the edge of the lattice is defined as one where most of the slope occurs over one lattice constant $a_0$. That is, two rows of elements are separated by an amount greater than $a_0$, while the rest of the lattice is of uniform spacing ($a_0$). A gradual slope is one which occurs over several lattice constants, and which stresses the lattice.

Generally, the lattice can be stressed up to a point where it deforms plastically. That is, the stresses should be less than those which would cause irreversible changes in the lattice. For instance, a regular hexagonal lattice is one in which each element in the lattice has six nearest neighbors each at a uniform distance of $a_0$ from it. If stresses are put on this regular lattice, elements will change their regular spacing and the lattice will not appear to be uniformly hexagonal. When the stresses reach the elastic limit of the lattice, it will deform plastically, and not retain its original uniformity when the stress is removed.

The elastic limit of a bubble domain lattice is dependent on factors such as the applied bias field $H_b$. As an example, local modulation of 30–40% can be used without exceeding the elastic limit for $H_b \cong 0.1(4\pi M_s)$. As $H_b$ increases, $a_0$ becomes larger and the interaction force $F_i$ between domains decreases. This means that the lattice positions are less well defined, and the lattice is more susceptible to deformation. As long as the gradient in bias field causes stresses within the elastic limit for any given lattice, the uniformity of the lattice will be maintained.

As an aid to designing systems using lattice arrays, the gradient should be chosen so that localized collapse of bubble domains will not occur due to bias field amplitudes which become too great. Additionally, the bias field should not become so small that run-out of domains into strips occurs outside the lattice area. If an infinite slope gradient can be provided, no additional force will exist on domains within the lattice. Use of grooves in the magnetic material may lead to very sharp gradients in bias field, as will be explained later. The gradient can extend into the lattice to any extent as long as the local symmetry of the lattice is substantially maintained, that is, as long as each bubble domain sees a fairly uniform pattern of bubble domains surrounding it. Of course, this criterion is based on the desirability of using a regular lattice having substantially uniform lattice constant throughout. For certain applications, such a regular lattice may not be required in which case the gradients can be varied.

It should be remembered that the confinement force is the same for a lattice comprising a small number of interactive elements as well as for a lattice having a very large number of interactive elements, since the interaction force is based on a nearest neighbor consideration.

REPULSIVE BOUNDARY

A repulsive boundary is one which provides forces tending to repel the interactive elements 32. For interactive elements which have repelling forces existing between them, the forces provided by a repulsive boundary will be directed into the lattice area. These forces will generally be about equal on all sides of the lattice to within about $\pm 8H_c/\pi$.

Structures to provide repulsive boundaries can be fabricated from current-carrying conductors, and magnetic materials. Also, changes in the magnetic properties of the bubble domain material can be used. Such changes include thickness changes and changes brought about by ion implantation, diffusion, etc. Thus, the anisotropy or magnetization of a magnetic material can be locally altered to provide repulsive forces on magnetic interactive elements supported by the magnetic material.

FIGS. 13A–13D show some structures which can be used to provide repulsive confinement forces. Although each of these structures is shaped to confine a parallelpiped lattice, it should be recognized that lattices having any structures (shape) can be confined using these same principles. The lattice area chosen for illustration is that which is easiest to utilize in a practical system. Accordingly, the shapes chosen have advantages of ease of fabrication and ease of access of interactive elements into and out of the lattice areas.

FIG. 13A shows a basic conductor loop 70 which is directed along the symmetry planes of interactive elements 32 which form a lattice. Current $I_c$ in conductor 70 will produce a magnetic field which exerts a force to repel interactive elements 32 located within conductor 70.

In order to compensate for any local variations of of magnetic field produced by current $I_c$ in the region 72 where conductor 70 has its terminals, an auxiliary conductor 74 is provided. Conductor 74 is insulated from conductor 70 and merely serves to provide a uniform magnetic field along that edge of lattice area 30 where electrical connections are made to conductor 70.

In FIG. 13B, a plurality of conductors is utilized which are all on the same fabrication level. In this confinement structure, conductors 76A and 76B provide confinement forces for the top and bottom of lattice area 30, while conductors 78A and 78B provide confinement forces exerted on the left hand and right hand sides of lattice 30. Because magnetic discontinuities may exist in the four corners of lattice area 30, magnetic elements 80 are provided to compensate for these discontinuities and to ensure that interactive elements 32 will not be lost from lattice area 30 at the corners of the lattice. Such magnetic elements may include, for example, hard magnetic materials which provide forces to repel interactive elements within the lattice.

In FIG. 13B, the arrows 82 represent possible directions of movement of interactive elements into and out of the lattice area 30.

FIG. 13C shows another conductor confinement means in which two levels of conductors are utilized. For instance, conductors 84A and 84B are located on the first fabrication level while conductors 86A and 86B are located on a second level of fabrication. Generally, an insulating layer is provided between the various conductor levels. As with FIG. 13B, the arrows 82 represent possible directions of movement of the interactive elements into and out of lattice area 30.

FIG. 13D represents another confinement structure which is particularly suited for providing repulsive forces on magnetic interactive elements such as magnetic domains in magnetic medium 62. In this embodiment, current-carrying conductors 88A and 88B provide repulsive confinement forces along the top and bottom edges of lattice area 30. The confinement forces along the left and right hand edges of lattice area 30 are provided by magnetically destroying the properties of the material in which the magnetic interactive elements exist. That is, shaded areas 90A and 90B are areas of material 62 in which the magnetic properties of the material required to sustain magnetic elements have been destroyed. Areas 90A and 90B can extend beyond the conductors 88A and 88B, if desired. This means that the magnetic elements will not drift into areas 90A and 90B, thereby effecting a repelling confinement force. In this structure, the magnetic elements move into and out of lattice area 30 in the directions indicated by arrows 82.

Alteration of magnetic properties in areas 90A and 90B can be provided by techniques such as ion implantation and diffusion. For instance, such a technique would destroy the perpendicular anisotropy of a bubble domain medium where the magnetic elements are magnetic bubble domains. Additionally, the magnetic material can be removed from those areas so that the magnetic elements cannot be sustained there.

In the confinement structures illustrated, there may be slight magnetic discontinuities at the corners of the structures which lead to slight changes in confinement force. However, the interactive elements will adjust their diameters and/or spacing from one another in the area of the confinement corners. These elements later will correct their relative positions and sizes as they move away from the corners.

ATTRACTIVE BOUNDARY:

FIGS. 14A–14D show various structures for providing attractive boundaries for use as confinement means. In these examples, the attractive boundary will hold interactive elements 32 and the held elements will in turn interact with other elements within the lattice to establish a confinement means.

Figure 14A:
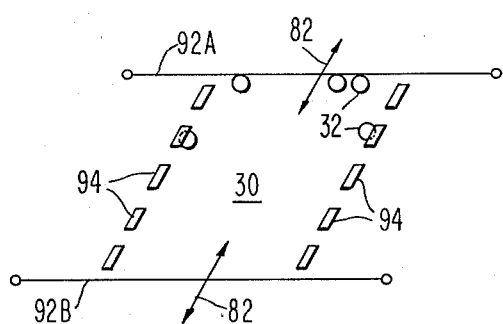
FIGS. 14A-14D illustrate additional structures for confining interactive elements within a lattice array.

For instance, FIG. 14A shows a confinement means which is used to retain interactive elements 32 within the lattice area 30. In this case, the confinement means is comprised of conductors 92A and 92B, as well as magnetic elements 94. Interactive elements 32 can move into and out of the lattice area 30 by movement in the directions indicated by arrows 82. Movement of the elements across the edges defined by magnetic pieces 94 is also possible.

The conductors 92A and 92B have currents therein which establish fields tending to exert forces to hold the interactive elements within lattice array 30, in a manner previously described. The magnetic elements 94 attract interactive elements 32 and hold these elements along the edges of lattice 30 defined by elements 94. The interaction of held elements 32 with other elements within the lattice area serves to confine elements within the lattice.

Of course, it should be understood that elements 94 need not be magnetic if the interactive elements 32 are not magnetic. For instance, in the case of interactive elements 32 having electrostatic fields associated therewith, appropriately charged conductive elements 94 can be used to hold the electrostatic elements 32.

Figure 14B:
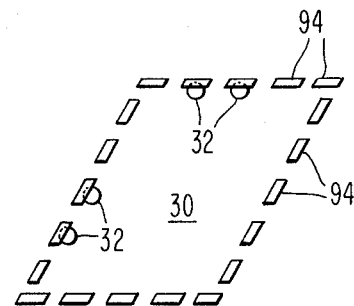

FIG. 14B shows a confinement structure serving as a boundary of the lattice area 30 which is entirely comprised of discrete elements 94. As previously mentioned, these elements are suitably chosen to be magnetic elements if the interactive elements 32 are magnetic elements. In the structure of FIG. 14B, interactive elements 32 can be moved into and out of lattice area 30 in a direction substantially transverse to any of the edges defined by the elements 94.

Figure 14C:
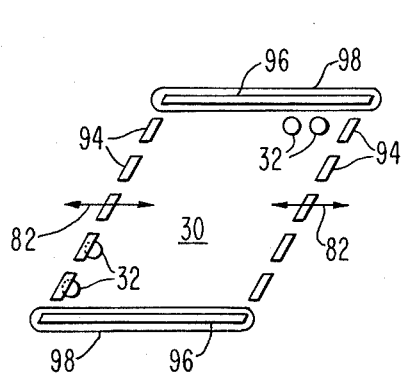

FIG. 14C shows a confinement means using discrete elements 94, as well as continuous elements 96. The discrete elements 94 serve to hold interactive elements 32 in the manner previously described. The continuous elements 96 form an entire edge of the lattice area 30 and are used to hold elongated interactive elements 98. As an example, continuous elements 96 can be magnetic materials and interactive elements 98 can be stripe magnetic domains in a magnetic material which are attracted to the magnetic elements 96. Stripe domains 98 will in turn exert repulsive forces on interactive magnetic domain elements 32 within the lattice, thus providing the confinement function.

In FIG. 14C, magnetic interactive elements are more easily moved into and out of the lattice area across the edges defined by discrete elements 94. Therefore, arrows 82 indicate the preferred direction of movement of interactive elements 32 into and out of lattice area 30.

Figure 14D:
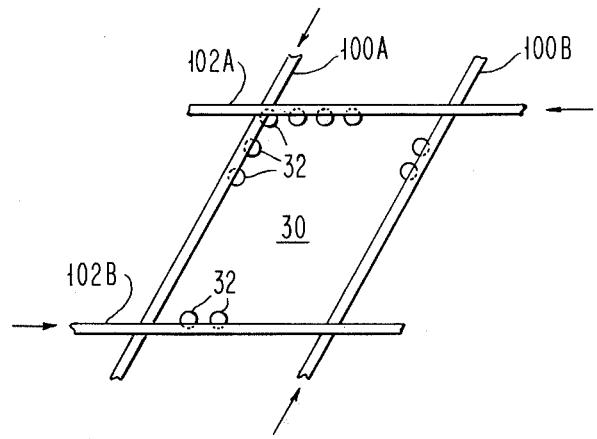

In the structures of FIGS. 14A–14C, as well as that of FIG. 14D, interactive elements 32 which are held by the attractive confinement means can be made to move away from this confinement means when suitable accessing forces are provided to the interactive elements. This will be appreciated more fully when the accessing structures are discussed.

FIG. 14D shows another confinement structure, which in this case uses conductors located on two levels of fabrication, similar to those shown in FIG. 13C. Conductors 100A and 100B are located on the first fabrication level while conductors 102A and 102B are located on the second level of fabrication. Currents in these conductors are used to provide attractive magnetic fields for magnetic interactive elements 32.

Figure 14E:
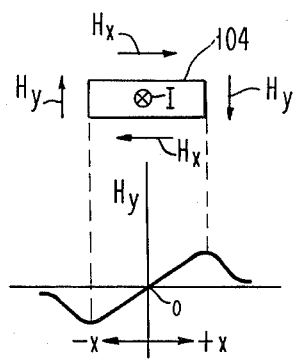
FIG. 14E shows a current-carrying conductor and the magnetic field produced by this conductor as a function of one of the dimensions of the conductor.

FIG. 14E is used to explain the operation of conductor confinement means, such as those shown in FIGS. 13C and 14D. FIG. 14E illustrates a current-carrying conductor 104 having a current I directed into the conductor. This current establishes a magnetic field surrounding the conductor which has components $H_x$ and $H_y$. The component $H_y$ is a component directed substantially normal to the medium in which magnetic elements 32 exist. In the case of bubble domain interactive elements, the component $H_y$ would be directed parallel to an easy direction of magnetization of the magnetic material in which the domains exist (that is, $H_y$ is directed along the direction of magnetization of the bubble domains).

The plot of $H_y$ versus distance $x$ along the conductor illustrates that the component $H_y$ is positive at one side of the conductor and negative at the other. Consequently, a bubble domain located near conductor 104 will experience an attractive force or a repulsive force depending on its location with respect to conductor 104. If the bubble domain experiences a gradient in the field $H_y$, a force will be exerted on the domain tending to move it. Domains will move in the direction of decreasing net bias field.

For instance, if the bubble domains have magnetization directed upwardly (in the direction of + $H_y$) and are located to the right of the positive peak of $H_y$ they will be moved further to the right when the current I flows through conductor 104. If these same domains are located in positions between the positive and negative peaks of the field $H_y$, they will move to the left when current I is present. Further, if these domains are located to the left of the left-hand edge of conductor 104, they will be attracted to the left-hand edge of the conductor when current I flows in conductor 104.

Thus, establishment of proper current direction in conductors 100 and 102 (FIG. 14D) will cause attractive magnetic forces for holding elements 32 along the outside edge of lattice area 30. These pinned outer elements 32 will provide the necessary forces to contain other elements 32 in the interior of lattice area 30.

Figure 15:
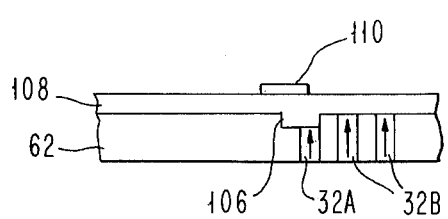
FIG. 15 shows a confinement structure for magnetic bubble domain interactive elements which utilizes a magnetic discontinuity as an aid in confining magnetic bubble domains within the lattice.

Various confinement means have been shown which utilize conductors, magnetic materials, and regions of the supporting medium which have their properties locally altered. These various means can be used together, as is illustrated by FIG. 15. Here, an embodiment particularly suitable for magnetic bubble domains is shown in which the magnetic medium 62 (FIG. 6) has a groove 106 in it. A spacer 108 separates bubble domain medium 62 and the overlying conductor 110 which is used to provide confinement forces. Spacing the conductor from medium 62 provides a more uniform magnetic field distribution. As is apparent, the peripheral domains 32A are magnetically attracted to the groove 106 while the domains 32B within the lattice are further confined by the action of domains 32A. Of course, the groove itself may have sufficient attractive properties to provide the confinement means while the conductor 110 is used to access domains into the lattice from the area of the bubble domain medium 62 to the left of groove 106.

The thickness of the magnetic elements used for attractive boundaries is quite arbitrary; therefore, a magnetic element can be very thick. When magnetic elements are located on a boundary of the lattice across which interactive elements are to be moved, its thickness is chosen such that the attractive force exerted for confinement will not be greater than that which can be overcome by the input means 38 (FIG. 2) used to move elements 32 into and out of the lattice.

UNIFORM BIAS THROUGHOUT THE MAGNETIC MATERIAL

The bias field $H_b$ can be applied uniformly throughout the magnetic bubble domain material. However, it must be remembered that $H_b$ adds to the interaction field $H_i$ within the lattice, so that the net bias field within the lattice will be greater than that outside the lattice. The net bias field within the lattice should not be so great that collapse of bubble domains within the lattice begins to occur. Additionally, $H_b$ should not be so small that bubble domains outside the lattice tend to run into stripe domains. In general, $H_b$ is chosen so that bubble domains outside the lattice are close to run-out width and that operation within the lattice will not cause localized collapse.

Generally, the applied bias $H_b$ is approximately $H_2 + \frac{1}{4}(H_0 - H_2)$, where $H_2$ is the run-out magnetic field, $H_0$ is the collapse magnetic field. For very high density packing in the lattice, $H_b$ is approximately $H_2$ (this allows $H_i$ to be large in the lattice without causing localized collapse of domains).

Having a uniform bias field across the entire bubble domain material is easily acheived with simple structures. In addition, the interaction forces $F_i$ between bubble domains are less when an applied bias field is present. This in turn makes it easier to move domains into/out of the lattice.

Figure 16A:
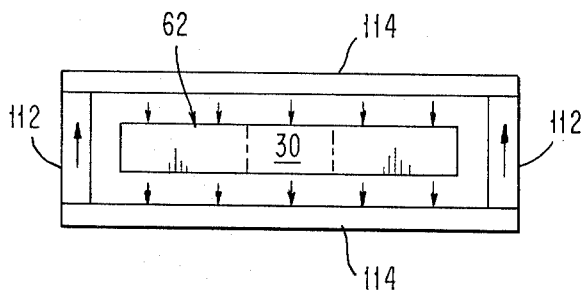
FIGS. 16A-16C show various structures for providing uniform applied bias fields across the entire magnetic sheet in which a lattice array exits.

In FIG. 16A, bubble domain material 62 has located adjacent to it permanent magnets 112 and magnetically soft members 114 (such as permalloy) which extend over the entire area of material 62. Members 114 provide preferred paths for the magnetic flux from magnets 112, and cause the magnetic field lines normal to material 62 to be uniform throughout material 62.

Figure 16B:
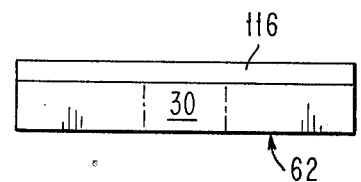

In FIG. 16B, an exchange-coupled layer 116 is in contact with the entire surface of bubble domain material 62. Layer 116 is comprised of a magnetically hard material and acts to provide a uniform bias field over the material 62. Use of exchange coupled layers as bias layers is described in U.S. Pat. No. 3,529,303. As an example, $SmCo_5$ is a suitable exchange-coupled layer on orthoferrite materials. When the bubble domain material is a garnet film, a spun garnet film can be used as an exchange-coupled layer. For instance, spun $Gd_3Fe_5O_{12}$ can be used as a exchange-coupled material on $(EuY)_3(GaFe)_5O_{12}$ bubble domain films.

Figure 16C:
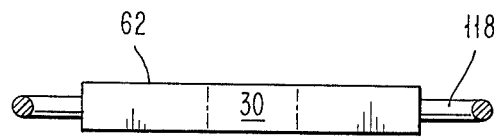

In FIG. 16C a current-carrying coil 118 surrounds the bubble domain material 62. As is well-known, this coil produces a uniform magnetic bias field across material 62.

These bias structures can be used in various combinations and can be used with the means shown previously for confining domains within the lattice area 30.

MAGNETIC BIAS INSIDE AND OUTSIDE LATTICE AREA

As stated earlier, various magnetic bias conditions can be utilized when the interactive elements 32 are magnetic bubble domains. The applied bias field $H_b$ can be zero or a small value within the lattice (including even negative values), while outside the lattice the applied bias field is adjusted to prevent bubbles from running out into stripe domains. Generally, the bias field outside the lattice area need only be present where it is desired to perform system functions, such as writing, reading, etc. Various structures may be employed to obtain greater applied bias fields outside the lattice area 30 than within the lattice area. Interacting bubble domains within the lattice tend to bias one another to provide stability.

Figure 17A:
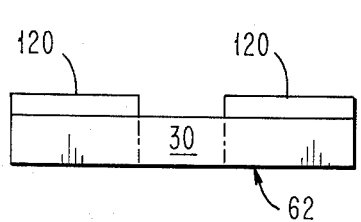
FIGS. 17A-17B show structures for providing magnetic bias fields having different amplitudes within the lattice array and outside the lattice array.
Figure 17B:
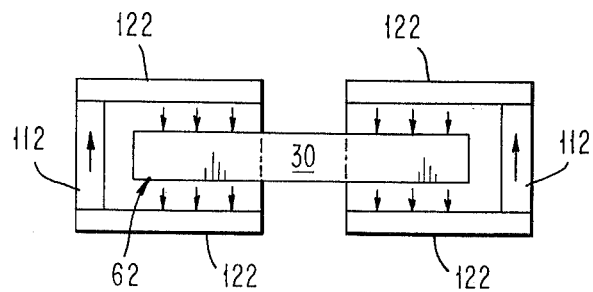

FIGS. 17A and 17B show structures for suitably providing magnetic bias fields outside the lattice. In FIG. 17A, the bubble domain medium 62 has located thereon exchange-coupled layers 120 which are comprised of magnetically hard material. Thus, layers 120 act as permanent magnets to provide bias in the regions of bubble domain material 62 outside of lattice area 30, in the same manner as previously described with respect to FIG. 16B.

Another suitable structure for providing magnetic bias outside the lattice is shown in FIG. 17B. The bubble domain material 62 has permanent magnets 112 located around it. Additionally, magnetically soft members 122 (such as permalloy) are used to provide preferred paths for the magnetic flux from magnets 112. Members 122 extend to the area 30 where the lattice is located, so that an applied bias field $H_b$ exists outside the lattice but not within it. Of course, there may be some gradient of field $H_b$ within portions of the lattice area, but this gradient can be utilized in the design of confinement structures as was indicated earlier. Also, if the field $H_b$ extends somewhat into lattice area 30, the lattice constant $a_0$ will not change greatly if the gradient is not steep.

In addition to the use of exchange-coupled layers and permanent magnets, current-carrying conductors can be used to provide the field $H_b$ outside the lattice area. Design of useful conductor patterns for this purpose is known to those of skill in the art.

ACCESSING ELEMENTS WITHIN THE LATTICE

As explained previously with reference to FIGS. 10A and 10B, interactive elements 32 are generally (but not necessarily) moved into and out of the lattice area in amounts corresponding to full rows or columns. Of course, for a lattice comprising a single row or column of interactive elements, only a single element need be moved into and out of the lattice at any one time.

The force required to move an interactive element into the lattice area is that which overcomes the repulsive force of interactive elements within the lattice. If there are no elements within the lattice those elements entered into the lattice will spread out in order to minimize the energy of the lattice. Consequently, interactive elements are continually loaded into the lattice until a number is reached which will provide a regular lattice having a given lattice spacing $a_0$. For instance, $m$ columns having $n$ elements in a column may be placed in the lattice. After this, the lattice can be perturbed by further input elements in order to remove any dislocations or vacancies from the initially formed lattice. That is, after the lattice is intially formed, new rows or columns of interactive elements are entered into the lattice and a corresponding number removed from the lattice. This ensures that all dislocations and vacancies will have translated through the lattice area and will be removed. This operation may take one or more cycles in which the lattice is totally recycled.

An alternate technique for achieving an initial lattice of magnetic bubble domains is to first apply a large in-plane magnetic field to saturate the magnetic medium. After this, the magnetic field is released to obtain a dense random array of bubble domains. The lattice is then magnetically annealed by a time modulated magnetic field normal to the bubble domain material to obtain a regular lattice.

Another technique for providing an initial lattice generates bubble domains at selected locations in a magnetic sheet. For instance, a permanent magnet having a pattern of apertures in it can be brought into close proximity to the magnetic sheet, after the sheet has been heated to above its Curie temperature $T_c$. This will cause nucleation of bubble domains in the magnetic sheet at locations corresponding to the pattern in the permanent magnet.

Still another technique for providing an initial lattice involves cutting of stripe domains. A pattern of stripe domains is produced by a magnetic field in the plane of the magnetic sheet. The stripe domains are then cut to provide rows of bubble domains. The cutting device is any device which produces a magnetic field of sufficient amplitude in a direction substantially normal to the magnetic sheet. As an example, a recording head can be moved across the stripe pattern in sequential fashion to cut the stripes thereby producing rows of bubble domains.

The force required to enter elements into the lattice or to remove elements from the lattice is a force which overcomes the energy barrier between the lattice and the region outside the lattice. This force depends on the amount of separation between elements inside and outside of the lattice and is chosen so as not to materially disturb the lattice properties. That is, the input and output operations elastically deform the lattice but the amount of deformation is sufficiently small that the lattice can relax to its initial uniformity when the force is removed.

In the case of magnetic bubble domains, the gradient in magnetic field used to provide the input force on the domains to be injected is properly chosen so that these domains will not be collapsed before they can be moved into the lattice. Additionally, domains within the lattice may experience forces due to the input operation and these domains also should not be collapsed by this operation. It must be remembered that the domains within the lattice are subjected to the applied bias field $H_b$ and the interaction field $H_i$; therefore, an additional term due to the magnetic field used to access domains must not create forces on domains already in the lattice greater than those forces which would collapse them.

In general, $$H_b + \Delta H_d + H_i < H_o \tag{2}$$

where
$H_b$ is the applied bias field,
$\Delta H_d$ is the drive magnetic field for accessing domains into and out of the lattice area,
$H_i$ is the interaction field existing between bubble domains, and
$H_o$ is the collapse magnetic field for the bubble domains.

Transposing terms, $$\Delta H_d < H_o - H_b - H_i. \tag{3}$$

From these equations, it is apparent why it is desirable to operate close to run-out when isolated bubble domains are used outside the lattice area.

Removing interactive elements from the lattice area is similar to the input operation where elements are moved into the lattice area. Basically, the operation is the reverse of the input operation and elements within the lattice are moved over the energy barrier which confines the lattice.

For domains within the lattice, the total z-field $h_t$ acting on them must be greater than run-out and less than that which would cause collapse. The driving force to move domains is the gradient in z-field across the bubble domains. The force must be sufficient to overcome coercivity effects. The total z-field $H_t$ is given by $$H_t = H_b + H_d + H_i \tag{4}$$

where
$H_b$ = applied field
$H_d$ = drive field
$H_i$ = interaction field

If $x$ is a distance measured along the direction of motion of a domain and $d$ is the domain diameter, then the driving force on a bubble domain is $$d\left(\frac{\delta H_t}{\delta x}\right) > \frac{8}{\pi} H_c$$

in order to be able to move the domain. With a uniform field $$H_b \frac{\delta H_b}{\delta x} = 0.$$

The derivative $$\frac{\delta H_i}{\delta x}$$

always produces forces tending to push bubble domains out of the lattice. Hence $$\frac{\delta H_i}{\delta x}$$

aids in removal of bubble domains from the lattice and hinders injection of bubble domains into the lattice.

As will be more fully apparent, the same kind of structures can be used to move interactive elements into the lattice and to remove interactive elements from the lattice. Although it may be preferred to provide structure for pushing elements into the lattice and other structures for pulling elements out of the lattice, such push-pull operation is not the only mode of operation which can be used. The timing of these two operations is not critical and they need not occur simultaneously. However, the input and output operations can be suitably accomplished at the same time.

When a reasonably large lattice is used, an extra column or row of interactive elements can be accommodated in the lattice. However, if the lattice constant between columns or rows changes by greater than about 10%, some perturbation of the positions of the interactive elements within the lattice may occur which may be troublesome in a practical operation. As long as the lattice constant does not change appreciably, timing of the input and output operations is not critical. The timing is generally a function of the size of the lattice and the elasticity of movement of interactive elements within the lattice. It should be remembered that only one lattice shift (either a column or a row) occurs for many time cycles of movement of the elements by the propagation structure outside the lattice area. Consequently, the speed of movement of elements within the lattice does not have to be fast.

Depending upon the size of the lattice, coercivity, etc., it may be possible to insert a row or column of interactive elements into the lattice and have the disturbance thereby produced transmitted through the lattice to eject an output row or column of interactive elements from the lattice. The size of a lattice through which sufficient forces can be transmitted to cause a group of elements within the lattice to be ejected from the lattice is limited by damping processes and terms such as the coercivity of the material (if magnetic domains are used). The force required to overcome damping should not be so great as to cause collapse of magnetic interactive elements along the input edge of the lattice array.

Due to damping and the other quantities mentioned, the force propagated in the lattice when interactive elements are entered into the lattice may decrease with distance into the lattice array. When the input force has diminished such that it is less than the coercive term in equation 1, the next column of elements in the lattice will not be moved since the remaining force cannot overcome coercivity tending to prevent movement of these elements. The energy will then be stored in a distortion of the lattice.

To estimate the number of rows $n$ which can be moved by the input force, consider that the gradient required to overcome the coercivity of a simple isolated bubble is $H_c/d$, where $d$ is the bubble diameter.

Now, suppose that this bubble interacts with $(n-1)$ other bubbles, all in a linear chain, in such a way that they all move simultaneously. If the field gradient $$\frac{\delta H}{\delta x}$$

is applied only to the first bubble in the chain, its value must be $$\frac{dH}{dx} = n H_c/d.$$

However, the total difference in H across the bubble domain diameter cannot exceed $(H_0 - H_2)$ where $H_o$ is the collapse field and $H_2$ is the run-out field. Therefore:

$$\frac{dH}{dx} \simeq \frac{H_o - H_2}{d} = \frac{nH_c}{d}$$

Hence $$n \simeq (H_o - H_2)/H_c$$

FIG. 18 shows an end view of a structure suitable for confining interactive elements within the lattice and for moving interactive elements into the lattice area. In this drawing, the interactive elements 32 are illustratively magnetic bubble domains, although other types of interactive elements could be used as well. Additionally, the structure shown here can be used to remove domains from a lattice by reversing the operation to be described.

In more detail, the magnetic bubble domain material 62 has on one surface thereof a spacing layer 124 (such as an insulator) over which is located conductors 126 and 128. The spacer is used to make the field from conductors 126 and 128 more uniform, and may not be essential for operation. Current in conductor 126 establishes a confinement force for magnetic bubble domains within the lattice, as described previously. Additionally, it is to be a portion of the input means 38 (FIG. 6) used to inject bubble domains into the lattice array. In this drawing, the lattice 30 comprises an area of the magnetic medium 62 to the left of conductor 126. FIGS. 19A – 19E show the operation of input means 38 for moving magnetic bubble domains 32 into the lattice. From these drawings, it will be readily apparent that reversal of current polarities in conductors 126 and 128 will move bubble domains 32 in the opposite direction, thereby achieving the output operation from the lattice array 30. Since FIG. 18 and FIGS. 19A – 19E are views which are rotated with reference to each other, movement of domains 32 upwardly in FIGS. 19A – 19E corresponds to movement of domains into the lattice area.

In FIG. 18, and FIGS. 19A – 19E, the domains which are within the lattice area are numbered 32A, while domains which are going to be moved into the lattice area are labeled 32B and 32C. Still further, it should be recognized that a plurality of domains can be entered into the lattice area at the same time or removed from the lattice area at the same time. For instance, FIG. 19A shows domains 32A and 32A' which are in the lattice and domains 32B, 32B' which move in unison. Domains 32C and 32C' also move in unison. The second column of domains (32A', 32B', 32C') is not shown in FIGS. 19B – 19E, for ease of illustration. The current pulses in conductors 126 and 128 are indicated as $I_1$ and $I_2$, respectively, and the direction of movement of the domains is indicated by arrow 130. For ease of illustration, the column of domains 32A', 32B', and 32C' are not shown in FIGS. 19B – 19E.

To aid in understanding the movement of domains as illustrated in FIGS. 19A – 19E, reference is made to FIG. 14E, and the descriptive matter concerning that figure. Currents in the conductors 126 and 128 will produce magnetic field gradients acting on the domains which will move the domains in desired directions. Additionally, the domains may exert interaction forces on one another which also aid movement in desired directions.

FIG. 19A illustrates the positions of domains 32A, 32B, and 32C at time T = 0 when currents $I_1$ and $I_2$ are present in conductors 126, 128 respectively. At this time, domain 32A is stationed at the left hand (upper) edge of conductor 126 in a position bordering the domains in the lattice area. At time T = 1, currents $I_1$ and $I_2$ exist in conductors 126 and 128, respectively. These currents cause a combined magnetic field between the conductors causing domain 32B to center between the conductors. The movement of domain 32B exerts a repulsive force on 32A, causing it to move into the gradient field outside (above) conductor 126. This gradient field causes domain 32A to move further into the lattice.

At time T = 2 (FIG. 19C) the current $I_2$ reverses and domain 32C moves upwardly due to an attractive gradient field produced by current $I_2$ in conductor 128. This creates an interaction force on 32B, causing it to move partially under conductor 126. At the same time, domain 32A moves further into the lattice area due to the gradient field produced by current $I_1$ in conductor 126.

FIG. 19D shows the position of the interactive elements at time T = 3. The direction of current $I_1$ has reversed, creating an attractive gradient magnetic field for domain 32B. When domain 32C moves further under conductor 128 due to a repulsive force from the domain following it (not shown), it causes domain 32B to move into the attractive gradient caused by current $I_1$ in conductor 126. Hence 32B moves under conductor 126 to a position centered on the top edge of this conductor (FIG. 19D).

FIG. 19E illustrates the position of the interactive elements 32 at time T = 4. The direction of current $I_2$ has again reversed and current $I_1$ is in the same direction. Interactive element 32C now experiences an attractive force pulling it in the direction of arrow 130 and moves to a position under the top edge of conductor 128. Interactive elements 32B and 32C do not experience a push element 32C or a gradient magnetic field so they remain approximately in their same positions. These are the positions corresponding to elements 32A and 32B of FIGS. 18 and 19A. That is, the situation at time T = 0 is once again obtained. During the next cycle of operation, an additional row of domains will be entered into the lattice area, in the same manner.

An example of the accessing operation described with respect to FIGS. 18 and 19A – 19E is the following: Bubble domains of diameter $d$ can be used as interactive elements 32 for movement into a lattice area by conductors having a width of about $a_0/2$, center to center spacing of about $a_0$, and a thickness of about $\frac{1}{2}$–1 micron. The current amplitudes in these conductors can be about 30–50 milliamps and the pulse duration of these currents can be about 0.5 microseconds. These magnitudes provide magnetic fields which are sufficient to overcome the coercivity of the bubble domain medium.

FIG. 20 shows another structure suitable as an input means 38 for magnetic bubble domains used as interactive elements 32 in lattice array 30.

The magnetic bubble domain sheet 62 has a coating of insulation 124 thereon, over which is located conductors 126 and 128. The magnetic medium 62 has a groove 132 which serves as the confinement means for the magnetic domains 32 within lattice area 30. Consequently, domains moving into and out of the lattice area 30 pass under the groove 132 and have reduced height while under the groove. The groove can be a physical groove in the surface of the material 62 or can be a magnetically altered region of material 162. As mentioned, this can be achieved by techniques such as ion implantation and diffusion.

The operation of input means 38 in FIG. 20 is the same as that illustrated by FIGS. 18 and 19A - 19E. That is, suitably directed currents in conductors 126 and 128 cause domains 32' to be moved into lattice area 30. If these current sequences are reversed in polarity, domains 32 within lattice 30 will be moved to the right, out of the lattice area.

FIG. 21 shows a structure which was used to move magnetic bubble domains 32 into and out of a lattice area 30, thereby illustrating the principle of access of elements to and from a lattice. The lattice area 30 is illustratively a regular lattice bounded by confinement means 34, which in this case is a conductor having currents flowing in the directions indicated. Bubble domains 32 were moved in rows into and out of the lattice with the same relative positions, thereby assuring the preservation of information by the system, and further demonstrating the principles of lattice operation.

Three conductors A, B, and C are located at the top of the lattice while corresponding conductors A', B' and C' are located at the bottom of lattice 30. The channel between conductors A and B is shaded to indicate that this channel is a shift register for movement of domains along the channel prior to their entry into the lattice area or exit from the lattice area. In the same manner, the channel between conductors A' and B' defines a shift register in which the bubble domains can be moved before or after accessing into or out of the lattice 30.

FIGS. 22A – 22G illustrate the operations of injecting a bubble domain into lattice 30 and removing a bubble domain from the lattice 30. A plurality of time cycles T = 1, 2, ..., 7 is shown in which the current directions in the conductors A, B, C, A', B', and C' are indicated by the arrows on the conductors.

For instance, at time T = 1 (FIG. 22A) the bubble domain 32 is to be injected into lattice 30 while the bubble domain 32' is to be removed from lattice 30. Currents exist in conductors A and B in the direction indicated by the arrows. Additionally, currents exist in conductors A' and C'.

At time T= 2 (FIG. 22B) a current is present in conductor C and also in conductor A. This causes bubble domain 32 to move to the edge of conductor C. During time T = 2, currents exist in conductors A' and C'. Thus, bubble domain 32' moves to the bottom edge of conductor C'.

FIGS. 22C and 22D show the next sequence of pulses in the conductors. These pulses create magnetic fields which move bubble domain 32 into the lattice and bubble domain 32' out of the lattice into the shift register area between conductors A' and B'. Thus, FIGS. 22A – 22D illustrate the injection of a bubble domain into lattice area 30 and the ejection of bubble domain 32' from the lattice area 30.

FIGS. 22E – 22G, together with FIG. 22D, illustrate the reverse operation of the structure of FIG. 21. In these figures, bubble domain 32 is to be moved from a position within the lattice to the shift register area between conductors A and B. Also, bubble domain 32' is to be moved from the shift register area between conductors A' and B' to a position within the lattice 30. Operation in the time period T = 4 to T = 7 inclusive is shown in these figures and is readily understood from the previous discussion.

The discussion of FIGS. 21 and 22A – 22G has assumed that the interactive elements 32 are magnetic bubble domains. However, this structure can be used on any type of interactive elements and illustrates the movement of such elements into and out of the lattice area 30. In the particular case where the interactive elements 32 are magnetic bubble domains, operation of the structure of FIG. 21 has been demonstrated. For instance, the operation denoted in FIGS. 22A – 22G was demonstrated using as a garnet magnetic bubble domain film $Y_{2.35}Eu_{0.65}Ga_{1.08}Fe_{3.92}O_{12}$, which was grown by liquid phase epitaxy on a suitable garnet substrate. The bubble domain garnet had a thickness of 4.8 microns and the bubble domain diameter was about 5 microns. A uniform bias field $H_z$ of approximately 80 Oe existed over the entire garnet film. The conductors A, B, C, A', B', and C' were 4 microns wide and 1.5 microns thick. A current of 20 milliamps flowed through the confinement means 34. The amplitude of currents flowing in the transfer conductors A, B, C, A', B', and C' were as follows:

Current in conductors B, C, B', C' had amplitudes of 50 milliamps.

Current in conductors A and A' had amplitudes of 25 milliamps. The bubble domain magnetization was directed upwardly out of the paper in the illustrated operation. Additionally, the dimensions of the lattice array and spacing between conductors for this operation are noted in FIG. 21.

The pulse durations for movement of the domains are not critical, and depend on how fast domains will move in the bubble domain material. For instance, pulses of duration about 0.3 microseconds or greater are suitable for many rare-earth iron garnet materials.

As mentioned, coercive force exists in bubble domain materials tending to resist movement of magnetic domains. Various techniques exist for overcoming the coercive effects within the material to provide more mobile magnetic bubble domains. In particular, this will increase the value of $n$ (number of bubble doamins which are moved by an input force) which was derived previously. FIGS. 23 and 24 illustrate techniques which can be used to aid the movement of magnetic bubble domains.

In FIG. 23, the magnetic bubble domain medium 62 is surrounded by a current-carrying coil 134. Current pulses are produced in coil 134 which provide an ac bias field substantially parallel to an easy direction of magnetization in magnetic medium 62. If desired, pulsed dc or rectified ac current pulses can be applied to coil 134. These current pulses in coil 134 produce a magnetic field which tends to oscillate magnetic domains in material 62 without collapsing them. Oscillation of these domains enables them to go into a minimum energy configuration which is the regular lattice previously defined.

The oscillating bias field is a field approximately equal to the coercive force term in force equation 1 previously discussed. That is, the force exerted on the bubble domains by the oscillating field is sufficient to overcome coercivity to cause a small oscillation in bubble domain diameter. An oscillating field of amplitude about equal to $H_c$ is sufficient. The ac bias field is generally designed to be uniform across the lattice area.

FIG. 24 shows another technique for facilitating movement of magnetic bubble domains in magnetic material 62. In particular, this means is suitable for aiding movement of magnetic bubble domains in the lattice area 30.

In more detail, a lattice "sweeper" is comprised of a conductor, such as 136 and/or 138, whose width is generally at least as great as the bubble domain diameter and up to several bubble diameters. Current $I_s$ through these conductors will create magnetic fields which aid the movement of interactive elements 32 in magnetic medium 62. The magnetic fields established by current $I_s$ serve to break up the lattice area into smaller portions so that the elements in those portions will move more easily. The maximum magnetic field produced by conductors 136 and 138 should not be great enough to cause collapse of any of the domains in the lattice. A magnetic field approximately equal to the magnetic field used for providing the injection forces to move domains into the lattice is sufficient. In general, the limits on the magnetic fields produced by conductors 136 and 138 is the same as the limits previously expressed. That is, the magnetic fields produced by these conductors preferably should not lead to serious perturbations in the lattice (in order to retain information in correct positions) or to collapse of any domains within the lattice).

The discussion concerning access of information to and from the lattice area is general for any type of interactive element 32. When considerations of bias field are discussed in terms of changing diameter size, the discussion is directed to magnetic bubble domain interactive elements. However, the principles directed to the forces required to move interactive elements and the structures provided for so moving these elements can be utilized with other types of interactive elements, as will be more particularly apparent later. For instance, a lattice sweeper as shown in FIG. 24 can be used with any type of magnetic interactive elements, and can be modified for use with other types of interactive elements.

TRANSFER:ISOLATED ELEMENTS--INTERACTING ELEMENTS

This section will be particularly concerned with movement of interactive elements into and out of the lattice in a manner which takes into account the change in interactive force between the elements. In particular, problems associated with bubble domain interactive elements will be discussed. For instance, operations on bubble domains outside of the lattice area may require that the bubbles be isolated, i.e., isolated in the sense that interactions between the bubbles do not materially affect their positions with respect to one another. In contrast with this, bubble domains within the lattice have positions determined substantially by the interactive forces existing between them.

Another related problem where bubble domains are the interactive elements within the lattice concerns the bias field which is exerted on the bubble domains. As mentioned previously, outside of the lattice the applied bias $H_b$ generally increases to support isolated bubbles while in the lattice the applied bias is minimal since there is an interactive magnetic field bias $H_i$ due to the bubbles themselves. Of course, a uniform applied bias field can be applied over the entire magnetic medium. Additionally, the magnitude of the applied bias field $H_b$ can be greater outside the lattice area than within the lattice area such that the net bias field $H_z = H_b + H_i$ is approximately uniform over the entire magnetic material.

Figure 25:
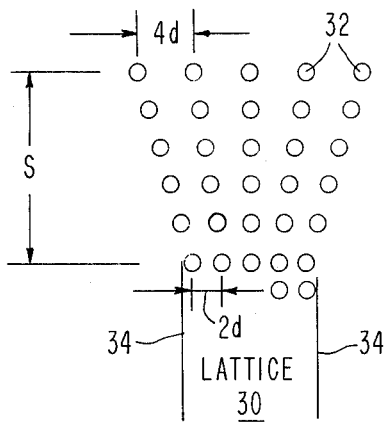
FIG. 25 illustrates schematically the movement of interactive elements into and out of a lattice array using geometric fan-in and fan-out techniques.
Figure 26:
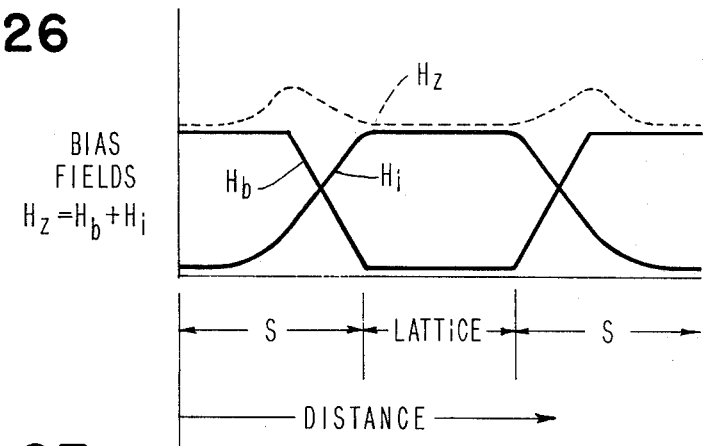
FIG. 26 is a plot of the various bias fields which can be used in the technique of FIG. 25, when the interactive elements are magnetic bubble domains.

Various structures can be provided to move the interactive elements from positions where they are essentially isolated to positions where they interact strongly. FIGS. 25 and 26 illustrate one particular structure which utilizes geometric fan-in and fan-out. These structures will be explained particularly with respect to bubble domain interactive elements, but it should be understood that other types of interactive elements can be brought into the lattice area and removed from the lattice area using the same basic structure.

FIG. 25 illustrates the principle involved. The interactive elements 32 are spaced at a distance $4d$ when they are isolated from one another. These interactive elements are to be brought to lattice area 30 where their spacing is going to be approximately $2d$. The total amount of force which is required to bring the elements 32 from positions where they are isolated to positions within the lattice is approximately the amount of the force required to overcome the barrier forces when providing input and output of elements from the lattice. However, the transition from isolated positions to interactive positions occurs over a length of space S so the change is more gradual and the holding forces on the interactive elements as they move through the distance S are only fractions of the amounts needed to move the elements into the lattice area. This distance S is arbitrary and is determined merely by the smoothness of the transition desired.

If bubble domains are the interactive elements, their size will change as they move toward the lattice 30 unless the net bias field $H_z$ remains relatively constant as they move toward the lattice area. FIG. 26 shows the magnetic fields which approximate this. The applied bias field $H_b$ decreases as the bubble domains get closer to the lattice area. This compensates for the increase in interactive magnetic bias field $H_i$, caused by the bubble domains getting closer together as they move toward the lattice. If desired, an applied bias field $H_b$ in the area outside the lattice can be provided as long as the net bias field on the domains is not sufficiently great to cause collapse of any of the domains. Also, the bias field should be great enough that run-out of domains will not occur when the domains have maximum spacing from one another (isolated domains).

As stated previously, various structures can be used to provide a field $H_b$ outside the lattice area. One structure is comprised of permanent magnets and magnetically soft elements, where the distance of the soft elements from the bubble domain material becomes greater as the lattice area 30 is approached. Another suitable structure can utilize a permanent magnet of variable thickness. Still another structure can utilize conductors which follow the directions of the domains toward the lattice, as will be described with respect to FIG. 27.

These principles apply to any type of interactive elements 32. As the elements approach the lattice area, they get closer together and their interactive forces increase. Therefore, structure must be provided to confine them within the restricted area as they move toward the lattice. This barrier force is similar to the barrier force which is exerted in order to retain the lattice, as explained previously.

Ideally, the diameter of the magnetic bubble domain interactive elements is such that collapse and run-out do not occur throughout the magnetic medium. FIG. 26 shows a bias field which achieves this. The applied bias field $H_b$ is large outside the lattice area and small within the lattice area, while the interactive bias field $H_i$ is small outside the lattice area but large within the lattice area. The combination of $H_b$ and $H_i$ is therefore within the range of acceptable values over the entire magnetic medium.

Figure 27:
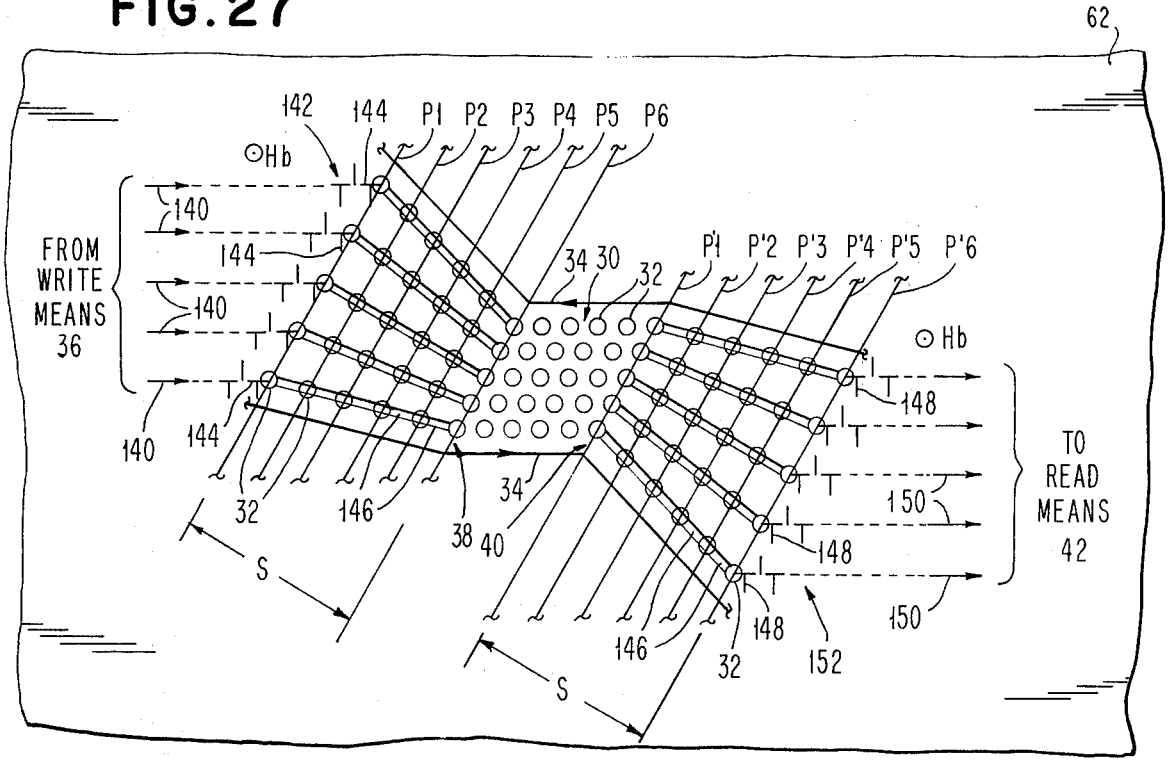
FIG. 27 is a structure which accomplishes the fan-in and fan-out of interactive elements into/from a lattice array according to the technique conceptually illustrated in FIG. 25.

FIG. 27 shows a structure for moving interactive elements from a write means 36 into a lattice area 30 and out of the lattice 30 to a read means 42. The input means 38 and output means 40 utilize conductor patterns and can for instance be the structures described in the previous section.

In more detail, geometric fan-in and fan-out are provided in which interactive elements 32 move from the left into the lattice area 30 and then to the right to the read means 42. Interactive elements 32 move from the write means 36 in the direction of arrows 140, using propagation structure illustratively shown as T and I bars 142. If these are bubble domains, they will be isolated domains in this region and an applied bias field $H_b$ is provided. Propagation using structure such as 142 is well known in the art and a rotating in-plane magnetic field will be provided.

Domains 32 which arrive at the right-most pole position of T bars 144 are separated by a distance $4d$ and are now ready to be moved gradually closer together to provide access to the lattice area 30. The structure for achieving this is conveniently a plurality of propagation conductors P1, P2, P3, P4, P5, and P6. Conductor P6 can also be part of the confinement means for the lattice array and part of the input means 38 for moving elements 32 into the lattice area 30. These structures and their operation have been previously described. The propagation structure also comprises means 146 for maintaining the paths of the interactive elements as they move toward the lattice area 30. In the case of magnetic bubble domains, means 146 is conveniently provided by grooves in the magnetic material, or ion implanted regions which provide selective channels for movement of the bubble domains as they proceed to the lattice area.

A confinement structure 34 is used to maintain the shape of the lattice array 30 and also to provide barrier forces along the fan-in and fan-out portions. Conveniently, means 34 is provided by conductors carrying currents in the direction indicated by the arrows on the conductors.

Propagation of interactive elements to the lattice area occurs by providing sequential current pulses in the conductors P1-P6. Movement of the elements occurs identically as illustrated in FIGS. 19A-19E. The channel means 146 ensures that the interactive elements will stay on the appropriate path as they get closer to the lattice, rather than separating in order to balance the increasing interactive forces as they move toward the lattice. However, the confinement forces provided by currents in conductors 34 can also maintain the relative positions of the interactive elements without need for means 146. In this case, currents in the conductors P1-P6 prevent the domains from moving away from the lattice area and, coupled with the forces provided by currents in conductors 34, will move the domains from isolated positions (spacing = $4d$) to interactive positions (spacing = $2d$) at the input area of the lattice. At this time, the input means 38 is operative to insert a column of elements 32 into the lattice area in the manner previously explained.

Output from the lattice is provided in a manner entirely similar to the input operation. The output means 40 is as illustrated previously and the conductors utilized to take elements 32 from the lattice area to positions where they are isolated are designated P'1, P'2, P'3, P'4, P'5, and P'6. Again, means 146 can be used to channel the elements 42 as they move away from the lattice 30.

When elements 32 reach the left-hand pole positions of the T bars 148, they are separated by a distance of approximately 4d and can then be propagated to the right in the direction of arrows 150, using the propagation structure 152, shown here as being comprised of T and I bar elements.

Elements 32 which are moved by propagation means 152 can be brought to a read means 42 for determination of their properties, in the case where the elements have information associated with them. Additionally, the elements can be utilized for other purposes, depending upon the application to which the lattice structure is to be applied.

As is the case with the input side of the lattice, an applied bias field $H_b$ is used when the interactive elements are magnetic bubble domains. The same considerations apply as were discussed previously.

Figure 28:
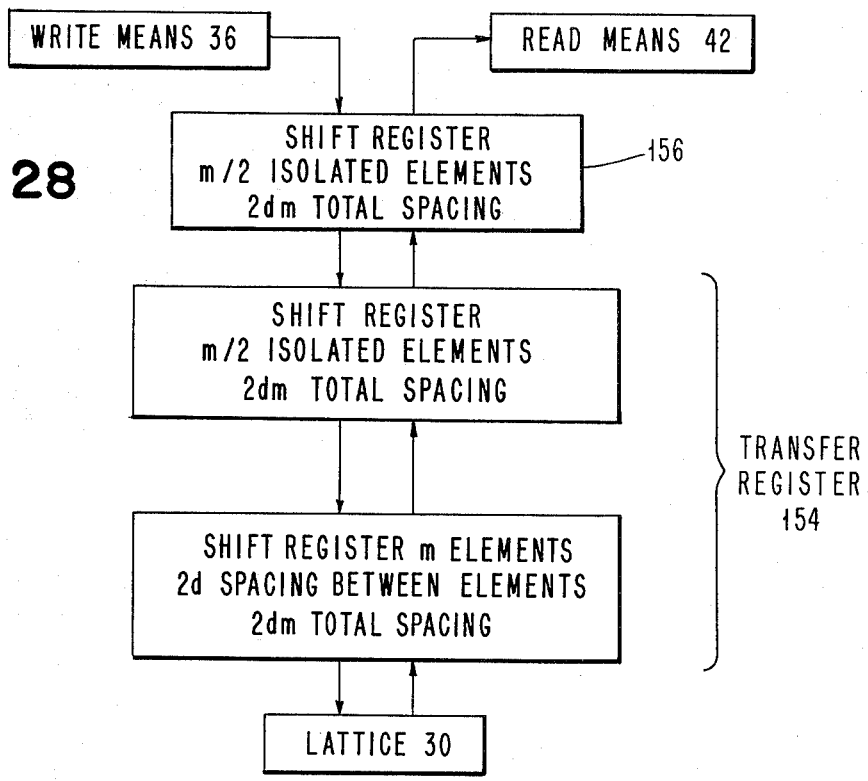
FIG. 28 is a block diagram of another structure for moving interactive elements into and out of a lattice array.
Figure 29:
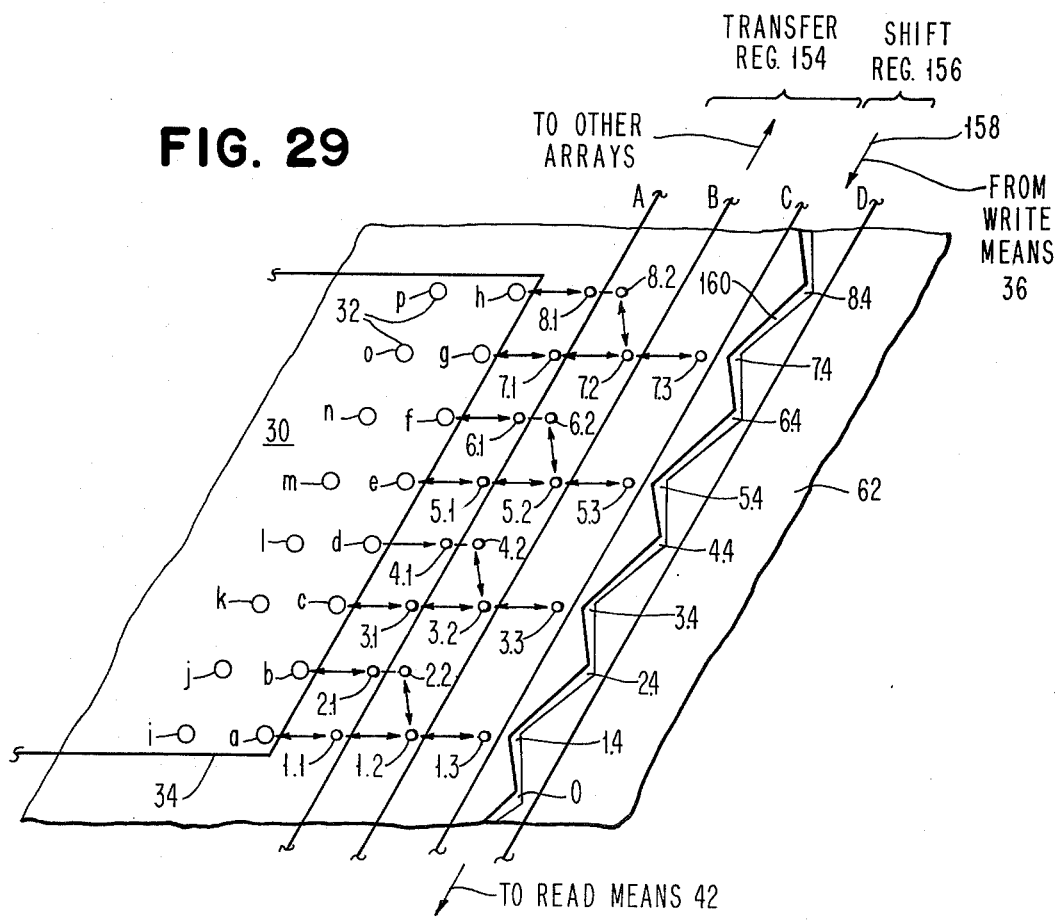
FIG. 29 is a detailed diagram of the structure shown in block diagram form in FIG. 28.

Another structure for moving interactive elements from the lattice area 30 to the read means 42, or from write means 36 to the lattice area 30 is shown schematically in FIG. 28 and in detail in FIG. 29. FIGS. 30 and 31 show the applied current sequence in the conductors of FIG. 29 used to move the interactive elements, while FIG. 31 shows the positions of the interactive elements (for instance, bubble domains) at times corresponding to the application of different current pulses in the applied sequence of current pulses.

Referring more particularly to FIG. 28, a block diagram is shown which illustrates the reversible mode of operation of the structure of FIG. 29. The structure basically comprises the lattice 30, a transfer register 154, a shift register 156, and the write means 36 and read means 42. Information can flow from the write means 36 to register 156 then to transfer register 154 before entering the lattice 30. In addition, interactive elements 32 can move from the lattice 30 to the transfer register 154, and then to the shift register 156 for movement to read means 42. Thus, depending upon the sequence of applied current pulses in the registers 154 and 156 bidirectional movement of elements 32 is obtained.

Shift register 156 is a register comprised of $m$ bit positions where the register is loaded with $m/2$ interactive elements. These are isolated elements where the interactions between elements are minimal. The spacing between elements is illustratively 4d, and the total spacing is 2dm, although other spacings can be utilized.

The transfer register 154 is a two stage structure which links the shift register 156 and the lattice 30. In the stage closest to the lattice, it contains $m$ elements with 2d spacing between elements, while in the second stage it contains $m/2$ isolated elements with 4d spacing between elements. The shift register 156 contains $m/2$ isolated elements, having 4d spacing between them. That is, alternate bit positions are filled by the elements in register 156.

FIG. 29 illustrates the structure of the transfer register 154 and shift register 156. In the example used to illustrate operation of this structure, it will be assumed that the interactive elements 32 are magnetic bubble domains. However, it should be recognized that other interactive elements can be utilized. The lattice 30 contains interactive elements 32 included within the confinement means 34. The bubble domains in the lattice are indicated by the lower case letters $a, b, c, \ldots n, o, p$. The transfer register 154 is comprised of a plurality of conductors A, B, C, and D, together with bubble domain defining positions (permalloy dots) indicated as 1.1, 1.2, 1.3, 2.1, 2.2, 3.1, 3.2, 3.3, 4.1, 4.2, 5.1, 5.2, 5.3, 6.1, 6.2, 7.1, 7.2, 7.3, and 8.1, 8.2. These permalloy dots could be replaced by grooves or by ion implanted regions in the magnetic material 62. Their only function is to provide preferred locations for defining the paths that the domains follow in going from the lattice 30 or to the lattice 30. The paths taken by bubble domains in shift register 154 are indicated by the double headed arrows in this register. These arrows represent that the bubble domains can be taken from the lattice or sent to the lattice along the same paths.

Shift register 156 has a preferred path for domain movement which is in the direction indicated by arrow 158. Movement of bubble domains in the direction of arrow 158 occurs due to the permalloy structure 160 that is located between conductors C and D. Permalloy 160 has varying width along its length and in this way acts as a guide to move bubble domains in the direction of arrow 158. If desired, structure 160 could be a groove in the bubble domain material 162 which has variable width as indicated in FIG. 29. Additionally, this structure 160 could be replaced by permalloy triangles with the apexes pointed downwardly for movement of bubble domains in the direction of arrow 156. In general, domains in shift register 156 are isolated from one another and any type of propagation structure is suitable.

Before describing the applied pulse sequences in the conductors A–D, it should be noted that bubble domains taken from lattice 30 travel in paths (indicated by arrows in register 154) which bring them to the shift register 156. For instance, bubble domain $a$ follows the path 1.1, 1.2, 1.3, and 1.4 in order to get to shift register 156. Bubble B will follow a path 2.1, 2.2, 1.2, 1.3, and 1.4 in order to get to shift register 156. Thus, it will be seen that alternate bubble domains $a, c, e$ and $g$ proceed in generally straight paths from their positions in lattice 30 to their respective positions in shift register 156. On the other hand, bubble domains $b, d, f,$ and $h$ proceed in paths which are not straight and which are partially coincident with the paths of the first-mentioned domains in going to shift register 156.

Preferred paths for the bubble domains can be provided in a variety of known ways, such as by etching grooves in the magnetic bubble domain material 62. Additionally, suitable deposits of magnetically soft material (such as permalloy) can be located adjacent to the bubble domain material 62. Also, the properties of the bubble domain material can be locally modified using, for example, ion implantation. The bubble domains will be moved along these tracks by magnetic field gradients produced by current pulses in conductors A–D. In a known manner, the preferred bubble domain paths can be shaped to allow bubble domain motion in only a single direction or in two directions.

FIGS. 30 and 31 indicate the sequence of applied current pulses and corresponding bubble domain positions during the transfer and shifting operations. An arbitrary scheme is used to designate the polarity of these current pulses. L indicates that the left edge of the conductor A, . . . D attracts bubble domains while the right edge of the conductor repels bubble domains. R is a designation for the opposite effect, i.e., the right-hand edge of the conductor attracts bubble domains while the left-hand edge repels them. The actual polarities used depend on where the pulses are injected into the conductors and on the directions of magnetizations in the bubble domains.

Consequently, the conductors A-D in FIG. 29 have widths and spacing such that the magnetic fields produced by currents in these conductors will move the bubble domains through the transfer register in a manner similar to that previously described with respect to FIGS. 19A-19E. For instance, assume that a bubble domain has been attracted to the left edge of a conductor and then a R pulse is applied. This type of pulse means that the right edge of the conductor will attract the bubble while the left edge of the conductor will repel the bubble. If this bubble domain were near the left-hand edge of the conductor but not under the conductor, it will experience a greater force from the left-hand edge of the conductor and will be pushed to the left away from that conductor. On the other hand, if the bubble domain were initially under the left edge of the conductor it will be attracted to the right (and pushed from the left) and will consequently move under the conductor to the right-hand edge of the conductor. Since the magnetic field gradients produced by currents in the conductors extend a considerable distance from the conductors, the bubble domains can be suitably positioned with respect to the conductors in order to obtain either one of these two situations. This positioning is easily obtained by applying current pulses to adjacent conductors.

In FIG. 29, the conductors A-D are conveniently shown as single lines. However, in an actual device the conductor width would be comparable to or larger than a bubble domain diameter and the bubble domain position would be suitably located to produce the desired motion. That is, the principles described with respect to FIGS. 14E and 19A-19E apply here also.

FIG. 30 is a table showing the 16 current pulse sequences which constitute the basic shift cycle. FIG. 31 is another table which lists the positions of 16 bubbles a-p following each step of the first two cycles of shift operation. From position zero in shift register 156, the bubbles move downwardly in the direction of arrow 158. Position 84 of shift register 156 is used if the shift register is connected to another array (lattice) or to a write means 36.

The transfer register 154 and shift register 156 space the bubble domains in the shift register 156 twice as far apart as the bubble domains in the lattice 30. If greater separation is desired, it can be easily achieved by providing an additional conductor to provide another 2:1 fan-in or fan-out step.

In FIG. 29, if either conductor A or B is not activated by a current pulse, the transfer process does not occur. If conductor A is not activated, a force produced by current in B is insufficient to attract the bubble domains past the confinement barrier 34. If conductor A alone is activated by a current pulse, then at step 9 of the applied pulse sequence the bubbles are repelled back to or through confinement barrier 34. Thus, conductors A and B can also function as input/output control gates as described previously.

As another alternative, the conductors A, B, C, and D can be used to provide transfer operations to and from a plurality of lattice arrays on the same magnetic medium 62. If these conductors are connected in groups, decoding can be provided for the selection of any of the lattice arrays.

As will be more apparent from FIGS. 30 and 31, the transfer process automatically synchronizes with the current pulse sequence in conductors A-B. If the pulse sequence starts at some step other than number one, then nothing happens during the remainder of the partial current pulse cycle and correct operation of transfer begins with step one of the following cycle.

Reference will now be made to the tables comprising FIGS. 30 and 31. In this operation, bubble domains a, b, . . . h are to be removed from lattice area 30 and brought to shift register 156. After this, bubble domains i, j, . . . p will be removed from lattice area 30 and brought to shift register 156. At time 1, currents exist in conductors A and D which are attractive for bubble domains a, b, . . . h. Therefore, these domains will be moved into positions 1.1, 2.1, 3.1, . . . 8.1, respectively. At this time, currents in conductors C and D do not have an affect on the bubble domains a-h coming out of lattice 30.

At time 2, the current direction in conductor B reverses thus making the left-hand edge of conductor B repulsive. Consequently, bubble domains a-h retain their respective positions.

During times 3-8, currents exist in conductors C and D which are used to complete an operation for domains located within transfer register 154 and shift register 156. From step 3 through step 8, currents do not exist in conductors A and B.

At step 9, the current directions in conductors A and B reverse from what they were in steps 1 and 2 respectively. At this time, there is a current in conductor A which makes the right-hand edge of A attractive and left-hand edge repulsive. At the same time, the current pulse in conductor B makes its left-hand edge attractive and its right-hand edge repulsive. During this step, the bubble domains a-h move one step. For instance, bubble domain a moves from position 1.1 to position 1.2 while bubble domain b moves from position 2.1 to position 2.2. Consequently, all bubble domains a-h move one step during the application of the current pulses in conductors A and B in step 9 in the sequence of current pulses.

At step 10 of the sequence, no current pulse exists in conductor A and the current pulse in conductor B has changed its direction. At this time, conductor C has a current which makes its left-hand edge attractive. Consequently, bubble domains close to conductor B see a force due to conductors B and C. Therefore, bubble domains a, c, e, and g move. For instance, bubble domain a moves from position 1.2 to position 1.3 during this time. Bubble domains b, d, f, and h retain their positions.

At time sequence 11, pulses in conductors C and D make their left-hand edges repulsive to bubble domains. Consequently, bubble domains a, c, e, and g move to the next position. For instance, bubble domain a moves from position 1.3 to position 1.4 while bubble domain c moves from position 3.3 to position 3.4. This movement is due to the fact that these bubble domains are sufficiently under conductor C to be able to experience the attractive force on the right-hand edge of this conductor rather than the repulsive force from the left-hand side of conductor C.

At time step 12, the current directions have reversed in both conductors C and D. This means that the left-hand edges of these conductors will be attractive to bubble domains while the right-hand edges will be repulsive to the bubble domains. During this time step, bubble domains a, c, e, and g move. For instance, bubble domain a moves from position 1.4 to position zero in shift register 156, while bubble domain c moves from position 3.4 to position 2.4. Thus, bubble domains a, c, e, and g, which were moved into shift register 156 by the previous time step, now begin to move in shift register 156 in the direction of arrow 158. These bubble domains can then be read and returned to the lattice or removed to different areas of the magnetic sheet. As is apparent from FIG. 31, bubble domains a, d, f, and h do not move from their second positions until time step 16. At this time, they begin moving in paths previously travelled by bubble domains a, c, e, and g in order to propagate to shift register 156. When they reach register 156, they move down shift register 156 in the direction of arrow 158.

The movement of the next column of bubble domains, $i, j, \ldots p$ of lattice area 30 follows in a similar manner. These bubble domains $i-p$ begin to move on time step 17 and thereafter, starting with time step 24, begin moving toward shift register 156. As with the bubble domains $a-h$, alternate bubble domains in the column $i-p$ move first, followed by the movement of the remaining bubble domains in that column. For instance, bubble domains i, k, m, and o move to shift register 156 before bubble domains j, l, n, and p. This is because the latter group of bubble domains j, l, n, and p have to travel partially on the same path as was used by bubble domains i, k, m, and o. The second column of bubble domains uses the same paths as were used by bubble domains in the first column. For example, domain i follows the same path as domain a, and domain j follows the same path as domain b.

Thus, it is apparent from FIGS. 30 and 31 that groups of m (where m is the total of bubble domains in a column) are shifted at a single time by the transfer register 154 to the shift register 156. In reverse, bubble domains from the shift register 156 can be moved to the lattice area in the same fashion by changing the polarity of currents in the sequence of pulses applied to conductors A–D.

As mentioned previously, the width of conductors A–D can be suitably chosen to be approximately the bubble domain diameters. The center-center spacing of the conductors is conveniently twice the width of the conductors.

It should be easily recognized that these current sequences can be rearranged using external buffers. Also, various modifications of this scheme can be utilized to move bubble domains from the lattice area to isolated bubble areas, and from isolated bubble areas to the lattice area. Additionally, greater fan-in or fan-out can be provided.

This basic scheme will also work when the interactive elements are not magnetic bubble domains. In some cases, the interactive elements are not bias field sensitive as are bubble domain elements so the provision of a technique for changing the spacing between the interactive elements may not always be necessary. Further, even in the case of magnetic bubble domains, it may not be necessary to change the spacing when the domains are taken from the lattice area, or placed into the lattice area from an external area.

CODED INTERACTIVE ELEMENTS

Information can be associated with the interactive elements 32. In the case of magnetic bubble domain elements, various properties of the bubble domains can be used to distinguish one type of bubble domain from another, thereby enabling coding of information in terms of bubble domain properties. As will be seen, the wall properties of different types of magnetic bubble domains are particularly useful for the coding of information. In the case of other types of magnetic interactive elements coding in accordance with physical appearance is suitable.

The following sections under this sub-heading will illustrate the different types of coding that can be utilized when information is to be associated with the interactive elements. Although several different types of coding will be illustrated, it should be remembered that information can be coded in the interactive elements in any way; therefore, the present invention can be utilized with new discoveries pertaining to different properties of interactive elements, such as bubble domains. The main teaching of the invention, utilization of confined arrays (such as lattices) in information systems, can be exploited whether or not the interactive elements are themselves associated with information.

BUBBLE DOMAIN CODING:HARD/SOFT BUBBLES:

In this first type of coding, the teaching of copending patent application Ser. No. 375,285, filed June 29, 1973, now U.S. Pat. No. 3,899,779 is utilized. In this copending application, the existence of so called "hard" and "soft" magnetic bubble domains is utilized to provide systems in which information is conveyed by different domain properties, rather than by the presence and absence of domains. A "hard" domain is one which has a large number of vertical Bloch lines in its domain wall and which collapses at higher bias fields than a "soft" domain, which has a small number (or zero) vertical Bloch lines in its domain wall. These different types of domains are described more explicitly in a paper by A. P. Malozemoff, *Applied Physics Letters*, 21, 149 (1972).

FIG. 32 shows a means for writing information in terms of hard/soft coding of magnetic bubble domain interactive elements, while FIG. 33 shows the read operation when information is stored in terms of hard/soft bubble domains.

In more detail, the structure of FIG. 32 provides patterns of hard and soft magnetic bubble domains for coding of information (such as binary information). If desired, multilevels of information in addition to two levels can be provided in accordance with the teaching of aforementioned Ser. No. 375,285, U.S. Pat. No. 3,899,779.

Magnetic medium 62 supports magnetic bubble domains. A hard bubble generator 160 is comprised of a current-carrying coil 162 connected to a dc bias source 164 and to a pulse current source 166 which can be selectively connected in parallel with source 164 via switch 168. Within coil 162 there are provided a plurality of current-carrying conductors 170A, 170B, and 170C. These conductors are connected to current sources (not shown) which provide currents $I_A$, $I_B$, and $I_C$ through conductors 170A–170C, respectively.

Also located within coil 162 is a propagation means 172 which in this case comprises T and I bar patterns of magnetically soft material such as permalloy. Domains brought to propagation pattern 172 will move in the direction of arrow 174 in response to rotation of magnetic fields A in the plane of magnetic sheet 62, as is well known. Further, propagation means 172 can be comprised of conductor patterns rather than magnetically soft material.

The operation of the hard bubble generator 160 depends upon the provision of varying magnetic fields within the area of coil 162. These magnetic fields operate on stripe domains 176 in order to chop these domains into smaller domains containing vertical Bloch lines.

The dc level of the bias field $H_z$ within coil 162 is provided by dc source 164. Fluctuations in the net bias field within coil 162 are provided by current pulses generated by pulse source 166. Initially, a negative pulse is provided by source 166 in order to lower the net bias field in the area of coil 162. This creates an attractive region for magnetic stripe domains 176 such that these domains will move within the area of coil 162. At this time, a positive pulse is produced by source 166 to raise the level of the bias field above the dc level. For sufficiently short and strong pulses, this will cause a chopping of the stripe domains 176. Generally, the number of hard domains produced by this chopping action increases with the number of pulses applied. After this, the net bias field is increased greatly in the area of coil 36 in order to collapse all domains other than hard domains. Consequently, the only domains remaining in the area of coil 162 after the chopping and discrimination steps are hard magnetic domains.

These hard domains are then moved to the vicinity of propagation means 172 by applying current pulses in the conductors 170A-170C. The magnetic fields produced by currents in these conductors create bias field gradients which will attract the hard domains to the vicinity of propagation means 172. Once they are in the vicinity of means 172, the hard domains will be attracted to magnetic poles created on the T and I bars when the propagation field H is rotated. These hard domains will then propagate in the direction of arrow 174 in a well known manner.

As a representative example, hard domains were created in a magnetic sheet of 5.25 microns thickness having the composition $(Tb_{0.04}Eu_{0.66}Y_{2.3})Fe_{3.85}Ga_{1.15}O_{12}$. The bias field pulses applied to magnetic sheet 62 generally ranged from about 10 Oe. to 0 Oe. and had a duration from about 0.2 microseconds to about 10 microseconds. The number of pulses applied by source 166 can be varied from 1 to practically any number. The number of applied pulses will generally depend upon the distribution of the various types of domains desired to be produced. Generally, as the number of applied current pulses increases, there is a greater likelihood to create domains having larger numbers of vertical Bloch lines. Correspondingly, the longer the duration of the applied current pulses the greater the likelihood to collapse domains other than those with large numbers of vertical Bloch lines. Of course, the final current pulse is chosen to be of such magnitude as to collapse all domains within coil 162 other than those domains having the minimum desired number of vertical Bloch lines in their domain walls. This ensures that sufficiently hard bubble domains are obtained for the particular operation desired.

Generally, the magnitude of the applied current pulses depends to some degree on the magnetization of the magnetic sheet 62. As $4\pi M_s$ increases, higher values of magnetic bias pulses will be required to produce the hard domains. Generally, up to 50% of $4\pi M_s$ is a reasonable range for the magnitude of the applied bias field pulses.

The longer the duration of the applied chopping pulses, the better is the chance that chopping will occur. After this, the longer the duration of the applied current pulse, the greater the likelihood that the domains within coil 162 will collapse.

Since the hard bubble generator can be part of a separate structure which is brought into proximity to magnetic sheet 62, the provision of hard domains within medium 62 can easily be done at the time the magnetic bubble domain system utilizing a lattice is being fabricated. Consequently, a reservoir of hard and soft domains can be provided for use by the user of the systems (FIG. 2). In this case, the hard domain generator 160 need not be a portion of the system which is delivered but instead could be utilized in the manufacturing facility.

In FIG. 32, the hard bubble generator 160 is part of the overall write means 36 (FIG. 6) which is used to provide a pattern of coded information. Consequently, the hard domains are combined with soft domains from a normal bubble domain generator 178. The final output from write means 36 is a pattern of hard and soft domains moving in the direction of arrow 180 toward the input means 38. In the embodiment of FIG. 32, the hard domains affect the delivery of soft domains to the information stream applied to input means 38.

As mentioned, hard domain generator 160 produces a pattern of hard domains moving in the direction of arrow 174. These hard domains are further propagated by propagation means 182, also comprised of T and I bar patterns. A current-carrying coil 184 provides a magnetic field in the direction of the bias magnetic field $H_b$ at pole position 1 of T bar 186.

Normal bubble domain generator 178 is of the type illustrated in copending application Ser. No. 266,758, filed June 27, 1972 now U.S. Pat. No. 3,825,885. Generator 178 is comprised of a disc 188 of magnetically soft material such as permalloy and an additional layer 190 of magnetically soft material, such as permalloy which is exchangecoupled to medium 62. Layer 190 acts to suppress any hard domains produced by generator 178. Soft domains are provided each cycle of rotation of the drive field H. These soft domains travel downwardly to the propagation means 182, following repetitive pole patterns 2, 3, and 4 on T bar 192. Associated with the soft bubble generator 178 is an L-bar 194 which serves as an annihilator for the soft domains produced by generator 178. For certain circumstances, domains produced by generator 178 are deflected to annihilator 194 and do not enter the information pattern travelling to the right along propagation means 182, as will be explained in more detail later.

The final information pattern of hard and soft domains continues in the direction of arrow 180 and enters the input means 38. In operation, hard domains enter propagation means 182 and move to pole position 4 on I bar 196. If a current $I_g$ exists in loop 184 at this time, the hard domains at the end of I bar 196 will not see an attractive pole at pole position 1 of T bar 186. Consequently, they will remain at pole position 4 of I bar 196. As the propagation field H continues to rotate, the domains will be attracted to pole position 2 on T bar 198. After this, the domains will continue to the annihilator A. If desired, the hard domains can be redirected to other circuitry for further use within an information system. Thus, hard domains at pole position 4 of I bar 196 will be allowed to pass further to the right depending upon the presence and absence of current $I_g$ in loop 184. In this manner, a gate is provided for the passage of hard domains.

A soft domain is produced by generator 178 during each cycle of field H. The soft domains propagate to T bar 192 and follow successive pole positions 2, 3, and 4 to the propagation means 182, after which they travel to the right along the direction indicated by arrow 180 in response to rotation of field H. However, if a hard domain passes through the successive pole positions 1, 2 and 3 of T bar 186, a soft domain from generator 178 will not be able to move from pole position 3 to pole position 4 on T bar 192. Consequently, on the next rotation of field H, the soft domain will move from pole position 3 on T bar 192 to pole position 4 (elbow) on L bar 194. When field H rotates to position 1, the soft domain will continue to be trapped at the elbow of L bar 194. When field H continues to direction 2, a negative pole will be produced at the elbow of bar 194 which will collapse the domain located there. This collapse is then enhanced when field H rotates to position 3. Consequently, the presence of hard domains on T bar 186 influences the entry of soft domains from generator 178 to propagation means 182. In this manner, an information pattern will be sent to input means 38.

Alternate structures can be utilized to provide patterns of hard and soft domains for coding of information in a lattice array. For instance, the propagation paths comprising magnetically soft elements can be replaced by conductor patterns, and other techniques can be used for chopping stripe domains to produce domains having varying numbers of vertical Bloch lines (i.e., domains of varying hardness). Of course, provision of domains of varying hardness means that multilevel information storage is possible.

FIG. 33 shows a technique for reading information which has been coded in terms of hard and soft magnetic domains. In this figure, a group of hard and soft domains has been removed from lattice 30 by the output means 40. This pattern of information-containing domains propagates in the direction of arrow 198 to a hard bubble discriminator 200. Discriminator 200 is used to collapse all soft domains in the information pattern, thereby allowing only hard domains to pass. These hard domains are then sensed by any type of bubble domain sensor, such as a magnetoresistive sensor which is shown more particularly in U.S. Pat. No. 3,691,540. After the information is sensed, the soft domains have to be reestablished in the information pattern if nondestructive read-out is desired. Consequently, a soft domain generator is used to reestablish the original information pattern.

In more detail, the pattern of hard and soft domains enters hard bubble discriminator 200 in the direction of arrow 198. Discriminator 200 is comprised of a current-carrying coil 202 which is connected to a current source providing a current $I_c$. Current $I_c$ in coil 202 produces a magnetic field in the same direction as the bias field $H_b$. This increases the bias field at pole position 4 of I-bar 204, thus collapsing all soft domains which appear at this location. This means that only hard domains will continue propagating to the right along the T and I bar pattern 206.

Domains propagating along pattern 206 will pass a sensing means 208, which is shown as a magnetoresistive sensor. Means 208 illustratively includes a magnetoresistive sensing element 210 which is connected to a current source 212. Source 212 produces a measuring current $I_s$ through sensing element 210. When a domain passes element 210, the magnetization vector of the element will be rotated, causing a resistance change. This resistance change is manifested as a voltage change $V_s$ indicative of the presence of a hard domain in flux-coupling proximity to element 210. If no domain passes sensing element 210 during a cycle of drive field H, this will indicate that a soft domain was originally present at that cycle time.

After being sensed, domains propagate further to the right along the direction indicated by arrow 214. The domains pass a structure which is a soft bubble replacer 216. This structure is similar to that used in FIG. 32 for providing soft bubble domains in the information pattern. The soft bubble replacer is comprised of a soft domain generator 218 together with a layer of magnetically soft material 220 for suppression of hard domains. Propagation means 222 carries the soft domains to the information pattern stream. Additionally, annihilator 224 is provided.

During each cycle of field H, a single soft domain is produced by generator 218 and propagates along T-bar 222. However, if a hard domain is at pole position 3 of T-bar 226, domains from generator 216 will be deflected from element 136 to the elbow of annihilator 224 where they will be subsequently annihilated as field H rotates. However, if hard domains are not present at pole position 3 of T-bar 226 at this time, domains produced by generator 218 will propagate to the horizontal propagation means 206 and will continue to the right in the direction of arrow 214. Thus, the original combination of hard and soft domains from the lattice area will be re-established. This re-established information pattern can be sent to an input means 38 for entry into the same lattice array or a different lattice array (FIG. 4), or can be sent to an annihilator for destruction of information. Additionally, the domains can be used for other types of circuitry. Thus, coding of domains in terms of the number of vertical Bloch lines existing in the domain walls is a suitable technique for establishment of information within the lattice array. However, since soft domains have greater mobilities in magnetic medium 62 than hard domains, the speed of operation of the system may be limited to that of the hard domains, in order to have synchronized domain movement.

This type of coding can be used to provide levels of information greater than two, depending upon the hardness of the domains utilized. This is readily achieved since the domains will collapse at magnetic fields dependent upon their hardness and can be detected in terms of the degree of hardness, as explained in aforementioned Ser. No. 375,285.

BUBBLE DOMAIN CODING: DEFLECTION PROPERTIES

Coded magnetic bubble domains using deflection properties are described in copending application Ser. No. 375,289, filed June 29, 1973, now U.S. Pat. No. 3,890,605. That application describes magnetic bubble domain systems using bubble domains for information, where different information states are represented by different properties of the domains. The deflection of a magnetic bubble domain in a gradient magnetic field depends upon the number of rotations of the magnetization vectors around the periphery of the domain wall.

Thus, a domain having zero vertical Bloch lines will undergo a deflection in the gradient field while a domain having a pair of vertical Bloch lines may or may not undergo deflection, depending upon the sign of the Bloch line pair.

In the present application, information can be coded in the bubble domains in a lattice array using their deflection properties. For instance, domains representing "1 bits" may be represented by a domain which has a particular deflection in a gradient magnetic field, while a different information state (0-bit) is represented by a domain having a different deflection in the gradient magnetic field.

Figure 34:
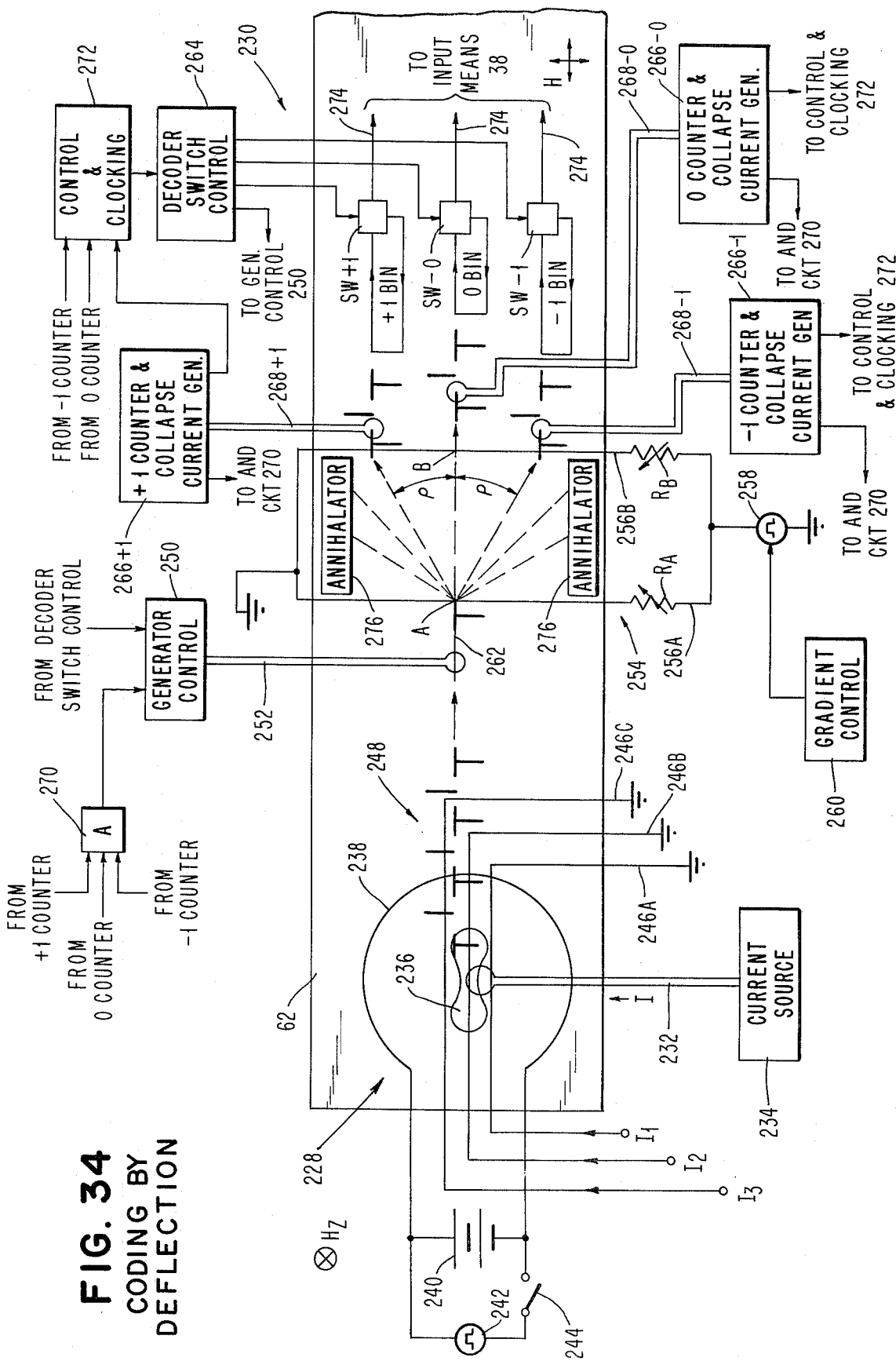
FIG. 34 shows a structure for coding magnetic bubble domain interactive elements in terms of their deflection properties, for use as information bearing elements within a lattice array.

FIG. 34 shows a structure for generating bubble domains having different deflections. FIG. 35 shows an apparatus for sensing domains having different deflections which have been taken from the lattice area.

In more detail, FIG. 34 shows a generator designated 228 which is used to provide domains having different deflections in a gradient magnetic field. The remaining structure in this figure is a write means generally designated 230, which separates domains produced by generator 228 in accordance with their deflection properties in a gradient magnetic field. The domains from write means 230 can be directly sent to input means 38 for entry into a lattice array 30.

Generator 228 is similar to the generator shown in FIG. 32 for producing hard and soft magnetic bubble domains. It comprises a current carrying coil 232 connected to a current source 234 which is used to chop a stripe domain 236. The rest of the generator 228 is comprised of a current carrying coil 238 connected to a d.c. source 240 and a pulse source 242. Relay 244 is used to selectively connect source 242 to the circuit. Additionally, conductors 246A, 246B and 246C are provided.

In operation, current pulses $I_1$, $I_2$, and $I_3$ in conductors 246A - 246C respectively provide attractive magnetic fields to move domains into the area within coil 238. Current in coil 238 reduces the net bias field within this loop causing a domain therein to become stripe domain 236. After stripe 236 is created in loop 238, a current pulse I is produced in conductor 232. This splits domain 236 since different magnetic fields are exerted on both sides of domain 236. The split domain then propagates to the right under control of propagation means 248, shown here as a circuit comprising T and I bars.

Domains propagating to write means 230 are separated in accordance with their deflection in a gradient magnetic field and applied to various storage bins for use as inputs to input means 38.

Generator control 250 provides current pulses in conductor 252 which produce magnetic fields for selectively collapsing domains from generator 228.

A deflection means, generally designated 254, comprises a pair of current-carrying conductors 256A and 256B which are connected to a current source 258 through current limiting, variable resistors $R_A$ and $R_B$. Source 258 is controllably operative by gradient control unit 260.

Deflection means 254 can be provided by a plurality of structures. Its function is to produce a magnetic field gradient and bias field which will deflect certain domains moving into the region where the gradient exists. The gradient producing means is conveniently shown as current carrying conductors but can comprise structures such as permanent magnets selected to provide different magnetic biases, or layers of magnetic material exchange-coupled to magnetic sheet 62 having graded properties to provide the gradient field. Additionally, the magnetic properties of material 62 may be locally altered to provide the gradient field.

Domains produced by generator 228 propogate in the direction of arrow 262 until they reach location A. The net bias field at A is different than at point B and the domains will be deflected in accordance with their rotational properties. In this drawing, domains having +1 rotations of their wall magnetization will be deflected through the angle $\rho$ and will be sent to a storage location defined as the +1 bin. Domains having 0 rotations of their wall magnetization will not be deflected and will be propagated to a storage location designated 0 bin. Domains having −1 rotation of their wall magnetization will be deflected through an angle $-\rho$ and will propagate to the storage area labeled −1 bin. These bins are conventional storage locations and can be, for instance, closed loop shift registers around which the various domains continuously travel.

Generally, it is desirable that all the bins contain the same number of domains and that information be selectively switched from the bins as desired. However, because the generator may produce a statistical distribution of domains having various deflection properties, circuitry is provided to keep track of when each bin is fully loaded. When a bin is fully loaded, means are provided to collapse other domains having similar properties which would normally enter that bin. This continues until all bins have a full supply of the domains which they are storing. Of course, other design considerations may be readily available to those skilled in the art.

Associated with each bin is a switch SW +1, SW 0, SW −1, respectively. These are switches operable under control of the decoder switch control unit 264. These switches pass domains in one of two directions depending upon whether domains are to be taken from the bin or allowed to recirculate in the bin. Standard current controlled switches of the type shown in U.S. Pat. No. 3,689,902 or U.S. Pat. No. 3,701,125 are suitable.

Each storage bin has associated therewith circuitry for counting the domains which enter the bin and circuitry for collapsing domains which try to enter the bin after the bin is fully loaded. Generally this circuitry comprises a counter which merely counts the number of domains entering the bin and a current source for producing a current whose magnetic field is sufficient to collapse unwanted domains which propagate in the direction of the bin. For instance, +1 counter in collapse current generator 266 +1 is associated with the +1 bin. Counter 266 +1 detects domains having $+\rho$ deflection via conductor loop 268 +1. After the number of domains required to fill the +1 bin have been counted, unit 266 +1 provides a current pulse in conductor 268 +1 which then destroys any other domain trying to enter the +1 bin. In a similar manner the 0 bin has associated therewith a 0 counter and collapse current generator 266 −0 which is coupled to the 0 bin propagation path by conductor 268-0. In the same manner, the −1 bin has associated therewith a −1 counter and collapse current generator 266 −1, and conductor 268 −1. These counter and collapse current generators provide inputs to the AND circuit 270 which upon coincidence of all inputs, provides a signal to generator control 250. This signal causes generator control 250 to produce a current pulse in conductor 252 which stops the further passage of domains in the direction of arrow 262.

The counter and collapse current generators also provide inputs to a unit entitled Control and Clocking 272 which in turn controllably activates the decoder switch control 264. Thus, control unit 272 provides a signal to the decoder switch control 264 after receiving signals from all of the control and clocking units 266, in order to signal decoder switch control 264 that removal of domains from the storage bins can occur. In this manner, it is possible to selectively remove domains from the storage bins for propagation along the direction of arrows 274.

Thus, FIG. 34 shows circuitry for providing in a reproducible manner domains having a plurality of different properties for transmission by known means to input means 38. In FIG. 34, domains having deflections other than the deflections utilized for information states are deflected to annihilators 276 where they are destroyed.

As is apparent from FIG. 34, conventional propagation circuits can be used to move domains having different deflection properties. Additionally, the propagation structures can be combined with path defining grooves in the magnetic material if additional control is desired. Once within the lattice array, domains having different deflection properties interact with one another to provide stable paths of movement. Thus, the coded domains behave in the same manner as uncoded domains within lattice 30.

Aforementioned copending application Ser. No. 375,289 (U.S. Pat. No. 3,890,605) describes how to controllably make domains having desired wall magnetization rotation. Consequently, it is possible to eliminate many of the components shown in FIG. 34, in an actual circuit.

FIG. 35 shows a device for reading bubble domains using their deflection properties. In this structure, a pattern of bubble domains is provided from the output means 40 of the system of FIG. 2. This output pattern propagates to a deflection means 254 which is identical with that shown in FIG. 34. Deflection means 234 comprises conductors 256A and 256B connected, via resistors $R_A$ and $R_B$, to current source 258. Gradient control 260 provides an input to source 258 to determine the strength of the gradient provided by current in conductors 256A and 256B.

Domains coming from the lattice area have deflections previously determined by the structure of FIG. 34. Therefore, these domains will be separated by the gradient field produced by means 254 in accordance with their deflection properties. Various propagation circuits 276 +1, 276−0, and 276 −1 move the domains to the sensing device, generally designated 278.

Sensor 278 is comprised of sensing elements 280 +1, 280−0, and 280 −1. Illustratively these are magneto resistive sensing elements which are spatially staggered from one another so as to indicate the presence of domains traveling in the separate propagation paths at different times. Current source 282 provides a series of electrical currents through the sensing elements. Depending upon the presence and absence of domains in flux coupling proximity to the sensing elements, different voltage signals $V_s$ will be provided which can be sent to the utilization means 44 (FIG. 6).

After being sensed the bubble domains can be destroyed or returned to the same or a different lattice array, if information is to be retained. Additionally, the domains can be destroyed, or directed elsewhere and new information written by the generator. Consequently, utilization of the deflection properties of magnetic bubble domains is a very convenient means of coding information in the form of bubble domains within a lattice array. Since domains having small numbers of Bloch lines can be used, the problem of different mobilities (mentioned for hard/soft domain coding) is not present when coding is in terms of deflection properties.

CODING WITH DUAL SIZE BUBBLE DOMAINS

Bubble domains having different sizes can exist in the magnetic medium at the same time, as is more fully described in copending application Ser. No. 319,130, filed Dec. 29, 1972, now U.S. Pat. No. 3,911,411. These different type domains can be produced by a suitable generator and in addition each type of domain can be changed to the other type and back again in a very simple manner.

FIG. 36 illustrates a generator 284 which can be used to produce dual size magnetic bubble domains in magnetic medium 62. These domains of different size will be designated type A domains and type B domains, where the type A domains are those which appear larger when viewed optically. Generator 284 is comprised of a current-carrying coil 286 connected to a pulse current source 288 through a variable resistor R. The function of conductor 286 is to provide a localized magnetic field in a direction substantially parallel to an easy direction of magnetization of magnetic medium 62. Depending upon the polarity of current in conductor 286, the magnetic field produced within this conductor will be either parallel or antiparallel to the applied magnetic bias field $H_b$ produced by source 290. A propagation field source 292 is used to provide a rotating, in-plane magnetic field H which is used to move domains in conjunction with propagation means 294, in a manner which is well known. A control means 196 provides control signals to pulse current source 288 and to magnetic field sources 290 and 292.

In operation, stripe domains 298 exist throughout the magnetic medium 62 when it is in a demagnetized state. A current pulse applied to coil 286 will chop the stripe domains 298 into segments, some of which will be type A domains while others are type B domains. Under the action of the propagation field H and propagation means 294, these two types of domains will move in the direction of arrow 300.

In order to determine the type of domains taken from generator 284, the type A domains and the type B domains can be interchanged into one another. To achieve this, a current pulse is applied in coil 286. This current pulse has a polarity which will produce a magnetic field which will switch the magnetization direction of a portion of a type A domain in the reverse direction (i.e., into the direction of magnetization of magnetic medium 62). Thus, the type A domain will be converted into a type B domain which does not extend throughout the entire magnetic sheet, or which has a different wall configuration than the type A domain.

The current pulse amplitude for switching domain type is chosen to produce a peak magnetic field suitable for this conversion. In the case of typical garnet bubble domain materials an amplitude of approximately 50-100 Oe is suitable. Either a single pulse of current or a pulse train is useable, where the pulse duration is about 10 milliseconds. If a pulse train is used, the frequency of the pulse train can be in the approximate range 10–100 cycles/second. The idea is that chopping up the stripe domains will produce the type A and type B domains within the area of coil 286 and that changing the polarity of a pulse of suitable amplitude will produce the conversion of one type of the domains to the other type, and vice versa.

In order to convert a type B domain to a type A domain, a current pulse is applied in coil 286 having a polarity to produce a magnetic field oppositely directed to the direction of the magnetic bias field $H_b$. The pulse magnetic field produced by current in coil 286 rotates the direction of magnetization of medium 62 in the area under a type B domain. This will produce a type A domain which extends throughout magnetic medium 62. As in the case of switching type A domains to type B domains, the same current pulse values are suitable. This applies to the amplitude, duration, frequency, etc. parameters which were previously mentioned.

A sensing means generally designated 302 is used to determine whether a domain passing thereby is a type A or a type B domain. In this case sensing means 302 is comprised of a sensing element 304 which could be, for instance, a magnetoresistive sensor. A current source 306 provides measuring current through element 304 and a voltage signal $V_s$ is generated across element 304 when a domain passes thereby. The strength of this signal will vary depending upon whether a type A or type B domain is being sensed. This distinction is noted by control 308 which selectively provides current $I_c$ in conductor 310 to collapse domains which are of the undesired type. Therefore, a pattern of domains will move in the direction of arrow 312 to an input means 38, or to other circuitry for storing different types of domains, as was illustrated in FIG. 34 for domains having different deflection properties.

FIG. 36 also illustrates a technique for reading different size domains which can be used to determine information being taken from the lattice 30. For instance, if the pattern of domains moving in the direction of arrow 300 is the pattern of domains from a column in the lattice which has been removed from the lattice by the transfer register 154 and shift register 156 (FIG. 29), a sensor such as 302 can easily be used. In addition, the type A and type B domains appear to have different sizes when viewed optically so that standard polarized light techniques (Kerr effect and Faraday effect) can be used for sensing.

Another suitable sensor is a conductor loop past which the different type domains move. The conductor loop will detect a flux change due to the large type A domain which is different than that due to the smaller type B domain. This type of sensing is also described in copending application Ser. No. 319,130. Also, the oscillating sense technique described in copending application in Ser. No. 267,877, filed June 30, 1972 (now U.S. Pat. No. 3,842,407) can also be used.

Coding by dual size bubbles may cause some problems in forming a suitably regular lattice, unless the size of the bubbles are reasonably close to one another. However, these types of bubbles should be useable in a variety of lattice systems.

CODING BY CHIRAL STATE

The IBM Technical Disclosure Bulletin, Vol. 13, No. 10, P. 3021, March 1971 contains a paper by G. R. Henry, entitled "Magnetic Domain Wall Information Storage". In that paper, the author states that the different chiral states which appear in the domain walls of bubble domains can be used for information storage. That is, rather than using the presence and absence of a bubble domain for information, it is proposed to use the right-handed chiral state and left-handed chiral state for information. Read-out of information is accomplished by forcing an unknown domain into a high-speed collision with a "reference domain" of known chiral state. The domain wall inertia drives the domains into intimate contact and, if they have the same chiral state, they will rebound. If they have opposite chiral states, they will coalesce. Therefore, the existence of one or two domains after the collision is an indication of the chiral state of the unknown domain.

Figure 37A:
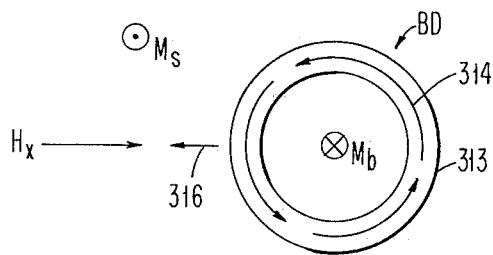
FIGS. 37A-37B show bubble domains having different chirality, which can be used for coding information in a bubble domain lattice array.
Figure 37B:
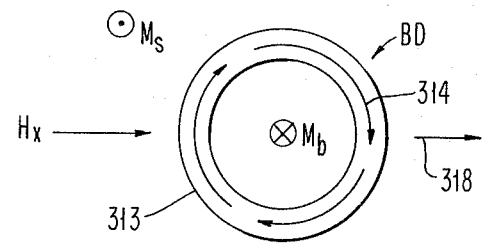

The technique taught by G. R. Henry can be used to provide information in the form of bubble domains in the lattice array 30. An absolutely stable bubble domain state can have a domain wall configuration having pure right-handed or left-handed chirality as shown in FIGS. 37A and 37B. Here, the bubble domains BD have domain walls 313 where the magnetization in the walls is represented by the arrows 314. A right-handed chiral state is shown in FIG. 37A while a left-handed chiral state is shown in FIG. 37B.

Another way to distinguish magnetic bubble domains having pure chiral states, where the states are either right handed or left handed, utilizes an in-plane magnetic field, shown in FIGS. 37A and 37B as the magnetic field $H_x$. This magnetic field causes precession of the magnetization vectors 314 in the walls of the domains BD, causing these domains to move in a direction parallel or antiparallel to magnetic field $H_x$. For instance, the domain in FIG. 37A will move in the direction of arrow 316 when the pulse $H_x$ is applied while the domain in FIG. 37B will move in the direction of arrow 318 when pulse $H_x$ is applied. Thus, the pure right handed and pure left handed chirality domains can be distinguished by observing their displacements in the presence of an in-plane magnetic field pulse.

Figure 38:
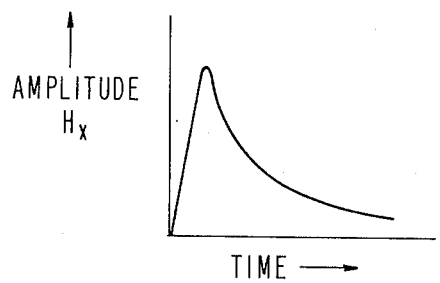
FIG. 38 shows a plot of the amplitude of an in-plane magnetic field pulse measured against time, which can be used to detect domains having different chirality.

FIG. 38 shows the shape of a suitable magnetic field pulse $H_x$ for displacement of pure chirality domains. There are certain requirements on the rise time and fall time of the pulse $H_x$ for its use when reading domains coded in terms of chirality. For instance, the optimum amplitude of the pulse $H_x$ approximately $8M_s$, where $M_s$ is the magnetization of the magnetic domain material. The rise time of the pulse $H_x$ should be smaller than the approximate quantity $\gamma^{-1}(H_c+8\alpha M_s)^{-1}$ where $\alpha$ is the damping coefficient of the bubble domain material, and $\gamma$ is the gyromagnetic constant of the bubble domain material. For a practical low-loss rare earth iron garnet material ($\gamma=1.7\times10^7$ sec$^{-1}$ Oe$^{-1}$, $\alpha=10^{-2}$, $H_c=0.3$ Oe, $M_s=20$ gauss), this quantity is approximately 30 nanoseconds.

The fall time of the pulse $H_x$ should be several times this maximum allowable rise time. Under these assumptions the bubble displacement produced by $H_x$ is approximately $\Delta/[\alpha+(H_c/8M_s)]$ or typically several-micrometers for garnets. A train of such pulses may be used to obtain a cumulative displacement. Thus from these quantities it appears that materials with higher damping coefficients may be more desirable. Due to the velocity saturation effects in materials, such a requirement is not an adverse factor in bubble domain velocity.

It has been discovered that a pulse of magnetic bias field $H_b$ normal to the plane of the magnetic material may affect the chiral state of the bubble domain. That is, changes in the magnetic bias field may cause switching of a right handed chiral state to a left handed chiral state, and vice versa. In general, a change in bias field of the approximate amount $2\pi aM_s\Delta_{BL}/h$ is sufficient to cause a change in information state of the bubble domain. Here, $\Delta_{BL}$ is the width of a Bloch line and $h$ is the thickness of the magnetic bubble domain material. Thus, the apparatus used for the read means must be carefully constructed so that gradients in the magnetic bias field normal to the magnetic sheet do not occur. In order to achieve this, the structures shown in FIGS. 39 and 40 are utilized.

Figure 39:
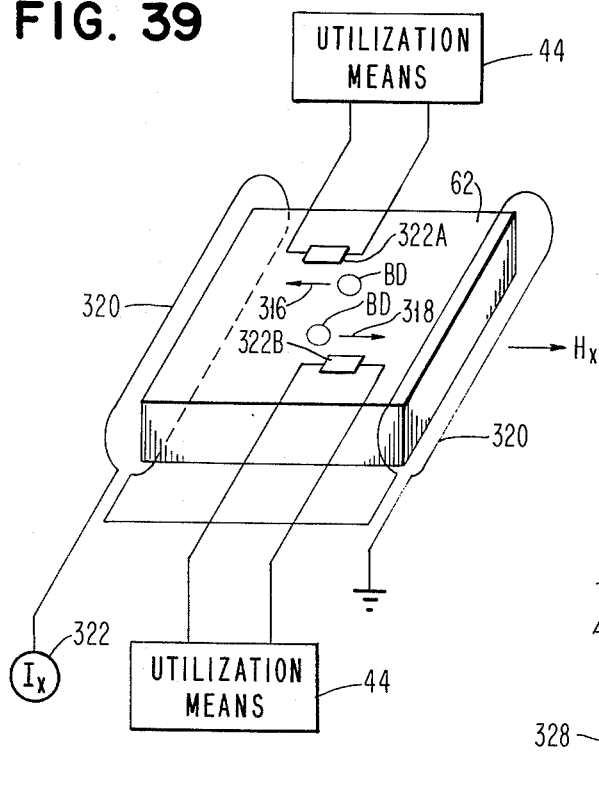
FIGS. 39 and 40 are structures for detecting magnetic bubble domains having different chirality.
Figure 40:
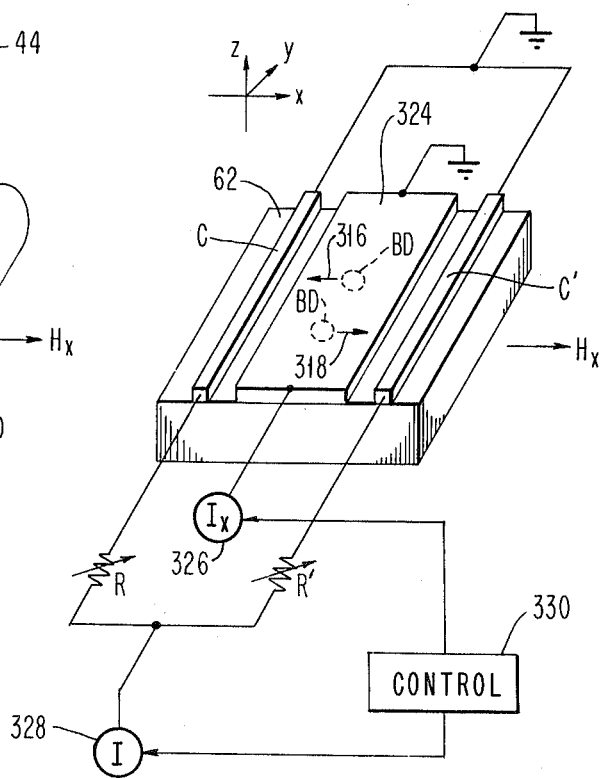

In FIG. 39, the magnetic bubble domain material 62 is surrounded by a current-carrying coil 320 which serves as a portion of a read means for determining the chiral state of a domain and, therefore, the information state. Coil 320 is connected to a current source 322 which provides a current $I_x$. Current in coil 320 establishes the magnetic pulse field $H_x$ in the plane of medium 62.

In operation, the magnetic field pulse $H_x$ causes movement of the bubble domains BD in the direction of arrows 316 and 318, depending upon the chiral state of the bubble domains. Detectors 322A and 322B, such as magnetoresistive detectors, are used to determine the chiral state of the domains. These detectors are connected to utilization means 44, such as have been described previously.

As the magnetic pulse $H_x$ decays in amplitude with time, the magnetization vectors 314 will precess in a reverse direction to their original precession and reverse motion of the magnetic bubble domains will occur. Accordingly, a light means, such as a microscope, can be used to observe the different movements of different chiral domains when the magnetic field pulse is applied.

It is difficult to obtain magnetic pulses having sufficiently fast rise times using current-carrying coils. Because of this, the structure of FIG. 40 uses conductor strip lines to provide an in-plane magnetic field having sufficient rise time. In FIG. 40, a wide conductor 324 is connected to a current source 326 for providing the current $I_x$. Conductors C and C' are connected to current source 328 via resistances R and R'. Control means 330 is used to activate current sources 326 and 328.

The basic in-plane magnetic field $H_x$ is established by current $I_x$ in conductor 324. In order to minimize gradients in the magnetic bias field normal to the plane of magnetic material 62, current in conductors C and C' establish magnetic fields tending to cancel any gradient magnetic fields which exist in the area under conductor 324 where the determinations of chirality are to be made. Thus, chirality will be accurately determined and the chirality of a domain will not be switched to a different state by spurious magnetic pulses in the z direction or by gradients in the z direction magnetic field.

The generating structure of FIG. 34 can be used to provide bubble domains having pure chiral states. Application of magnetic field pulses normal to the bubble domain material causes splitting of stripe domains to produce some domains which have pure chirality. These can be separated from other domains by observing their deflection in a gradient magnetic field using the apparatus shown in FIG. 34. Additionally, bubbles of one chirality can be switched to the other chirality by application of magnetic field pulses normal to the magnetic sheet 62, if this function is desired.

III OTHER TYPES OF LATTICE SYSTEMS (FIGS. 41-48)

The concept of lattice arrays for use in information handling systems is well demonstrated by the embodiment shown in FIGS. 41-48. Here, the interactive elements 32 are simply made by attaching magnetic elements to styrofoam balls which are free to float on the surface of a liquid, such as water. These magnetic styrofoam balls will interact with one another and can be moved into a confined array such as a lattice arrangement and taken from the array. Coding is conveniently achieved by coloring these styrofoam balls differently or by giving them other differing physical properties.

Figure 41:
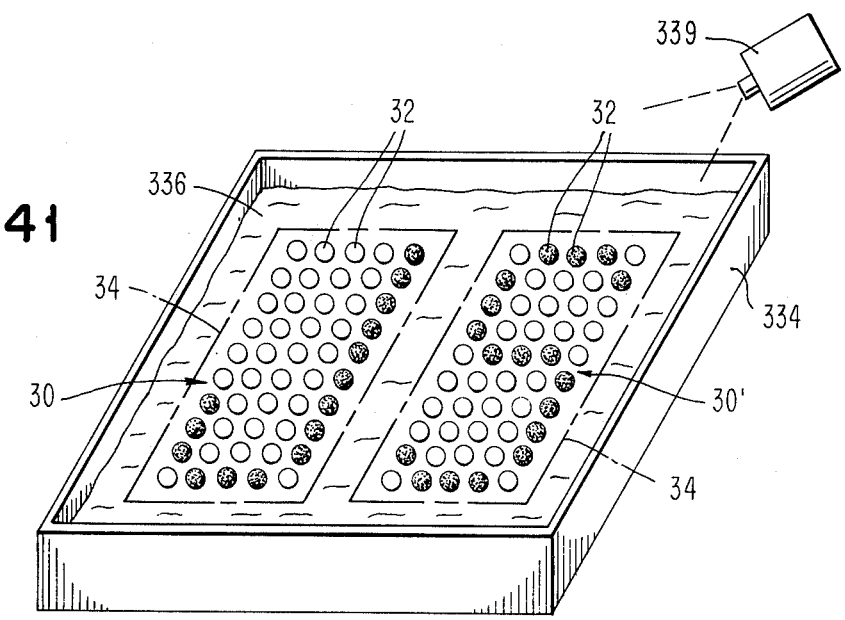
FIG. 41 shows a lattice arrangement of interactive elements which are free to move in a supporting medium.

FIG. 41 shows a general view of confined arrays comprising styrofoam balls having magnetic elements in them. In more detail, a tank 334 has therein a liquid 336 which is able to support the interactive elements 32. In this case, the interactive elements are elements which are free to float on liquid 336 and which exert interactive forces on one another tending to determine the positions of the elements 32 with respect to one another. In FIG. 41, two lattices 30 and 30' are shown, each of which is comprised of a plurality of interactive elements 32.

Figure 42:
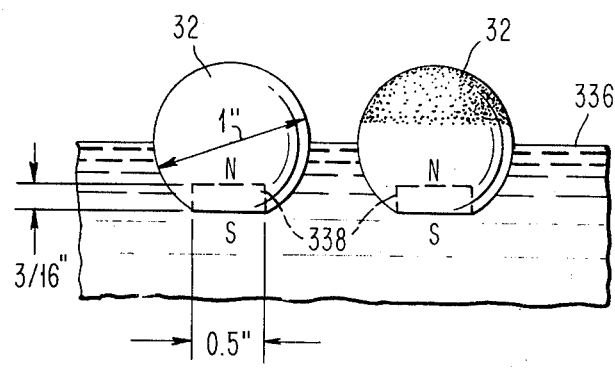
FIG. 42 is a detailed illustration of suitable magnetic interactive elements which can be used in the lattice structure of FIG. 41.

The interactive elements used in the tank 334 are shown in more detail in FIG. 42. In particular, each interactive element 32 is made of a material which will float on the liquid 336. Small permanent magnets 338 are located in each of the elements 32 in order to give them interactive forces. In FIG. 42, one of the interactive elements 32 has its top surface painted black to indicate information different from that of the other interactive element. The numbers showing the dimensions of the interactive elements and the dimensions of the permanent magnets 338 are dimensions which were used when a lattice file comprising the styrofoam balls was made and operated. In that case, the magnetic elements had diameters of one inch while the permanent magnets were 3/16 by 1/2. The liquid 336 was water. Thus, depending upon the sequence of light and dark styrofoam elements 32 in the lattices 30 and 30', a pattern of information can be obtained which is directly viewable by an observer or by a scanner 339 (FIG. 41).

Figure 43:
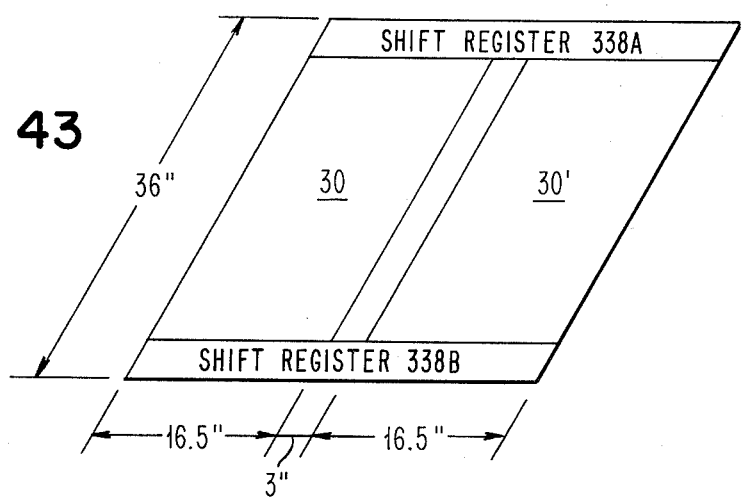
FIG. 43 is a schematic diagram of the circuit arrangement for the lattice structure of FIG. 41, illustrating a double lattice structure in combination with shift registers for transferring interactive elements between the lattices.

FIG. 43 shows a schematic arrangement of the components of the system of FIG. 41. The two lattices 30 and 30' have shift registers 338A and 338B located on opposite ends of the lattices. These shift registers are used to convey information to the lattices 30 and 30' as well as to receive information which has been removed from the lattices 30 and 30'.

The dimensions shown for the size of the lattices and for the distance between the lattices are dimensions which were used in the example previously discussed using the one inch interactive elements 32. That is, the total structure of FIG. 43 measured 36 × 36 . Each lattice 30 and 30' contained 16 rows of eight interactive elements per row.

As will be apparent, the structure of FIG. 43 also includes means to bring elements 32 into the lattice and to remove elements 32 from the lattice. These means are provided for each of the lattices 30 and 30'. In the example being discussed, conductor patterns are used for the input and output means and for the shift registers used to move elements from one lattice to another. These conductor patterns can be spatially located over one another and can be immersed in the fluide 336 used in the tank. Particularly if the fluid is water, its conductivity will not affect the operation of conductor input/output means and conductor shift registers.

Figure 44:
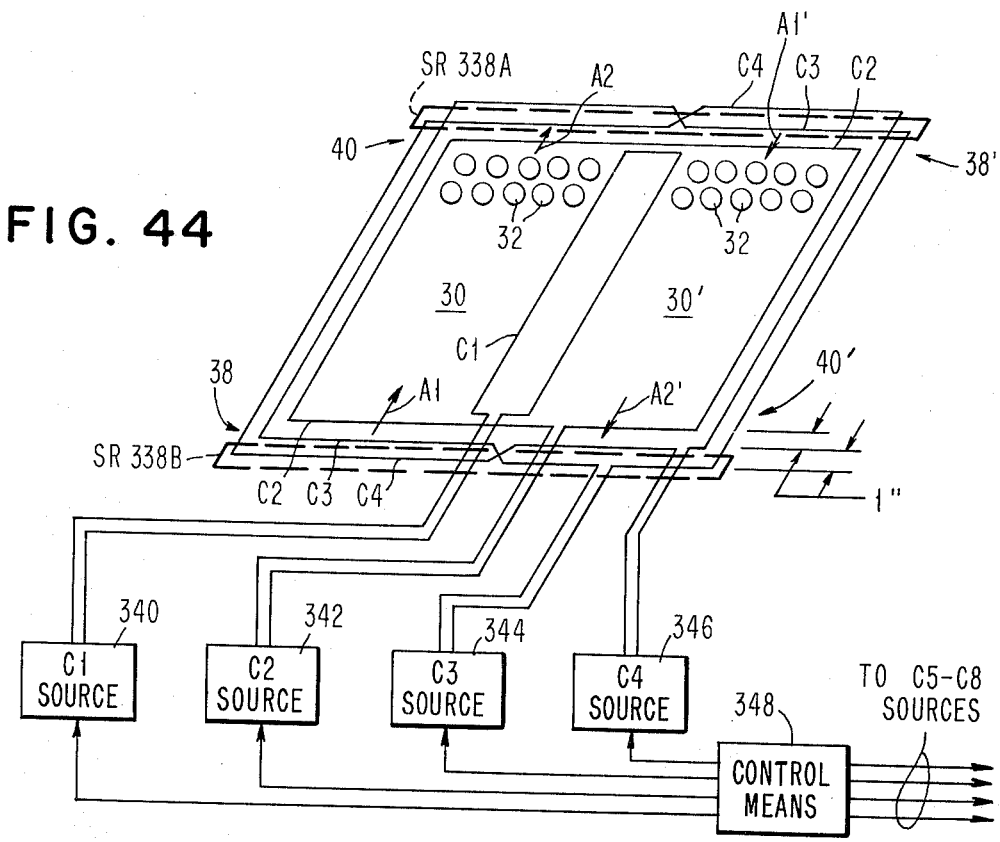
FIG. 44 is a detailed diagram of the input and output means used to move interactive elements into and out of the lattices of FIG. 41.
Figures 47, 49:
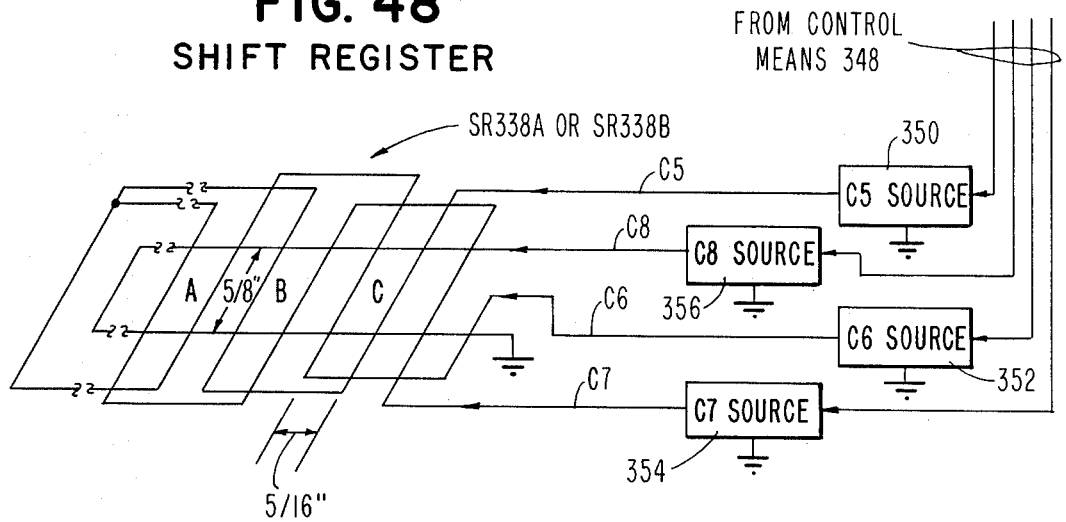
FIG. 47 is a table showing the presence and absence of currents in the conductors comprising the structure of FIG. 44 during the operations of shifting and input-/output to and from the lattices.
FIG. 49 is a table illustrating the position of interactive elements as they move along the shift register of FIG. 48, for various currents in the conductors comprising the shift register of FIG. 48.

FIG. 44 shows the input and output means for each of the lattices 30 and 30'. The direction of movement of the elements 32 is indicated by the arrows A1, A2 and A1', A2'. In this figure, the input means for lattice 30 is designated 38 while the output means is designated 40. For lattice 30', the input means is designated 38' while the output means is designated 40'. These input and output means are comprised of current-carrying conductors C2, C3 and C4. As shown in FIG. 44, the position of conductors C3 and C4 is interchanged in the input and output means so that the current sequence as shown in FIG. 47 ejects a row of elements along the directions of motion A1 and A1' and simultaneously injects a row of elements along the directions of motion indicated by A2 and A2'.

Conductor C1 is used to provide confinement for lattices 30 and 30' and to keep these lattices separate from one another. In addition, loops of conductors C2, C3 and C4 are used to provide confinement for lattices 30 and 30'.

Conductor C1 is connected to a current source 340, while conductors C2, C3, and C4 are connected to current sources 342, 344, and 346, respectively. The various current sources 340–346 receive inputs from control means 348 in order to properly synchronize movement of the interactive elements 32.

Shift registers 338A and 338B are shown as dashed boxes in FIG. 44. These shift registers are also comprised of conductor patterns and can be located in a plane above or below the conductors C1–C4 used for confinement and/or input-output. Conductors C1–C4 can be located in the same plane. The shift registers are shown in FIG. 48 which will be described later.

Figures 45A, 45B, 45C:
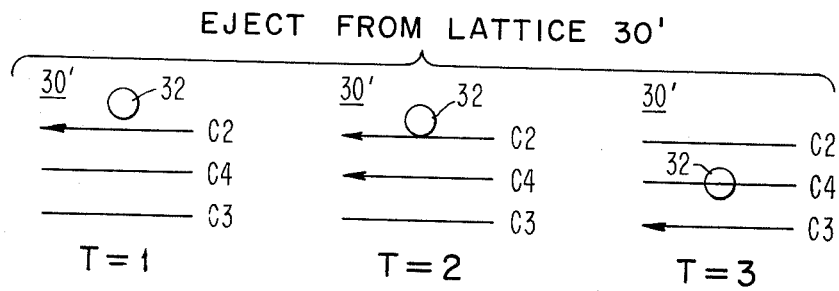
FIGS. 45A-45C illustrate the operation of the structure of FIG. 44 for removing interactive elements from a lattice array.

FIGS. 45A–45C show the position of an interactive element 32 which is being ejected from a lattice such as lattice 30'. These figures are for time T = 1, 2, and 3, respectively. The presence of currents in the conductors is indicated by arrows on the conductors, where the arrows indicate the current directions. For instance, at T = 1 a current exists in conductor C2 but not in conductors C3 and C4. FIGS. 45A–45C show the element 32 moving from within the lattice to a position outside the lattice. When the element is outside the lattice (for instance, in the position shown in FIG. 46A) an underlying shift register is used to move the element 32 to another lattice or to another location in the array. In the case of FIG. 44, shift register 338B would move the domain 32 to the input means 38 for lattice 30 where it could be injected into lattice 30.

Figures 46A, 46B, 46C:
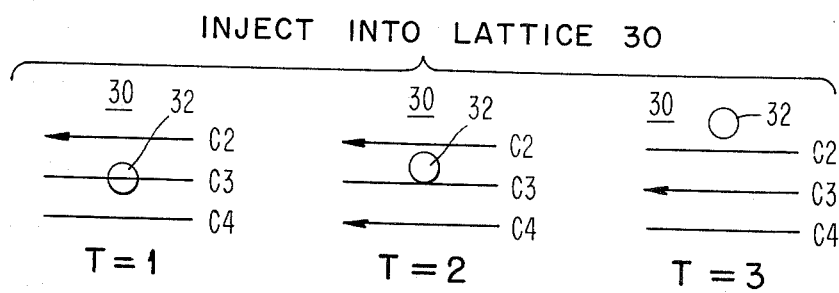
FIGS. 46A-46C illustrate the operation of the structure of FIG. 44 for injecting interactive elements into a lattice array.

FIGS. 46A–46C show the operation of an input means 38 for moving the element 32 into the lattice array 30. The currents in conductors C2, C3 and C4 are denoted by arrows, as was the case for FIGS. 45A–45C. When the element 32 moves from a position approximately centered on conductor C4 to a position within conductor C2 loop it has moved to within lattice 30.

For the example which has been described, the one inch interactive elements are moved by conductors C2–C4 when currents having an amplitude of approximately 30 amps exist in these conductors. That is, current sources 342–346 provide currents of approximately 30 amps for this type of interactive element.

FIG. 47 shows the presence of currents in the conductors C2, C3, and C4 during the operations of shifting elements in registers 338A and 338B, ejecting elements from a lattice, and injecting elements 32 into a lattice. The large dots indicate that current is present in specified conductors whereas the absence of a dot indicates that current is not present in a conductor. For confinement of the array elements 32, current is always present in conductor C1.

FIG. 48 shows one period of a conductor pattern suitable for shift registers 338A and 338B. This register is comprised of conductors C5, C6, C7, and C8. Conductors C5, C6, and C7 provide a three-phase conductor propagation pattern while conductor C8 is a loop which serves as a guide rail to keep the interactive elements 32 in the proper propagation track.

Conductors C5–C8 are connected to current sources 350, 352, 354, and 356, respectively. These current sources 350–356 receive inputs from the control means 348 shown in FIG. 44.

Repetitive sequence of current cycles are applied during the time T1 to shift an ejected row of elements from the output means 40 and 40' to the input means 38 and 38', respectively. Sequential positions of an element 32 during one cycle of shift register operation are designated by A, B, and C in FIG. 48. FIG. 49 shows the different currents used during one cycle of shift register operation to move an element 32 from position A to position B to position C. In this figure, a + sign indicates that a current is flowing into the indicated conductor. This current divides equally and returns through the propagation conductors designated G. For instance, an element 32 will move from position A to position B of register 338 when conductors C5 and C7 are grounded and conductors C6 and C8 have currents in them.

In the particular example being described using one inch diameter interactive elements shown in FIG. 42, the current amplitudes for shifting were approximately six amps. That is, six-amp currents were provided by the current sources 350–356.

Thus, embodiment of FIGS. 41–49 is suitable to demonstrate the use of arrays of confined elements to provide storage of information and also for display purposes. For instance, the interactive elements 32 can be coded in accordance with their color to provide patterns of light and dark elements which can be viewed by the individual or viewed by optical apparatus. As another alternative some of the elements can be coded with metallic caps to give them a different electrical resistance, for coding as information.

SUMMARY

What has been shown is a new type of information handling apparatus which uses confined arrays (such as lattices) containing interactive elements. The elements within the lattice can be coded to have information associated with them or the lattice can be a part of other apparatus where it is desired to store closely packed interactive elements for use elsewhere. Many types of interactive elements can be used within the lattice, although the lattice is easily illustrated and shown with interactive elements such as magnetic bubble domains and elements which are supported in a conveniently selected medium. Additionally, the interactive elements can be used in lattice arrays of many dimensions, for instance three-dimensional lattice arrays where interactive elements (such as monopole electrostatic elements which exert repulsive forces in 3 dimensions) are maintained within a medium (such as a colloidal solution) in which they can move in three dimensions. As an example, electrostatic or magnetic interactive elements can exist in fluid so that a three-dimensional lattice is provided.

Many other techniques can easily be envisioned by those of skill in the art for movement of the interactive elements into and out of the lattice and for realizing the various functions described herein. However, this teaching will provide sufficient basis for the provision of other apparatus and systems incorporating lattice arrays of various sizes for many functions.

What is claimed is:

1. An apparatus comprising:
   a lattice array of elements of diameter d spaced from one another by distances less than 3d, the positions and spacings of said elements in said lattice being substantially determined by interactions between said elements,
   access means for accessing selected elements within said array.

2. The apparatus of claim 1, further including means for moving elements within said lattice array.

3. The apparatus of claim 1, where said access means includes input means for moving elements into said lattice array.

4. The apparatus of claim 1, where said access means includes output means for removing said elements from said lattice array.

5. The apparatus of claim 1, further including confinement means for containing said elements within said array, said confinement means including means having a constant dimension for maintaining a fixed density of said elements within said confinement means.

6. The apparatus of claim 1, where said elements in said lattice array are arranged in hexagonal coordinate positions with respect to each other.

7. The apparatus of claim 1, where said lattice array is a multidimensional array.

8. The apparatus of claim 1, where said elements in said array exert repulsive interactive forces on one another.

9. The apparatus of claim 1, further including a second lattice array of elements whose positions within said second array are substantially determined by interactive forces existing between said elements in the array.

10. The apparatus of claim 1, including means for moving said elements from positions within said lattice to positions where said interactions between said elements do not substantially determine the locations of said elements with respect to one another.

11. The apparatus of claim 1, further including electromagnetic radiation means for illuminating said lattice array with electromagnetic radiation.

12. The apparatus of claim 1, where said lattice array has a shape determined by symmetry planes which make an angle of approximately 60° with respect to a reference direction.

13. The apparatus of claim 1, including means for simultaneously moving a plurality of elements within said lattice array.

14. The apparatus of claim 1, where said elements in said lattice array exert electromagnetic forces on one another.

15. An apparatus comprising:
    a lattice array of elements spaced from one another, the positions and spacings of said elements in said lattice being substantially determined by interactions between said elements,
    access means for accessing selected elements within said array, where said elements within said lattice array have different properties.

16. An apparatus comprising:
    a lattice array of elements spaced from one another, the positions and spacings of said elements in said lattice being substantially determined by interactions between said elements,
    access means for accessing selected elements within said array,
    a second lattice array of elements whose positions within said second array are substantially determined by interactive forces existing between said elements in the array, and
    means for moving elements from positions within one of said lattice arrays to positions within the other lattice array.

17. An information handling apparatus comprising:
    an array comprised of elements of diameter $d$ spaced from one another by distances less than $3d$ and located with respect to each other in accordance with interactive forces existing between said spaced elements,
    means for controllably moving elements into said array while said interactive forces exist, and
    means for controllably removing elements from said array while said interactive forces exist.

18. The apparatus of claim 17, including means for detecting properties associated with said interactive elements.

19. The apparatus of claim 17, further including confinement means for containing said elements within said array.

20. An information handling apparatus comprising:
    an array comprised of elements spaced from one another and located with respect to each other in accordance with interactive forces existing between said spaced elements, where said elements within said array have different properties,
    means for controllably moving elements into said array, and
    means for controllably removing elements from said array.

21. An apparatus comprising:
    a lattice array of fixed size comprised of spaced elements having diameters $d$ and spacings less than about $3d$, wherein the positions and spacings of said elements within said lattice array are at least partially determined by interactive forces existing between said elements within said array, said spaced elements in said lattice forming a plurality of aligned rows of said elements,
    means for controllably moving elements at certain locations within said lattice array to other locations within said lattice array, said means including means for moving a row of said elements across said lattice array to occupy positions previously occupied by elements in at least two rows of said elements.

22. The apparatus of claim 21, further including confinement means for determining the shape of said lattice array.

23. The apparatus of claim 21, where said means for controllably moving said elements includes means for moving a plurality of said elements simultaneously.

24. The apparatus of claim 21, where said elements in said lattice array exert electromagnetic forces on one another.

25. The apparatus of claim 24, where said elements are magnetic elements.

26. An apparatus comprising:
    a lattice array of spaced elements wherein the positions and spacings of said elements within said lattice array are at least partially determined by interactive forces existing between said elements within said array, said elements having different properties, means for controllably moving elements at certain locations within said lattice array to other locations within said lattice array.

27. An information handling apparatus, comprising:
a lattice array of interactive elements having stray fields assoicated therewith and having different properties, the positions and spacings of said elements in said lattice array being substantially determined by interactive forces existing between said elements in said array,
confinement means for retaining said elements within said lattice array,
read means for detecting said different properties.

28. The apparatus of claim 27, where said interactive forces are repulsive forces existing between said elements in said lattice array.

29. The apparatus of claim 27, including write means for producing said interactive elements having different properties.

30. The apparatus of claim 27, where said elements are magnetic elements.

31. The apparatus of claim 30, where said magnetic elements are magnetic bubble domains.

32. The apparatus of claim 31, where said magnetic bubble domains have different magnetization properties.

33. An information handling apparatus, comprising:
a lattice array of interactive elements having stray fields associated therewith and having different properties, where said interactive elements are representative of said information, the positions and spacings of said elements in said lattice array being substantially determined by interactive forces existing between said elements in said array,
confinement means for retaining said elements within said lattice array,
read means for detecting said different properties.

34. A method of handling information, comprising:
confining in a lattice array elements which interact with one another while separate from one another, the positions of said elements in said array being substantially determined by the interactions existing between said elements,
controllably displacing said elements in said array in a single given direction to different positions in said array while maintaining substantially constant the spacing between said elements.

35. The method of claim 34, including the further step of controllably moving elements into said lattice array while said interactions are present.

36. The method of claim 34, incluing the further step of controllably removing elements from said lattice array while said interactions are present.

37. A method of handling information, comprising:
selecting elements having different properties and having stray fields associated therewith, said different properties being representative of different information states,
storing said elements in a region where the positions of said elements are substantially determined by interactive forces existing between said elements, said elements being arranged in a lattice in said region,
detecting the different properties of said elements.

38. The method of claim 37, where said interactive forces are electromagnetic forces.

39. The method of claim 37, where said elements are magnetic elements.

40. A method comprising the steps of:
generating elements having diameters approximately $d$ which interact with one another,
bringing said elements into a region of substantial confinement to establish a lattice array in which said elements having spacings of less than approximately $3d$ and are substantially free to move with respect to one another to determine their positions in said region to establish a lattice array having a given density of said elements therein,
controllably moving said elements within said region in a single direction while substantially maintaining the density of said elements in said lattice array.

41. The method of claim 40, including the further step of confining said elements in said region.

42. A method comprising the steps of:
generating elements having different properties which elements interact with one another,
bringing said elements into a region of substantial confinement to establish a lattice array in which said elements are substantially free to move with respect to one another to determine their positions in said region,
controllably moving said elements within said region.

43. The method of claim 42, including the step of detecting said different properties of said elements.

44. An apparatus comprising:
means for generating magnetic elements which can interact with one another,
means for controllably confining said elements in a region where said elements are free to move with respect to one another to determine their positions within said region of confinement to establish a given density of said elements in said region, and
manipulation means for controllably manipulating said magnetic elements in said of confinement while the size of said magnetic elements and said given density of elements are substantially maintained in said region.

45. The apparatus of claim 44, further including means for producing magnetic fields which couple to said magnetic elements in said area of confinement.

46. The apparatus of claim 44, where said magnetic elements are magnetic bubble domains.

47. An apparatus comprising:
means for generating magnetic elements which can interact with one another,
means for controllably confining said elements in a region where said elements are free to move with respect to one another to determine their equilibrium positions within said region of confinement to establish an array of said elements having a given density, where said means for confining includes means for producing magnetic fields, and
manipulation means for controllably manipulating and magnetic elements in said region of confinement while the size of said elements and said given density are substantially maintained.

48. The apparatus of claim 47, where said means for producing magnetic fields is a current-carrying conductor.

49. The apparatus of claim 47, where said means for producing magnetic fields is comprised of magnetic material.

50. An apparatus comprising:
means for generating magnetic bubble domains having different properties which can interact with one another,
means for controllably confining said domains in a lattice array where said domains are free to move with respect to one another to determine their positions within said region of confinement, and
manipulation means for controllably manipulating said magnetic domains in said region of confinement.

51. The apparatus of claim 50, where said different properties are different bubble domain wall magnetization states.

52. An apparatus comprising:
means for generating magnetic bubble domains having different vertical Bloch line states in their bubble domain walls which can interact with one another,
means for controllably confining said domains in a lattice array where said domains are free to move with respect to one another to determine their positions within said region of confinement, and
manipulation means for controllably manipulating said magnetic domains in said region of confinement.

53. An apparatus comprising:
means for generating magnetic bubble domains having different chiralities which can interact with one another,
means for controllably confining said domains in a lattice array where said domains are free to move with respect to one another to determine their positions within said region of confinement, and
manipulation means for controllably manipulating said magnetic domains in said region of confinement.

54. An apparatus comprising:
a magnetic medium in which magnetic bubble domains can exist,
confinement means for confining said domains in a region of said medium where the positions of said domains with respect to each other are substantially determined by interactions between said domains in said region,
means for moving said domains into and out of said region of confinement while said confining occurs and said interactions are present.

55. The apparatus of claim 54, where the density of said bubble domains inside said region of confinement is greater than the density of said domains outside said region of confinement.

56. The apparatus of claim 54, where said bubble domains have different properties.

57. The apparatus of claim 54, where said magnetic medium has regions therein which have different magnetization properties than the rest of said magnetic medium.

58. The apparatus of claim 54, including means for producing a magnetic bias field substantially parallel to an easy axis of magnetization of said magnetic medium.

59. The apparatus of claim 58, where said bias field is uniform throughout said magnetic medium.

60. The apparatus of claim 58, where said bias field has a smaller magnitude in said region of confinement than outside said region of confinement.

61. The apparatus of claim 54, including field means for creating magnetic fields which couple to the stray magnetic fields of said bubble domains in said medium.

62. The apparatus of claim 61, where said field means is comprised of magnetic elements.

63. An apparatus comprising:
means for providing confinement forces which confine at least ten interactive elements in a region where said elements interact with one another and are spaced from one another, the positions and spacings of said interactive elements in said region being substantially determined by interactions between said elements, where said elements are coded to represent information,
means for moving said interactive elements in said region, and
means for placing elements into said region of confinement while said confinement forces are present.

64. An apparatus, comprising:
means for coding magnetic bubble domains in a magnetic medium in accordance with their individual magnetic properties,
means for establishing a lattice array of said coded bubble domains where all positions of said lattice array are occupied by said domains,
means for detecting said coded domains in accordance with said magnetic properties.

65. A device comprising:
a carrier,
electromagnetic field elements characterized by being moveable in said carrier by structure which exerts forces on said elements,
means for producing a barrier for confining a plurality of said electromagnetic elements within a region of said carrier substantially free said structure, said elements being in interactive proximity to one another in said region,
means for moving said elements across said barrier produced by said confining means.

66. The device of claim 65, where said elements are magnetic elements.

67. The device of claim 65, including means for moving said element from position within said region.

68. A device including:
a carrier,
elements having electromagnetic fields associated therewith which are moveable in said carrier, each element having coded information associated therewith,
means for confining a plurality of said elements in an array within an area of said carrier, the positions and spacing arrangement of said elements within said confined area being determined by said means for confining and the interaction of the electromagnetic fields associated with the elements within the confined area,
means for overcoming said means for confining and moving some of said elements into said confined area and others of said elements out of said confined area,
means for detecting the coded information associated with said elements.

69. A device including:
a carrier,
electromagnetic elements moveable in said carrier,
first confining structures for moving said elements in said carrier to different positions therein, second confining means for confining a plurality of said elements in interactive proximity to one another within a region of said carrier which is substantially free of said first confining structures.

70. The device of claim 69, further including means for moving selected elements within said region.

71. The device of claim 69, further including means for moving said elements into and out of said region.

72. A device comprising:
a supporting medium having elements therein which are capable of movement in said medium and which have stray fields associated therewith,
means for substantially confining a plurality of said elements in a region of said medium including means for maintaining the density of said elements in said region, said elements being sufficiently close to each other that the stray fields of said elements interact to produce forces on said elements which cause said elements to move to positions corresponding to a plurality of spaced parallel rows of said elements to form a lattice arrangement of said plurality of elements, where adjacent rows are spaced from each other by distances a,
manipulation means for manipulating selected elements in said lattice arrangements, said manipulation means including means for moving a selected row of said elements a distance at least 2a, while maintaining the parallel row arrangement and density of said lattice.

73. An apparatus comprising:
means for providing confinement forces which confine at least ten interactive elements in a region where said elements interact with one another and are spaced from one another, the positions and spacings of said interactive elements in said region being substantially determined by interactions between said elements to produce an array of said elements having a given density,
means for moving said interactive elements in said region while said given density is substantially maintained, and
means for placing elements into said region of confinement while said confinement forces are present to provide an array of said elements having said given density.

74. An apparatus comprising:
a magnetic medium in which magnetic bubble domains can exist,
confinement means and confining said domains in a region of said medium where the positions of said domains with respect to each other are substantially determined by interactions between said domains in said region,
means for moving said domains in said region of confinement,
propagation means for moving said bubble domains in regions of said magnetic medium outside said region of confinement.

75. An apparatus comprising:
a magnetic medium in which magnetic bubble domains can exist,
confinement means for confining said domains in a region of said medium where the positions of said domins with respect to each other are substantially determined by interactions between said domains in said region,
means for moving said domains in said region of confinement,
field means for creating magnetic fields which couple to the stray magnetic fields of said bubble domains in said medium, where said field means is comprised of current-carrying conductors.

76. An apparatus comprising:
means for generating magnetic elements which can interact with one another,
means for controllably confining said elements in a region where said elements are free to move with respect to one another to determine their positions within said region of confinement,
manipulation means for controllably manipulating said magnetic elements in said region of confinement, said magnetic elements being magnetic bubble domains which have different properties, said different properties being different bubble domain wall magnetization states, and
means for detecting said different bubble domain wall magnetization states.

77. An apparatus comprising:
a magnetic medium in which magnetic bubble domains can exist,
confinement means for confining said domains in a region of said medium where the positions of said domains with respect to each other are substantially determined by interactions between said domains in said magnetic bubble domains having different properties,
means for moving said domains in said region of confinement, and
means for detecting said different properties of said bubble domains.

78. An apparatus comprising:
a magnetic medium in which magnetic bubble domains can exist,
confinement means for confining said domains in a region of said medium where the positions of said domains with respect to each other are substantially determined by interactions between said domains in said region to produce an array of said domains having multiple rows of said domains,
means for moving at least one row of domains within said region of confinement to positions corresponding to those occupied by domains which were initially spaced at least two rows from the domains in said at least one row, in said region of confinement.

* * * * *

UNITED STATES PATENT AND TRADEMARK OFFICE
CERTIFICATE OF CORRECTION

PATENT NO. : 4,052,710

DATED : Oct. 4, 1977

INVENTOR(S) : Calhoun et al

It is certified that error appears in the above-identified patent and that said Letters Patent are hereby corrected as shown below:

Column 13, line 25, "on" should read --of--.

Column 14, line 37, "of" (first occurrence) should read --or--.

Column 16, line 58, "Then the" should read --When this--.

Column 16, line 66, "biase" should read --bias--.

Column 17, line 2, "in" should read --is--.

Column 18, line 55, "peripheral" should read --periphery--.

Column 19, line 6, "peripheral" should read --periphery--.

Column 20, line 27, "$=\!\!=\!\!H_b$" should read --$\nabla H_b$--.

Column 28, line 30, "$h_t$" should read --$H_t$--.

Column 31, line 45, after "push" insert --from--.

UNITED STATES PATENT AND TRADEMARK OFFICE
CERTIFICATE OF CORRECTION

PATENT NO. : 4,052,710

DATED : Oct. 4, 1977

INVENTOR(S) : Calhoun et al

It is certified that error appears in the above-identified patent and that said Letters Patent are hereby corrected as shown below:

Column 43, line 47, "10 Oe. to 0 Oe." should read --10 Oe. to 50 Oe.--.

Column 43, line 67, after "magnetization" insert --$4\pi M_s$--.

Column 50, line 37, "196" should read --296--.

Column 54, line 35, "3/16 by 1/2" should read --3/16" by 1/2"--.

Column 54, line 51, "36 x 36" should read --36" x 36"--.

Column 62, line 44, "element" should read --elements--;

Column 62, line 44, after "position" insert --to position--.

Column 63, line 53, "means and confining" should read --means for confining--

Column 64, line 40, after "said" insert --region, said--.

Signed and Sealed this

Eleventh Day of July 1978

[SEAL]

Attest:

RUTH C. MASON
*Attesting Officer*

DONALD W. BANNER
*Commissioner of Patents and Trademarks*